(12) United States Patent
Fang

(10) Patent No.: US 11,139,268 B2
(45) Date of Patent: Oct. 5, 2021

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/533,537

(22) Filed: Aug. 6, 2019

(65) Prior Publication Data

US 2021/0043604 A1    Feb. 11, 2021

(51) Int. Cl.
*H01L 25/065*  (2006.01)
*H01L 23/31*   (2006.01)
*H01L 23/29*   (2006.01)
*H01L 23/538*  (2006.01)
*H01L 23/498*  (2006.01)
*H01L 21/56*   (2006.01)
(Continued)

(52) U.S. Cl.
CPC ........ *H01L 25/0652* (2013.01); *H01L 21/561* (2013.01); *H01L 21/565* (2013.01); *H01L 21/568* (2013.01); *H01L 23/295* (2013.01); *H01L 23/31* (2013.01); *H01L 23/315* (2013.01); *H01L 23/3135* (2013.01); *H01L 23/3185* (2013.01); *H01L 23/49816* (2013.01); *H01L 23/5386* (2013.01); *H01L 24/24* (2013.01); *H01L 24/97* (2013.01); *H01L 25/0655* (2013.01); *H01L 25/50* (2013.01); *H01L 2224/24137* (2013.01); *H01L 2224/24145* (2013.01); *H01L 2224/95001* (2013.01); *H01L 2924/1433* (2013.01)

(58) Field of Classification Search
CPC .. H01L 23/295; H01L 23/315; H01L 23/3135
See application file for complete search history.

(56) References Cited

U.S. PATENT DOCUMENTS 5,036,024 A * 7/1991 Mine .................... H01L 25/0652
                                                          29/827
5,057,457 A * 10/1991 Miyahara ................ H01L 21/56
                                                          264/272.14
(Continued)

FOREIGN PATENT DOCUMENTS

DE    102011090085 A1 *  8/2012   ........... H01L 25/065
DE    102013102973 A1 * 10/2013   ............. H01L 24/29
(Continued)

*Primary Examiner* — Victoria K. Hall
(74) *Attorney, Agent, or Firm* — Foley & Lardner LLP

(57) ABSTRACT

A semiconductor package structure includes a substrate, a first semiconductor die, a first dielectric, a second semiconductor die, and a second dielectric. The substrate has a first surface. The first semiconductor die is disposed on the first surface. The first dielectric encapsulates the first semiconductor die. The second semiconductor die is disposed on the first surface and adjacent to the first semiconductor die. The second dielectric encapsulates the second semiconductor die. The first dielectric is in contact with the second dielectric. An average filler size in the first dielectric is substantially greater than an average filler size in the second dielectric.

19 Claims, 50 Drawing Sheets

(51) Int. Cl.
*H01L 25/00* (2006.01)
*H01L 23/00* (2006.01)

(56) References Cited

U.S. PATENT DOCUMENTS

| | | | | |
|---|---|---|---|---|
| 5,641,997 | A * | 6/1997 | Ohta | C08L 63/00 257/788 |
| 6,133,067 | A * | 10/2000 | Jeng | H01L 21/56 438/110 |
| 6,770,547 | B1 * | 8/2004 | Inoue | H01L 21/563 438/496 |
| 8,178,961 | B2 * | 5/2012 | Han | H01L 23/49575 257/686 |
| 8,241,966 | B2 * | 8/2012 | Sham | H01L 23/552 438/124 |
| 8,519,519 | B2 * | 8/2013 | Lee | H01L 23/3121 257/676 |
| 8,537,521 | B2 * | 9/2013 | Ando | C04B 35/638 361/301.4 |
| 9,105,613 | B1 * | 8/2015 | Chen | H05K 3/284 |
| 9,347,620 | B2 * | 5/2016 | Kogure | H01L 24/97 |
| 9,466,545 | B1 * | 10/2016 | Scanlan | H01L 25/03 |
| 9,685,413 | B1 * | 6/2017 | Prakash | H01L 21/485 |
| 10,361,122 | B1 * | 7/2019 | Hsieh | H01L 24/19 |
| 10,403,562 | B2 * | 9/2019 | Baek | H01L 24/20 |
| 10,665,572 | B2 * | 5/2020 | Chen | H01L 25/0655 |
| 10,790,164 | B1 * | 9/2020 | Lin | H01L 25/0655 |
| 10,804,218 | B2 * | 10/2020 | Kim | H01L 24/13 |
| 10,847,470 | B2 * | 11/2020 | Liao | H01L 21/6835 |
| 10,861,759 | B2 * | 12/2020 | Nomiyama | H05K 1/02 |
| 10,861,822 | B2 * | 12/2020 | Luo | H01L 24/24 |
| 10,884,551 | B2 * | 1/2021 | Sengupta | G06F 3/042 |
| 10,886,230 | B2 * | 1/2021 | Kim | H01L 23/295 |
| 10,892,230 | B2 * | 1/2021 | Lu | H01L 23/4334 |
| 10,930,802 | B2 * | 2/2021 | Liu | H01L 25/167 |
| 10,957,672 | B2 * | 3/2021 | Yu | H01L 23/3135 |
| 2003/0038376 | A1 * | 2/2003 | Bolken | H01L 23/13 257/778 |
| 2004/0150118 | A1 * | 8/2004 | Honda | H01L 23/24 257/778 |
| 2005/0045369 | A1 * | 3/2005 | Ishimaru | H01L 23/4334 174/250 |
| 2005/0224974 | A1 * | 10/2005 | Nishida | H01L 24/81 257/737 |
| 2006/0027479 | A1 * | 2/2006 | Auburger | G02B 6/4257 206/497 |
| 2006/0035613 | A1 * | 2/2006 | Miya | H01L 23/3135 455/276.1 |
| 2006/0054901 | A1 * | 3/2006 | Shoji | H01L 25/167 257/80 |
| 2006/0205119 | A1 * | 9/2006 | Appelt | H01L 23/13 438/125 |
| 2007/0029569 | A1 * | 2/2007 | Andrews | H01L 33/52 257/99 |
| 2008/0067650 | A1 * | 3/2008 | Sham | H01L 23/552 257/678 |
| 2008/0079157 | A1 * | 4/2008 | Kurita | H05K 3/4682 257/753 |
| 2008/0079164 | A1 * | 4/2008 | Kurita | H01L 23/5389 257/759 |
| 2008/0116560 | A1 * | 5/2008 | Mangrum | H01L 24/96 257/690 |
| 2008/0237842 | A1 * | 10/2008 | Manepalli | H01L 21/563 257/712 |
| 2008/0251875 | A1 * | 10/2008 | Wu | H01L 23/3121 257/434 |
| 2008/0251904 | A1 * | 10/2008 | Theuss | H01L 23/295 257/679 |
| 2009/0051047 | A1 * | 2/2009 | Hara | H01L 23/24 257/778 |
| 2009/0057885 | A1 * | 3/2009 | Theuss | H01L 23/3135 257/723 |
| 2009/0065911 | A1 * | 3/2009 | Wu | H01L 23/49517 257/666 |
| 2009/0152714 | A1 * | 6/2009 | Yamagishi | H01L 24/83 257/724 |
| 2009/0179317 | A1 * | 7/2009 | Iida | H01L 23/3135 257/685 |
| 2009/0191669 | A1 * | 7/2009 | Peng | H01L 23/3135 438/119 |
| 2010/0044881 | A1 * | 2/2010 | Fujimoto | H01L 23/295 257/777 |
| 2010/0244224 | A1 * | 9/2010 | Tanaka | H01L 24/743 257/690 |
| 2011/0031619 | A1 * | 2/2011 | Chen | H01L 23/5382 257/738 |
| 2011/0084400 | A1 * | 4/2011 | Fujii | H01L 25/0657 257/774 |
| 2011/0101517 | A1 * | 5/2011 | Hess | H01L 23/13 257/737 |
| 2011/0156283 | A1 * | 6/2011 | Ganapathysubramanian | H01L 23/562 257/789 |
| 2012/0001200 | A1 * | 1/2012 | Ikoshi | H01L 23/295 257/77 |
| 2012/0032314 | A1 * | 2/2012 | Chen | H01L 23/3135 257/666 |
| 2012/0043648 | A1 * | 2/2012 | Matsumaru | H01L 23/544 257/618 |
| 2012/0045114 | A1 * | 2/2012 | Matsumaru | H01L 23/3128 382/145 |
| 2012/0104583 | A1 * | 5/2012 | Lee | H01L 23/3121 257/676 |
| 2013/0137216 | A1 * | 5/2013 | Ito | H01L 25/50 438/108 |
| 2013/0140683 | A1 * | 6/2013 | Pagaila | H01L 25/0657 257/659 |
| 2013/0161801 | A1 * | 6/2013 | Otremba | H01L 23/3735 257/668 |
| 2013/0334682 | A1 * | 12/2013 | Kim | H01L 23/3128 257/737 |
| 2014/0091447 | A1 * | 4/2014 | Onozuka | H01L 23/49575 257/676 |
| 2014/0175671 | A1 * | 6/2014 | Haba | H01L 25/105 257/777 |
| 2014/0284731 | A1 * | 9/2014 | Nakao | H01L 23/3135 257/415 |
| 2014/0312488 | A1 * | 10/2014 | Fukuda | H01L 23/49827 257/734 |
| 2014/0340302 | A1 * | 11/2014 | Sengupta | G06F 3/017 345/156 |
| 2015/0014855 | A1 * | 1/2015 | Yap | H01L 24/82 257/773 |
| 2015/0043228 | A1 * | 2/2015 | Kogure | H01L 21/78 362/382 |
| 2015/0076672 | A1 * | 3/2015 | Hosseini | H01L 23/3135 257/666 |
| 2015/0091167 | A1 * | 4/2015 | Geissler | B81C 1/00261 257/738 |
| 2015/0137279 | A1 * | 5/2015 | Tiu | H01L 23/315 257/415 |
| 2015/0179570 | A1 * | 6/2015 | Marimuthu | H01L 25/0655 257/774 |
| 2015/0187674 | A1 * | 7/2015 | Miyanagi | H01L 25/07 257/713 |
| 2015/0228619 | A1 * | 8/2015 | Sawada | H01L 21/288 257/98 |
| 2015/0270250 | A1 * | 9/2015 | Takamitsu | G11C 29/1201 257/48 |
| 2015/0348863 | A1 * | 12/2015 | Du | H01L 23/3135 257/737 |
| 2016/0005726 | A1 * | 1/2016 | Chen | H01L 25/03 257/737 |
| 2016/0079484 | A1 * | 3/2016 | Hosokawa | H01L 33/502 257/98 |
| 2017/0084590 | A1 * | 3/2017 | Yu | H01L 21/4846 |
| 2017/0103951 | A1 * | 4/2017 | Lee | H01L 23/295 |
| 2017/0236810 | A1 | 8/2017 | Kurita et al. | |
| 2017/0330841 | A1 * | 11/2017 | Cook | H01L 21/56 |
| 2018/0044169 | A1 * | 2/2018 | Hatcher, Jr. | H01L 24/24 |

(56) References Cited

U.S. PATENT DOCUMENTS

| | | | |
|---|---|---|---|
| 2018/0047653 A1* | 2/2018 | Costa | H01L 23/3135 |
| 2018/0061815 A1* | 3/2018 | Fang | H01L 23/3128 |
| 2018/0082933 A1* | 3/2018 | Ko | H01L 23/16 |
| 2018/0092257 A1* | 3/2018 | Otsubo | H01L 23/18 |
| 2018/0096862 A1* | 4/2018 | Oster | H01L 23/3128 |
| 2018/0096967 A1* | 4/2018 | Tsai | H01L 23/552 |
| 2018/0134546 A1* | 5/2018 | Oh | B81C 1/0023 |
| 2018/0190558 A1* | 7/2018 | Hsu | H01L 24/25 |
| 2019/0006291 A1* | 1/2019 | Neal | H01L 21/565 |
| 2019/0131224 A1* | 5/2019 | Choi | H01L 23/3128 |
| 2019/0131242 A1* | 5/2019 | Lee | H01L 23/49833 |
| 2019/0148340 A1* | 5/2019 | Yu | H01L 23/5389 257/737 |
| 2019/0198352 A1* | 6/2019 | Nangia | H01L 23/3135 |
| 2019/0229027 A1* | 7/2019 | Nomiyama | H05K 3/28 |
| 2019/0237407 A1* | 8/2019 | Lee | H01L 23/562 |
| 2019/0237412 A1* | 8/2019 | Lee | H01L 23/49816 |
| 2019/0237423 A1* | 8/2019 | Chen | H01L 24/19 |
| 2019/0273079 A1* | 9/2019 | Gong | H01L 23/5226 |
| 2019/0287907 A1* | 9/2019 | Mahler | H01L 23/49586 |
| 2019/0287953 A1* | 9/2019 | Moon | H01L 23/3135 |
| 2019/0295944 A1* | 9/2019 | Kwon | H01L 25/0655 |
| 2019/0333780 A1* | 10/2019 | Kong | H01L 23/49827 |
| 2019/0333836 A1* | 10/2019 | Lin | H01L 23/5389 |
| 2019/0363055 A1* | 11/2019 | Yazaki | H05K 9/0024 |
| 2019/0378775 A1* | 12/2019 | Lee | H01L 23/3135 |
| 2020/0013727 A1* | 1/2020 | Kim | H01L 23/552 |
| 2020/0027836 A1* | 1/2020 | Takano | H01L 23/16 |
| 2020/0035606 A1* | 1/2020 | Bhagavat | H01L 21/6835 |
| 2020/0043820 A1* | 2/2020 | Oh | H01L 23/3128 |
| 2020/0091099 A1* | 3/2020 | Choi | H01L 23/3171 |
| 2020/0118838 A1* | 4/2020 | Hammond | H01L 24/96 |
| 2020/0118959 A1* | 4/2020 | Kim | H01L 23/49827 |
| 2020/0118985 A1* | 4/2020 | Chae | H01L 23/3128 |
| 2020/0144183 A1* | 5/2020 | Jang | H01L 23/49575 |
| 2020/0144236 A1* | 5/2020 | Jang | H01L 24/09 |
| 2020/0161231 A1* | 5/2020 | Lee | H01L 23/49827 |
| 2020/0176364 A1* | 6/2020 | Park | H01L 23/5389 |
| 2020/0211978 A1* | 7/2020 | Pei | H01L 23/552 |
| 2020/0219845 A1* | 7/2020 | Liu | H01L 21/565 |
| 2020/0255285 A1* | 8/2020 | Doering | G01L 19/0038 |
| 2020/0273759 A1* | 8/2020 | Eder | H01L 24/75 |
| 2020/0294912 A1* | 9/2020 | Tai | H01L 23/3731 |
| 2020/0343197 A1* | 10/2020 | Chen | H01L 24/83 |
| 2020/0343221 A1* | 10/2020 | Pon | H01L 25/03 |
| 2020/0357715 A1* | 11/2020 | Vincent | H01L 23/295 |
| 2020/0365478 A1* | 11/2020 | Lu | H01L 23/315 |
| 2020/0365571 A1* | 11/2020 | Chen | H01L 23/3121 |
| 2020/0402878 A1* | 12/2020 | Daniels | H01L 25/50 |
| 2021/0005542 A1* | 1/2021 | Mallik | H01L 23/5385 |
| 2021/0020579 A1* | 1/2021 | Lu | H01L 23/4827 |
| 2021/0020597 A1* | 1/2021 | Chang | H01L 21/566 |
| 2021/0043604 A1* | 2/2021 | Fang | H01L 21/565 |
| 2021/0125934 A1* | 4/2021 | Yang | H01L 23/49816 |

FOREIGN PATENT DOCUMENTS

| | | | | |
|---|---|---|---|---|
| DE | 102013114938 A1 | * | 7/2014 | H01L 23/49861 |
| DE | 102014102006 A1 | * | 8/2014 | H01L 25/10 |
| DE | 102016103676 A1 | * | 9/2017 | H01L 23/18 |
| EP | 2784814 A2 | * | 10/2014 | H01L 23/552 |
| EP | 3483929 A1 | | 5/2019 | H01L 23/31 |
| JP | 08186189 A | * | 7/1996 | H01L 23/24 |
| JP | 2017175123 A | * | 9/2017 | H01L 23/3114 |
| WO | WO-2007052198 A1 | * | 5/2007 | H01L 21/568 |
| WO | WO-2013124940 A1 | * | 8/2013 | H01L 23/295 |
| WO | WO-2015017959 A1 | * | 2/2015 | H01L 21/48 |
| WO | WO-2016064686 A1 | * | 4/2016 | H01L 23/3135 |
| WO | WO-2018110383 A1 | * | 6/2018 | H01L 23/28 |
| WO | WO-2018168734 A1 | * | 9/2018 | H01L 23/12 |
| WO | WO-2019089769 A1 | * | 5/2019 | H01L 23/66 |

* cited by examiner

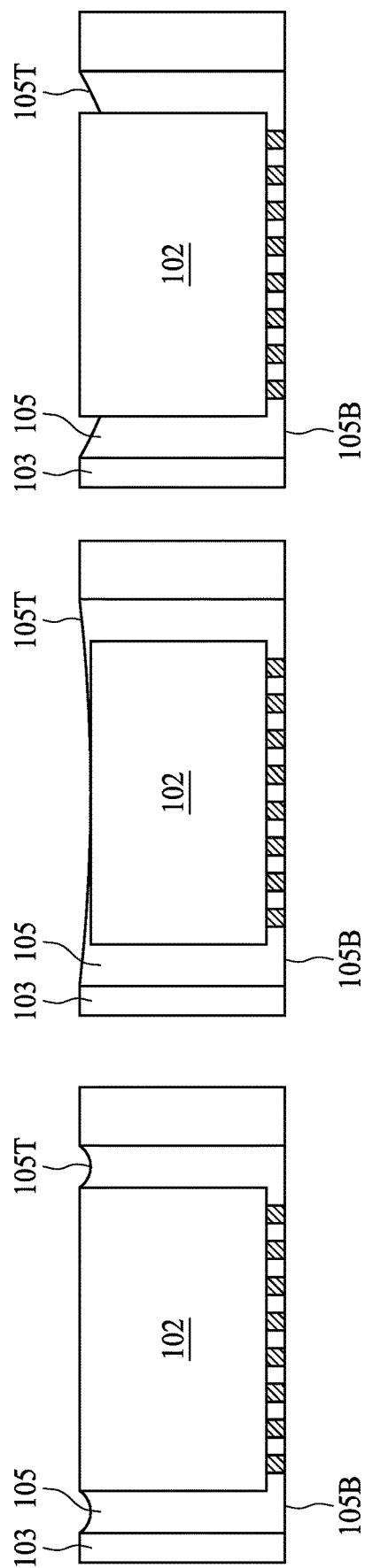

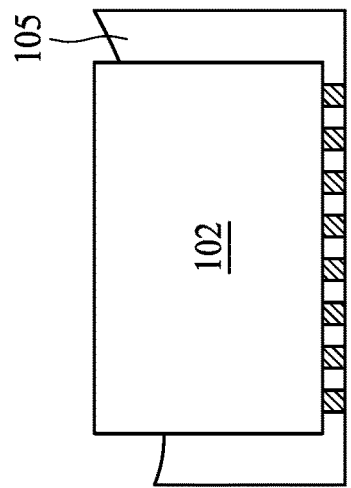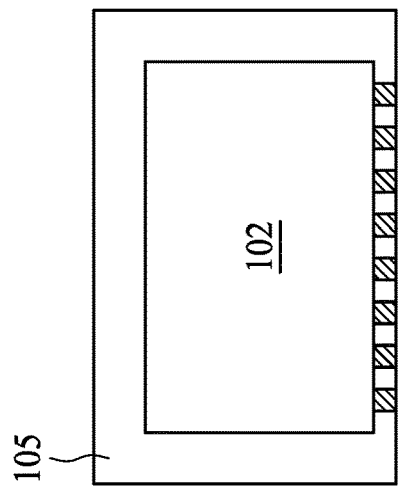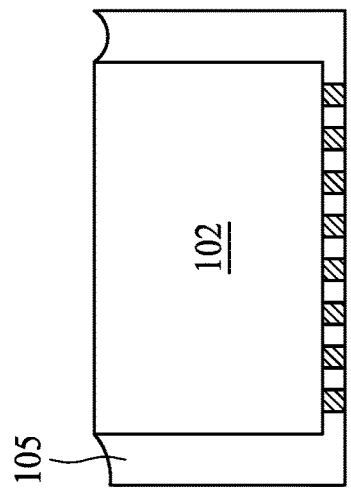

SEMICONDUCTOR PACKAGE STRUCTURE AND METHOD OF MANUFACTURING THE SAME

BACKGROUND

1. Technical Field

The present disclosure relates to a semiconductor package structure comprising a first die leveled with a second die. In particular, the first die is encapsulated by a molding compound and the second die by an underfill.

2. Description of the Related Art

Package type for high speed application dies, such as central processing unit (CPU) or Graphics Processing Unit (GPU), can be categorized into molding and non-molding solutions.

By using non-molding solution, high speed application die can be mounted to the package at a later operation, so that the yield loss in earlier operations, such as non-high speed application chip bonding failure, silicon interposer solder bumping failure, die/interposer or die/redistributing layer (RDL) combo on substrate failure, and so forth, would not involve the loss of high speed application dies. However, downside of non-molding solution is that there is no molding compound surrounding the dies in the package, leading to poor heat dissipation and severely affecting product reliability.

By using molding solution, dies in the packages can be encapsulated by molding compound and obtain better heat dissipation environment. However, high speed application die has to be mounted to the package structure during chip-on-wafer stage (e.g., an earlier operation), so as to suffer the consequence of yield loss in consideration of the later operations

SUMMARY

In some embodiments, according to one aspect of the present disclosure, a semiconductor package structure includes a substrate, a first semiconductor die, a first dielectric, a second semiconductor die, and a second dielectric. The substrate has a first surface. The first semiconductor die is disposed on the first surface. The first dielectric encapsulates the first semiconductor die. The second semiconductor die is disposed on the first surface and adjacent to the first semiconductor die. The second dielectric encapsulates the second semiconductor die. The first dielectric is in contact with the second dielectric. An average filler size in the first dielectric is substantially greater than an average filler size in the second dielectric.

In some embodiments, according to one aspect of the present disclosure, a semiconductor package structure includes a first semiconductor die, a second semiconductor die, and a second dielectric. The first semiconductor die is disposed on a first side of a substrate. The second semiconductor die is disposed on the substrate and adjacent to the first semiconductor die. The second semiconductor die is disposed in a cavity defined by a first dielectric. The second dielectric encapsulates the second semiconductor die by filling the cavity of the first dielectric. A top of the second dielectric is wider than a bottom of the second portion of the second dielectric.

In some embodiments, according to another aspect of the present disclosure, a method is disclosed for manufacturing a semiconductor package structure. The method includes the following operations: providing an encapsulant on a carrier; forming a cavity to expose a circuit layer in each of two adjacent package structure units of the carrier; disposing a semiconductor die on the circuit layer in each of two adjacent package structure units of the carrier; encapsulating the semiconductor die in each of two adjacent package structure units by a filling material with a single filling operation.

In some embodiments, according to one aspect of the present disclosure, a semiconductor package structure includes a substrate, a first semiconductor die, a second semiconductor die, a first dielectric, a second dielectric, a third dielectric. The first semiconductor die is disposed on the substrate. The second semiconductor die is disposed on the substrate and adjacent to the first semiconductor die. The first dielectric is disposed on the substrate. The first dielectric separates the first semiconductor die from the second semiconductor die. The second dielectric is disposed between the first semiconductor die and the substrate. The third dielectric encapsulates the second semiconductor die by covering at least a half of a height of the second semiconductor die. The first dielectric is different from the second dielectric. The first dielectric is different from the third dielectric.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 2A illustrates a cross-sectional view of a semiconductor package structure according to some embodiments of the present disclosure.

FIG. 2B illustrates a cross-sectional view of a semiconductor package structure according to some embodiments of the present disclosure.

FIG. 2C illustrates a cross-sectional view of a semiconductor package structure according to some embodiments of the present disclosure.

FIG. 9A illustrates a cross-sectional view of a semiconductor package structure according to some embodiments of the present disclosure.

FIG. 9B illustrates a cross-sectional view of a semiconductor package structure according to some embodiments of the present disclosure.

FIG. 9C illustrates a cross-sectional view of a semiconductor package structure according to some embodiments of the present disclosure.

DETAILED DESCRIPTION

Figure 1:
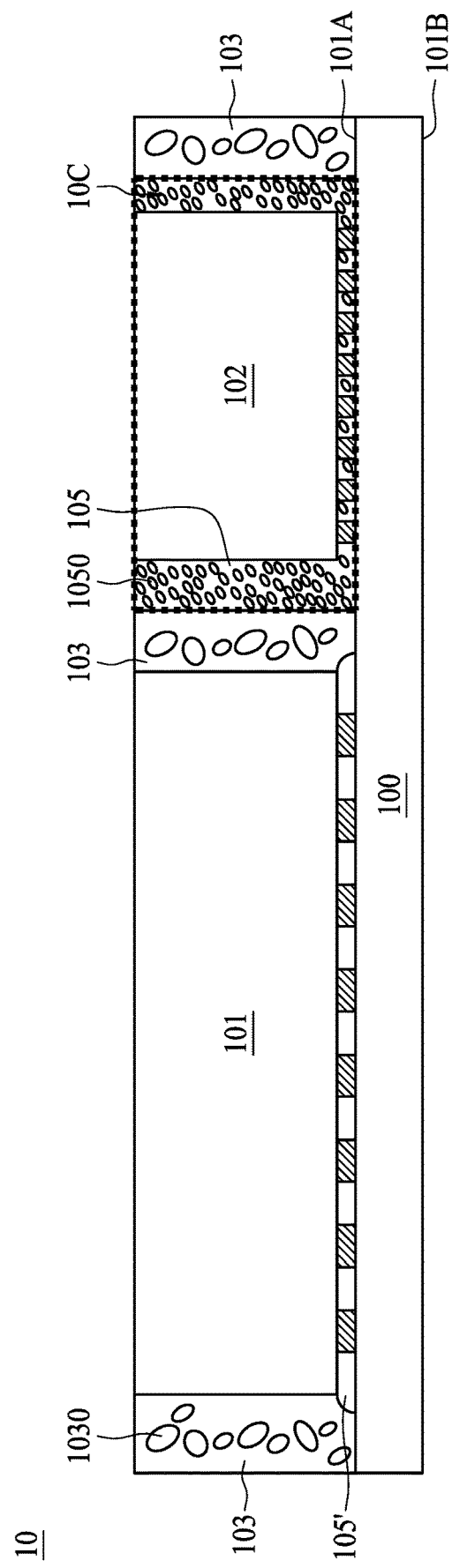
FIG. 1 illustrates a cross-sectional view of a semiconductor package structure according to some embodiments of the present disclosure.

Common reference numerals are used throughout the drawings and the detailed description to indicate the same or similar components.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor package structure 10 in accordance with some embodiments of the present disclosure. The semiconductor package structure 10 includes a substrate 100, a semiconductor die 101, a semiconductor die 102, a dielectric 103, and a dielectric 105. The semiconductor package structure 10 may be a fan-out package.

The substrate 100 has an upper surface 101A and a lower surface 101B opposite to the upper surface 101A. In some embodiments, the substrate 100 may include, for example, a printed circuit board, such as a paper-based copper foil laminate, a composite copper foil laminate, or a polymer-impregnated glass-fiber-based copper foil laminate. The substrate 100 may include a core layer which is made of a bismaleimide-triazine (BT) resin or a glass-reinforced epoxy composite (e.g., an FR-4 composite). The substrate 100 may include an interconnection structure, such as a redistribution layer (RDL) or a grounding element. In some embodiments, the grounding element is a via that is exposed from a lateral surface of the substrate 100. In some embodiments, the grounding element is a metal layer exposed from the lateral surface of the substrate 100. In some embodiments, the grounding element is a metal trace exposed from the lateral surface of the substrate 100. The substrate 100 may include a patterned conductive layer which may include a plurality of traces.

The semiconductor die 101 is disposed on the upper surface 101A of the substrate 100. The semiconductor die 101 has an active surface facing the upper surface 101A of the substrate 100. The semiconductor die 101 includes a conductive pad electrically connected to the substrate 100. The conductive pad may include Au, Ag, Cu, Pt, Pd, alloy of the same, or other suitable materials. The conductive pad of the semiconductor die 101 is surrounded by an underfill 105'. The underfill 105' protects the active surface of the semiconductor die 101. The underfill 105' covers less than a half height of the semiconductor die 101. In some embodiments, the semiconductor die 101 may include an application-specific integrated circuit (ASIC), a controller, a processor or other electronic component or semiconductor device.

The semiconductor die 102 is disposed on the upper surface 101A of the substrate 100. The semiconductor die 102 is disposed in a cavity 10C defined by the dielectric 103. The semiconductor die 102 is adjacent to the semiconductor die 101. The semiconductor die 102 has an active surface facing the upper surface 101A of the substrate 100. The semiconductor die 102 includes a conductive pad electrically connected to the substrate 100. The conductive pad may include Au, Ag, Cu, Pt, Pd, alloy of the same, or other suitable materials. The semiconductor die 102 is electrically coupled to the semiconductor die 101. In some embodiments, the semiconductor die 102 may include a high bandwidth memory. The size of the semiconductor die 101 is greater than that of the semiconductor die 102.

The dielectric 103 is disposed on the upper surface 101A of the substrate 100. The semiconductor die 101 is encapsulated by the dielectric 103. The dielectric 103 surrounds the semiconductor die 101. In some embodiments, the dielectric 103 may be an encapsulant or a molding compound. The dielectric 103 includes a plurality of fillers 1030. The dielectric 103 may or may not include a broken filler, depending on various manufacturing sequences and operations. A back side of the semiconductor die 101 is exposed by the dielectric 103.

The dielectric 105 is disposed on the upper surface 101A of the substrate 100. The dielectric 105 fills the cavity 10C. The semiconductor die 102 is encapsulated by the dielectric 105. The dielectric 105 surrounds the conductive pad of the semiconductor die 102. In some embodiments, the dielectric 105 may be an underfill. The dielectric 105 includes a plurality of fillers 1050. A back side of the semiconductor die 102 is exposed by the dielectric 105. The dielectric 105 covers at least a half of a height of the semiconductor die 102. The dielectric 105 and the dielectric 103 include different materials.

The dielectric 105 is in contact with the dielectric 103. A height of the dielectric 105 may be the same as that of the dielectric 103. In some embodiments, an average filler size of the fillers 1030 in the dielectric 103 is substantially greater than an average filler size of the fillers 1050 in the dielectric 105. In some embodiments, filler size in the dielectric 105 is more uniform than filler size in the dielectric 103. In some embodiments, a filler content in the dielectric 105 is substantially greater than a filler content in the dielectric 103. In some embodiments, the underfill 105' and the dielectric 105 are composed of substantially identical materials.

Generally speaking, if any die mounted to the package structure is damaged, the package including such damaged die is counted as yield loss. In such arrangement of the semiconductor package structure 10, the semiconductor die 102 may be disposed on the substrate 100 after the semiconductor die 101. The semiconductor die 101 may be screened by X-ray to check the structural integrity of the semiconductor die 101 prior to attaching the semiconductor die 102 on the substrate 100. Therefore, if the semiconductor die 101 is detected as a failure die, the semiconductor die 102 would not be attached to the substrate 100. According to such arrangement of the semiconductor package structure 10, yield loss of the semiconductor package can be reduced.

FIG. 2A is a cross-sectional view of the semiconductor package structure 10 in accordance with some embodiments of the present disclosure. The dielectric 105 has a top side 105T distal to the upper surface 101A of the substrate 100 and a bottom side 105B proximal to the upper surface 101A of the substrate 100 (shown in FIG. 1). The top side 105T has an uneven surface. The uneven surface of the top side 105T of the dielectric 105 comprises a dimple between the dielectric 103 and the semiconductor die 102. The backside of the semiconductor die 102 is exposed by the dielectric 105. Under such arrangement, the amount of the dielectric 105 is applied with an appropriate amount during the manufacturing operations of the semiconductor package structure 10.

In some embodiments, the height of the semiconductor die 102 may be substantially the same as that of the dielectric 103. The dielectric 105 may bleed on the dielectric 103. The dielectric 105 may partially cover the dielectric 103. The height of the dielectric 105 may be substantially the same as or higher than that of the dielectric 103.

FIG. 2B is a cross-sectional view of the semiconductor package structure 10 in accordance with some embodiments of the present disclosure. The dielectric 105 has a top side 105T distal to the upper surface 101A of the substrate 100 and a bottom side 105B proximal to the upper surface 101A of the substrate 100. The top side 105T has an uneven surface. The uneven surface of the top side 105T of the dielectric 105 comprises a recess across the semiconductor die 102. The semiconductor die 102 is covered by the dielectric 105. Under such arrangement, the amount of the dielectric 105 is applied with an amount larger than that of FIG. 2A during the manufacturing operations of the semiconductor package structure 10.

In some embodiments, the height of the semiconductor die 102 may be less than that of the dielectric 103. The dielectric 105 may bleed on the dielectric 103. The dielectric 105 may partially cover the dielectric 103. The height of the dielectric 105 may be substantially the same as or higher than that of the dielectric 103.

FIG. 2C is a cross-sectional view of the semiconductor package structure 10 in accordance with some embodiments of the present disclosure. The dielectric 105 has a top side 105T distal to the upper surface 101A of the substrate 100 and a bottom side 105B proximal to the upper surface 101A of the substrate 100. The top side 105T has an uneven surface. The uneven surface of the top side 105T of the dielectric 105 comprises a recess across the semiconductor die 102. The backside of the semiconductor die 102 is exposed by the dielectric 105. Part of lateral sides of the semiconductor die 102 is exposed by the dielectric 105. Under such arrangement, the amount of the dielectric 105 is applied with an amount less than that of FIG. 2A during the manufacturing operations of the semiconductor package structure 10.

In some embodiments, the height of the semiconductor die 102 may be substantially the same as that of the dielectric 103. The height of the dielectric 105 may be substantially the same as or less than that of the dielectric 103.

Figure 3A:
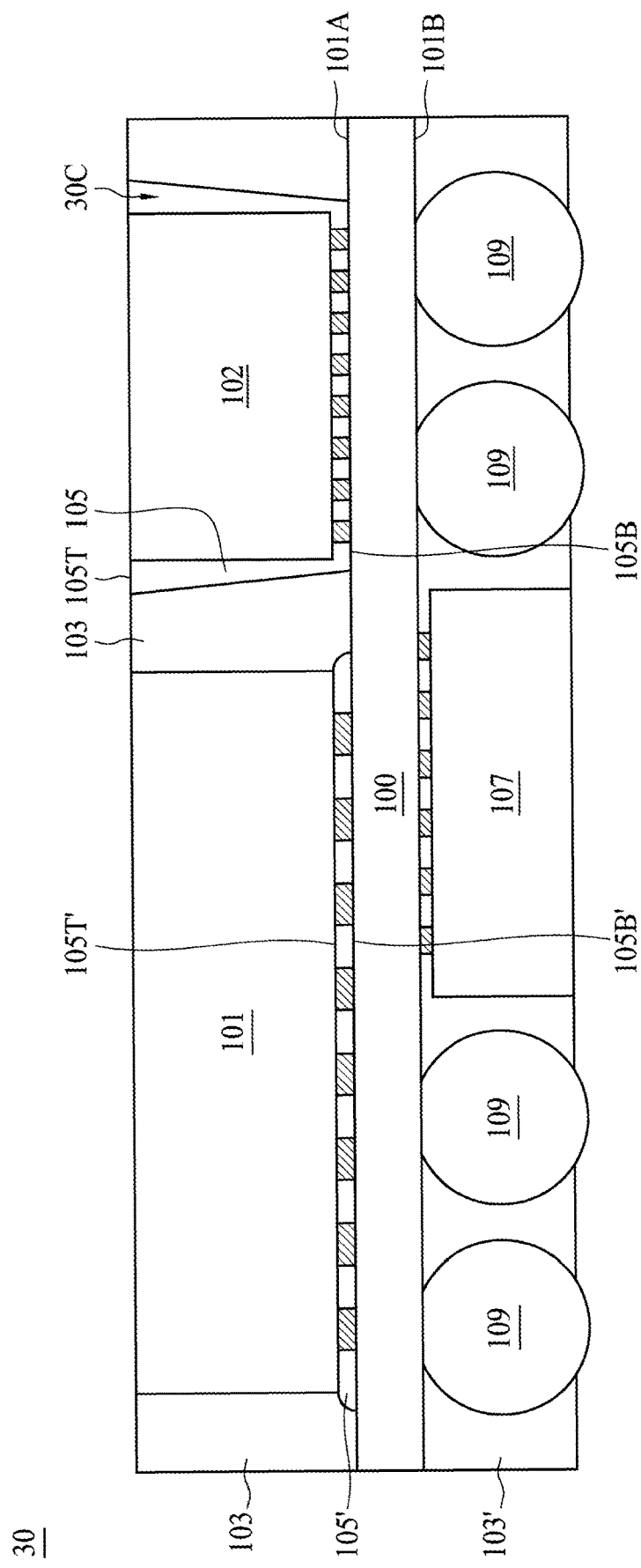
FIG. 3(a) and FIG. 3(b) illustrates a cross-sectional view of a semiconductor package structure according to some embodiments of the present disclosure.

FIG. 3(a) is a cross-sectional view of a semiconductor package structure 30 in accordance with some embodiments of the present disclosure. The semiconductor package structure 30 includes a substrate 100, a semiconductor die 101, a semiconductor die 102, a dielectric 103, a dielectric 103', a dielectric 105, a semiconductor die 107, and a conductive terminal 109. The semiconductor package structure 30 has a double side molding structure. The semiconductor package structure 30 may be a fan-out package.

The substrate 100 has an upper surface 101A and a lower surface 101B opposite to the upper surface 101A. In some embodiments, the substrate 100 may be a wafer-level RDL structure.

The semiconductor die 101 is disposed on the upper surface 101A of the substrate 100. The semiconductor die 101 has an active surface facing the upper surface 101A of the substrate 100. The semiconductor die 101 includes a conductive pad electrically connected to the substrate 100. The conductive pad may include Au, Ag, Cu, Pt, Pd, alloy of the same, or other suitable materials. The conductive pad of the semiconductor die 101 is surrounded by an underfill 105'. The underfill 105' protects the active surface of the semiconductor die 101. The underfill 105' covers less than a half height of the semiconductor die 101. In some embodiments, the semiconductor die 101 may include an application-specific integrated circuit (ASIC), a controller, a processor or other electronic component or semiconductor device.

The semiconductor die 102 is disposed on the upper surface 101A of the substrate 100. The semiconductor die 102 is disposed in a cavity 30C defined by the dielectric 103. The semiconductor die 102 is adjacent to the semiconductor die 101. The semiconductor die 102 has an active surface facing the upper surface 101A of the substrate 100. The semiconductor die 102 includes a conductive pad electrically connected to the substrate 100. The conductive pad may include Au, Ag, Cu, Pt, Pd, alloy of the same, or other suitable materials. The semiconductor die 102 is electrically coupled to the semiconductor die 101. In some embodiments, the semiconductor die 102 may include a high bandwidth memory. The size of the semiconductor die 101 is greater than that of the semiconductor die 102.

The dielectric 103 is disposed on the upper surface 101A of the substrate 100. The semiconductor die 101 is encapsulated by the dielectric 103. The dielectric 103 surrounds the semiconductor die 101. In some embodiments, the dielectric 103 may be an encapsulant or a molding compound. The dielectric 103 includes a plurality of fillers 1030 (not shown). The dielectric 103 may or may not include a broken filler, depending on various manufacturing sequences and operations. A back side of the semiconductor die 101 is exposed by the dielectric 103.

The dielectric 105 is disposed on the upper surface 101A of the substrate 100. The dielectric 105 fills the cavity 30C. The semiconductor die 102 is encapsulated by the dielectric 105. The dielectric 105 surrounds the conductive pad of the semiconductor die 102. In some embodiments, the dielectric 105 may be an underfill. The dielectric 105 includes a plurality of fillers 1050 (not shown). A back side of the semiconductor die 102 is exposed by the dielectric 105. The dielectric 105 has a top side 105T and a bottom side 105B opposite to the top side 105T. The top side 105T of the dielectric 105 is wider than the bottom side 105B of the dielectric 105. The dielectric 105 covers at least a half height of the semiconductor die 102. The dielectric 105 and the dielectric 103 include different materials.

The dielectric 105 is in contact with the dielectric 103. A height of the dielectric 105 may be the same as that of the dielectric 103. In some embodiments, an average filler size of the fillers 1030 in the dielectric 103 is substantially greater than an average filler size of the fillers 1050 in the dielectric 105. In some embodiments, filler size in the dielectric 105 is more uniform than filler size in the dielectric 103. In some embodiments, a filler content in the dielectric 105 is substantially greater than a filler content in the dielectric 103.

In some embodiments, the underfill 105' and the dielectric 105 may have the same material. The underfill 105' between the semiconductor die 101 and the substrate 100 has a top side 105T' and a bottom side 105B' opposite to the top side 105T'. The top side 105T' of the underfill 105' is narrower than the bottom side 105B' of the underfill 105'. Prior to disposing the semiconductor die 102 over the substrate 100, the cavity subsequently filled with underfill 105 is having a trapezoidal shape with a wider top and narrower bottom, resembling a de-molding angle in a selective molding operation, for example.

The semiconductor die 107 is disposed on the lower surface 101B of the substrate 100. The semiconductor die 107 has an active surface facing the lower surface 101B of the substrate 100. The semiconductor die 107 includes a conductive pad electrically connected to the substrate 100. The semiconductor die 107 is electrically coupled to the semiconductor dies 101 and 102 through the substrate 100. The conductive pad may include Au, Ag, Cu, Pt, Pd, alloy of the same, or other suitable materials. In some embodiments, the semiconductor die 107 may include an application-specific integrated circuit (ASIC), a controller, a processor, a MEMS device, a memory, or other electronic component or semiconductor device.

The conductive terminal 109 is disposed on the lower surface 101B of the substrate 100. In some embodiments, the conductive terminal 109 may be a solder ball. A height of the conductive terminal 109 is higher than that of the semiconductor die 107.

Figure 3B:
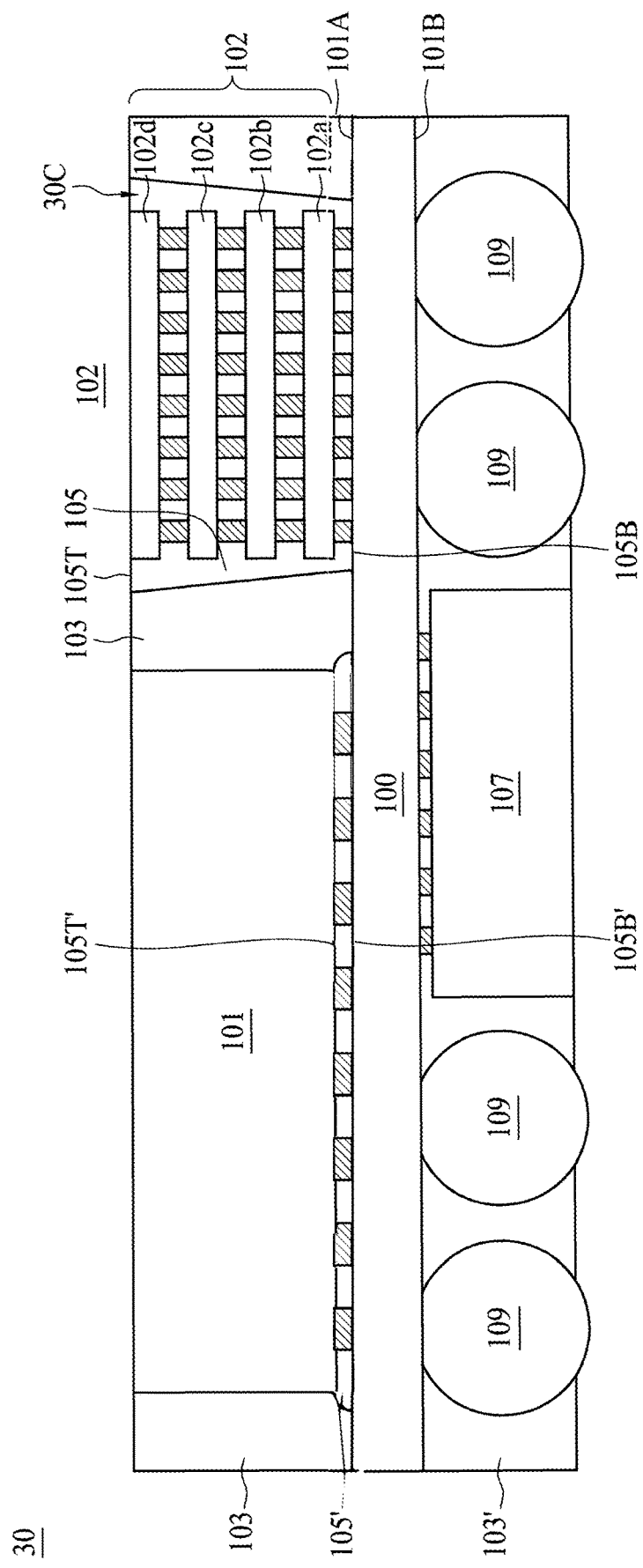

The dielectric 103' is disposed on the lower surface 101B of the substrate 100. The semiconductor die 107 is encapsulated by the dielectric 103'. The dielectric 103' surrounds the semiconductor die 107. The dielectric 103' surrounds the conductive terminal 109. The dielectric 103 and the dielectric 103' are composed of substantially identical materials. The backside of the semiconductor die 107 is exposed by the dielectric 103'. The conductive terminal 109 is partially exposed by the dielectric 103'. FIG. 3(b) is a cross-sectional view of a semiconductor package structure 30 in accordance with some embodiments of the present disclosure. The semiconductor package structure 30 is similar to the semiconductor package structure 30 in FIG. 3(a) except that the semiconductor die 102 may be a stacked die structure, including more than one semiconductor dies 102a, 102b, 102c, 102d.

Figure 4:
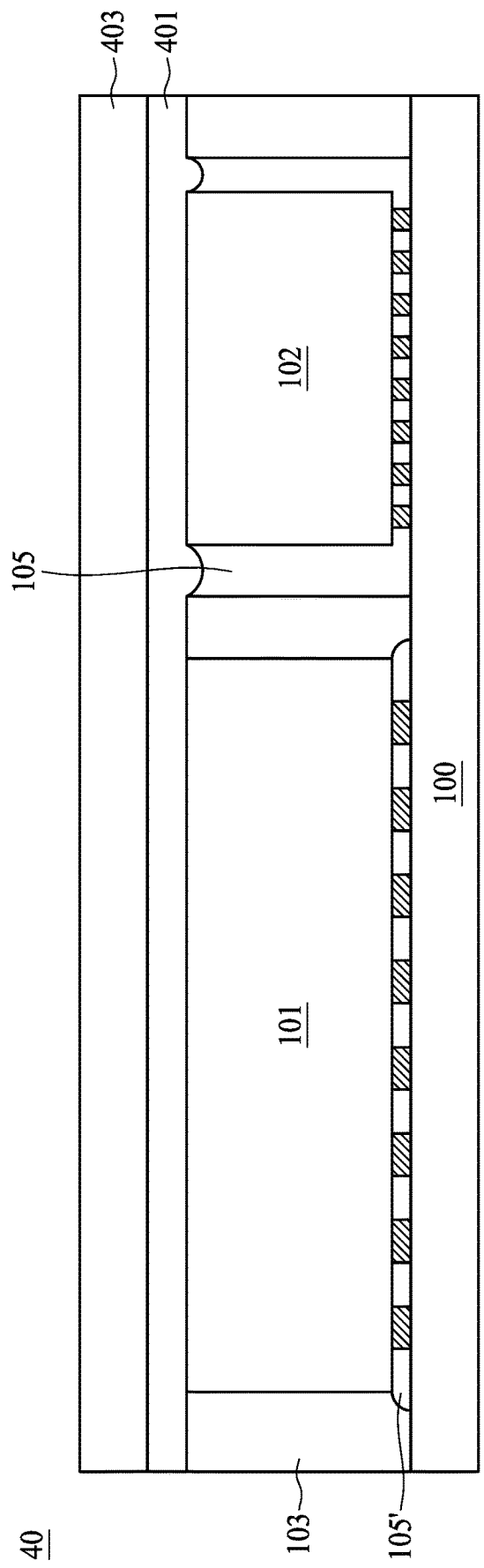
FIG. 4 illustrates a cross-sectional view of a semiconductor package structure according to some embodiments of the present disclosure.

FIG. 4 is a cross-sectional view of a semiconductor package structure 40 in accordance with some embodiments of the present disclosure. The semiconductor package structure 40 is similar to the semiconductor package structure 10 in FIGS. 1 and 2A except that a thermal interface layer 401 and a heat dissipation layer 403 are disposed on the semiconductor dies 101 and 102.

The thermal interface layer 401 is conformal to the uneven surface of the dielectric 105. The thermal interface layer 401 may be functioned as a planarization layer. In some embodiments, the thermal interface layer 401 may be functioned as a passivation layer. The thermal interface layer 401 may provide a flat top platform for the following operations for the semiconductor package structure 40. For example, a following layer or structure may be arranged on the semiconductor package structure 40. Such flat top platform provided by the thermal interface layer 401 may enhance the stability and reliability for the semiconductor package structure 40.

The heat dissipation layer 403 is disposed over the thermal interface layer 401. The heat dissipation layer 403 may facilitate heat dissipation of the semiconductor package structure 40. The heat dissipation layer 403 may be a thermal conductive layer such that heat generated by the semiconductor dies 101 and 102 can spread to air through the heat dissipation layer 403.

Figure 5:
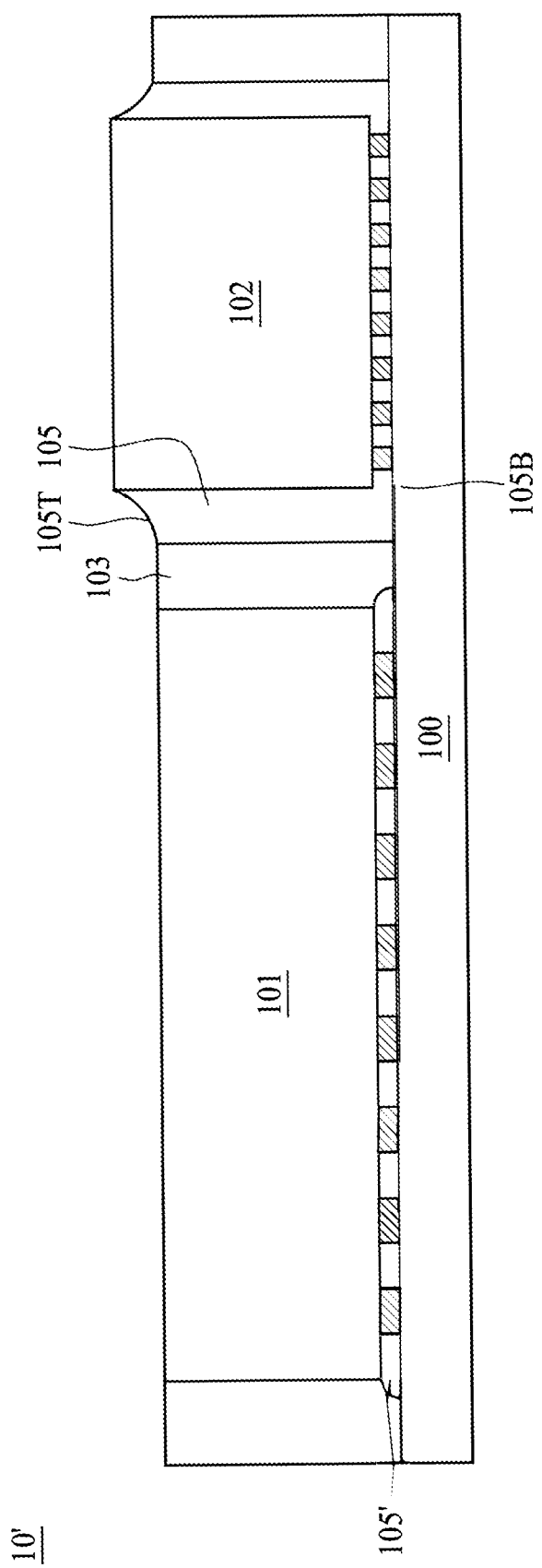
FIG. 5 illustrates a cross-sectional view of a semiconductor package structure according to some embodiments of the present disclosure.

FIG. 5 is a cross-sectional view of a semiconductor package structure 10' in accordance with some embodiments of the present disclosure. The semiconductor package structure 10' is similar to the semiconductor package structure 10 in FIG. 1 except that a height of the semiconductor die 102 is greater than that of the semiconductor die 101. In some embodiments, the height difference between the semiconductor die 102 and the semiconductor die 101 may be ranged from approximately 5 μm to approximately 10 μm.

The dielectric 105 has a top side 105T. The top side 105T has an uneven surface. The top side 105T of the dielectric 105 is slanted with respect to the lateral side of the semiconductor die 102. A height of the dielectric 105 is greater than that of the dielectric 103.

Figure 6:
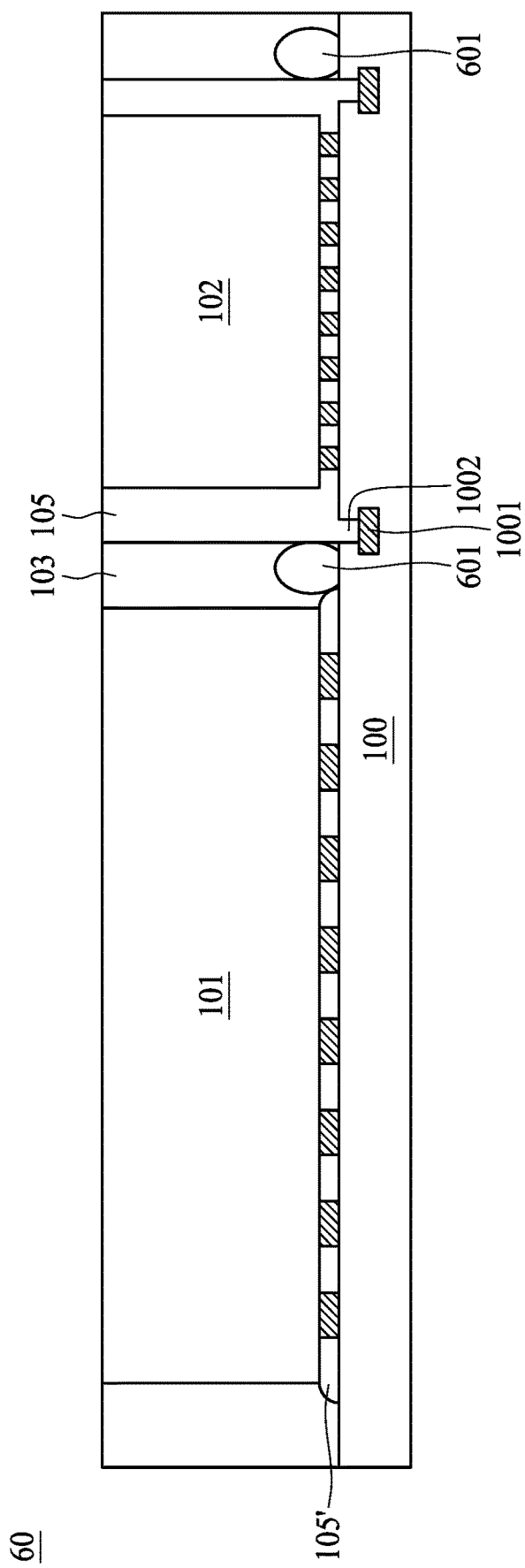
FIG. 6 illustrates a cross-sectional view of a semiconductor package structure according to some embodiments of the present disclosure.

FIG. 6 is a cross-sectional view of a semiconductor package structure 60 in accordance with some embodiments of the present disclosure. The semiconductor package structure 60 is similar to the semiconductor package structure 10 in FIG. 1 except that one dam 601 is disposed adjacent to the semiconductor die 102 and at the periphery of the substrate 100 and another dam 601 is disposed between semiconductor dies 101 and 102. In some embodiments, the semiconductor die 102 may be surrounded by a plurality of dam structures 601. The dielectric 105 may be surrounded by dam structure 601. The dam structure 601 is encapsulated by the dielectric 103. The dam structure 601 may be in contact with the dielectrics 103 and 105. The dam structure 601 may be in contact with the underfill 105'.

The substrate 100 has an opening 1002. The substrate 100 has a conductive trace 1001, or an embedded conductive trace, exposed from the opening 1002.

The dam structure 601 defines a specific region on which the semiconductor die 102 is attached. The openings 1002 define the specific region on which the semiconductor die 102 is attached. In some embodiments, the specific region may be defined by both of the dam structure 601 and the openings 1002. The dielectric 105 is disposed on the specific region. The dielectric 105 is disposed in the openings 1002. The dielectric 105 is filled in the openings 1002. The dielectric 105 is in contact with the conductive trace 1001. The dielectric 105 is in contact with the dam 601. The dielectric 105 is confined within the dam structure 601 without lateral encroachment beyond the dam structure 601. The dielectric 105 is confined within the specific region.

Figure 7:
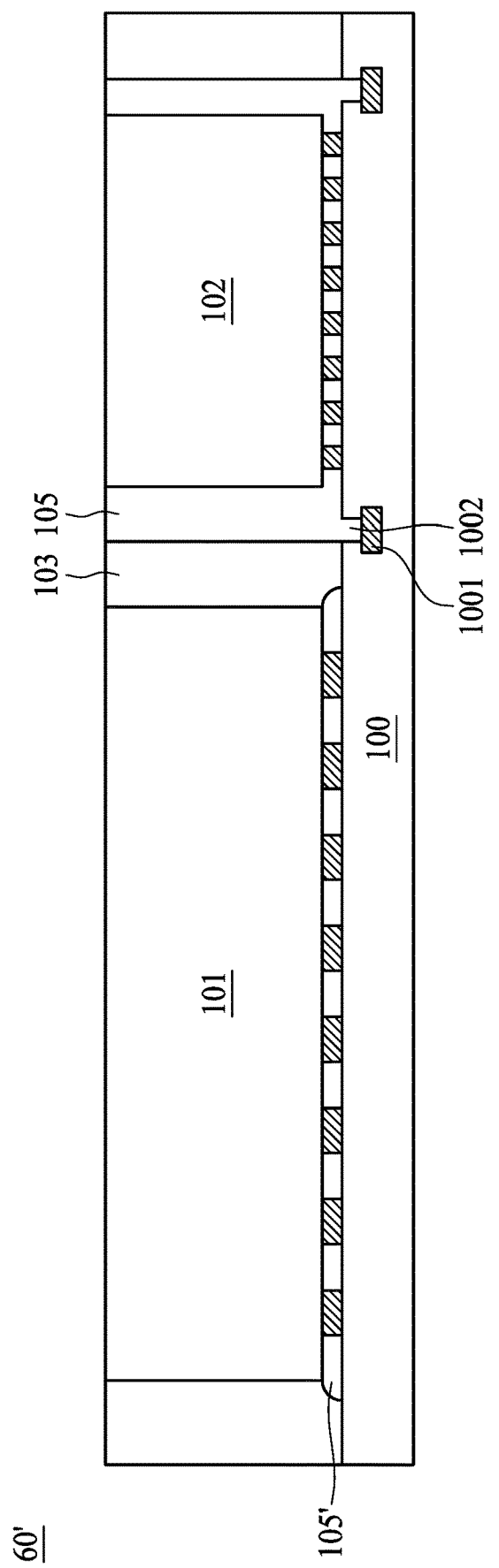
FIG. 7 illustrates a cross-sectional view of a semiconductor package structure according to some embodiments of the present disclosure.

FIG. 7 is a cross-sectional view of a semiconductor package structure 60' in accordance with some embodiments of the present disclosure. The semiconductor package structure 60' is similar to the semiconductor package structure 60 in FIG. 6 except that the dam structure 601 is omitted. The specific region on which the semiconductor die 102 is attached is defined by the openings 1002.

Figure 8:
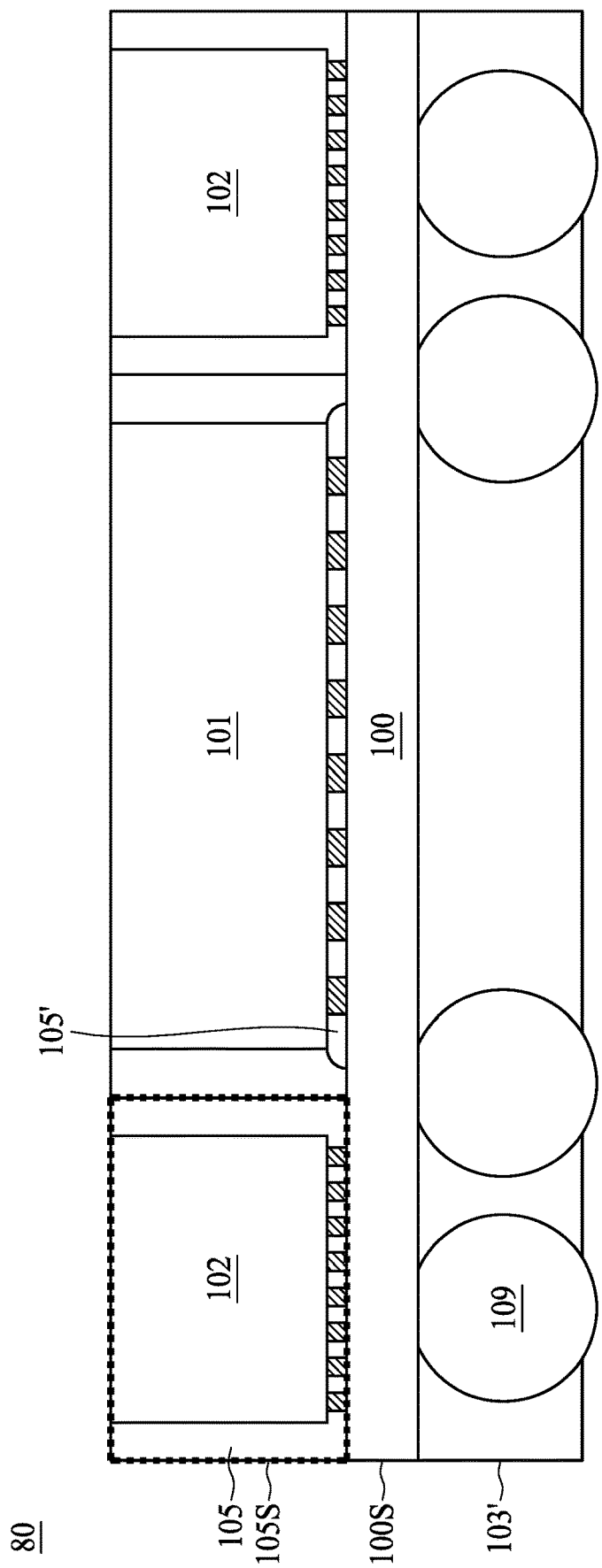
FIG. 8 illustrates a cross-sectional view of a semiconductor package structure according to some embodiments of the present disclosure.

FIG. 8 is a cross-sectional view of a semiconductor package structure 80 in accordance with some embodiments of the present disclosure. The semiconductor package structure 80 is similar to the semiconductor package structure 30 in FIG. 3 except that the semiconductor die 107 is omitted and that two semiconductor dies 102 are disposed at the periphery of the substrate 100. The semiconductor die 101 is surrounded by the semiconductor dies 102. The semiconductor die 101 is surrounded by the dielectric 105.

The dielectric 105 includes a sidewall 105S. The sidewall 105S of the dielectric 105 is exposed from a side of the semiconductor package structure 80. The sidewall 105S of the dielectric 105 aligns with a sidewall 100S of the substrate 100. The sidewall 105S of the dielectric 105 is coplanar with the sidewall 100S of the substrate 100.

FIG. 9A illustrates a cross-sectional view of the dotted box of the semiconductor package structure 80 according to some embodiments of the present disclosure. The semiconductor die 102 is disposed at the periphery of the substrate 100. The dielectric 105 is disposed at the periphery of the substrate 100. The dielectric 105 may slightly bleed out of the semiconductor package structure 80. The dielectric 105 includes an uneven upper surface. In some embodiments, one end of the dielectric 105 adjacent to the periphery of the substrate 100 may be slant with respect to the sidewall of the semiconductor die 102.

FIG. 9B illustrates a cross-sectional view of the dotted box of the semiconductor package structure 80 according to some embodiments of the present disclosure. The semiconductor die 102 is disposed at the periphery of the substrate 100. The dielectric 105 is disposed at the periphery of the substrate 100. The dielectric 105 does not bleed out of the semiconductor package structure 80. The dielectric 105 includes a planar upper surface.

FIG. 9C illustrates a cross-sectional view of the dotted box of the semiconductor package structure 80 according to some embodiments of the present disclosure. The semiconductor die 102 is disposed at the periphery of the substrate 100. The dielectric 105 is disposed at the periphery of the substrate 100. The dielectric 105 may bleed out of the semiconductor package structure 80. The dielectric 105 includes an uneven upper surface. In some embodiments, one end of the dielectric 105 adjacent to the periphery of the substrate 100 may partially expose the sidewall of the semiconductor die 102. Another end of the dielectric 105 adjacent to the semiconductor die 101 may have a recess with respect to the semiconductor die 102.

Figure 10A:
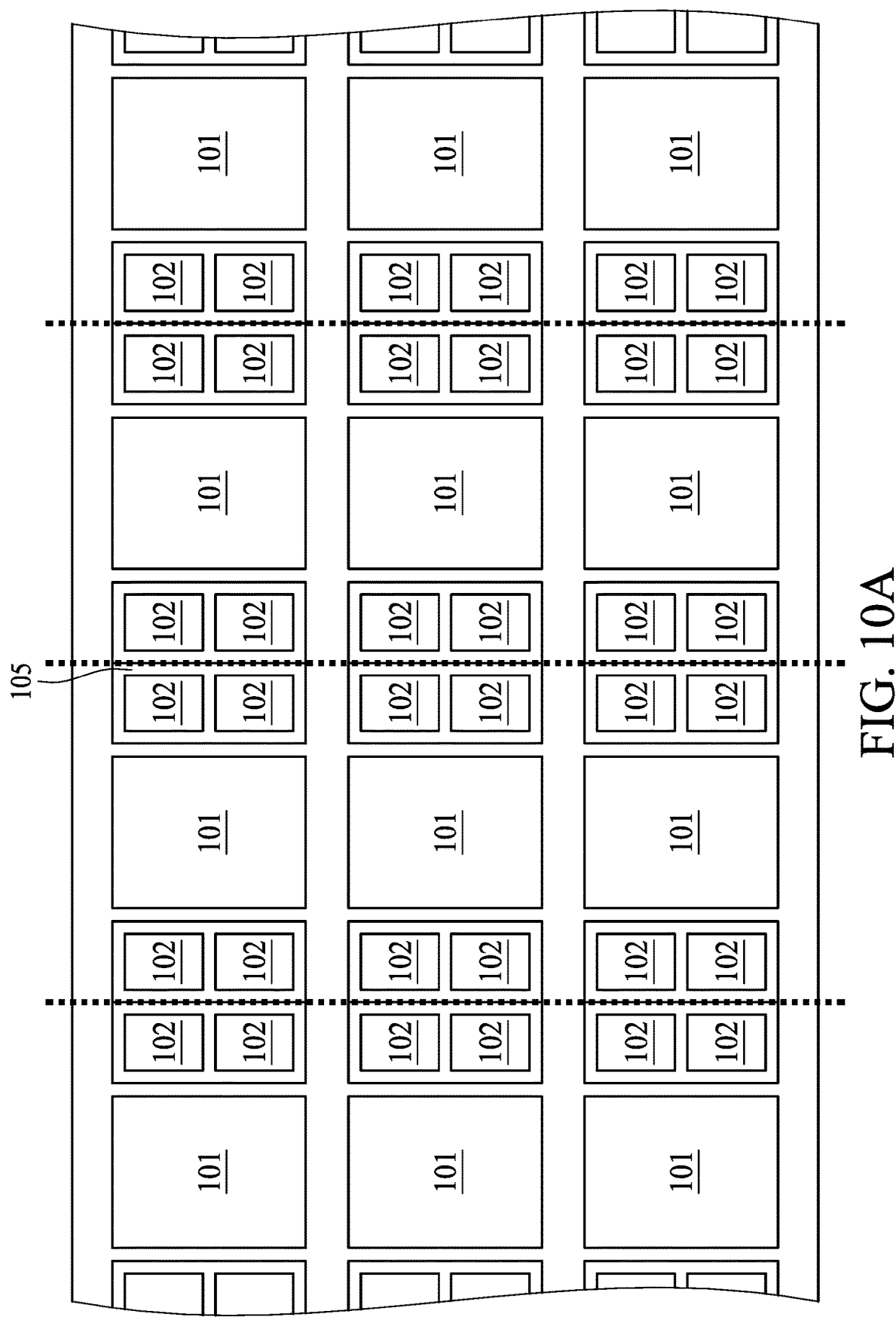
FIG. 10A illustrates a top view of semiconductor package structures in accordance with some embodiments of the present disclosure.

FIG. 10A illustrates a top view of semiconductor package structures in accordance with some embodiments of the present disclosure. The semiconductor die 102 is surrounded by the dielectric 105. The semiconductor die 101 is surrounded by four semiconductor dies 102. There is a singulation path (which is labelled by a dotted line) between the semiconductor dies 102.

Figure 10B:
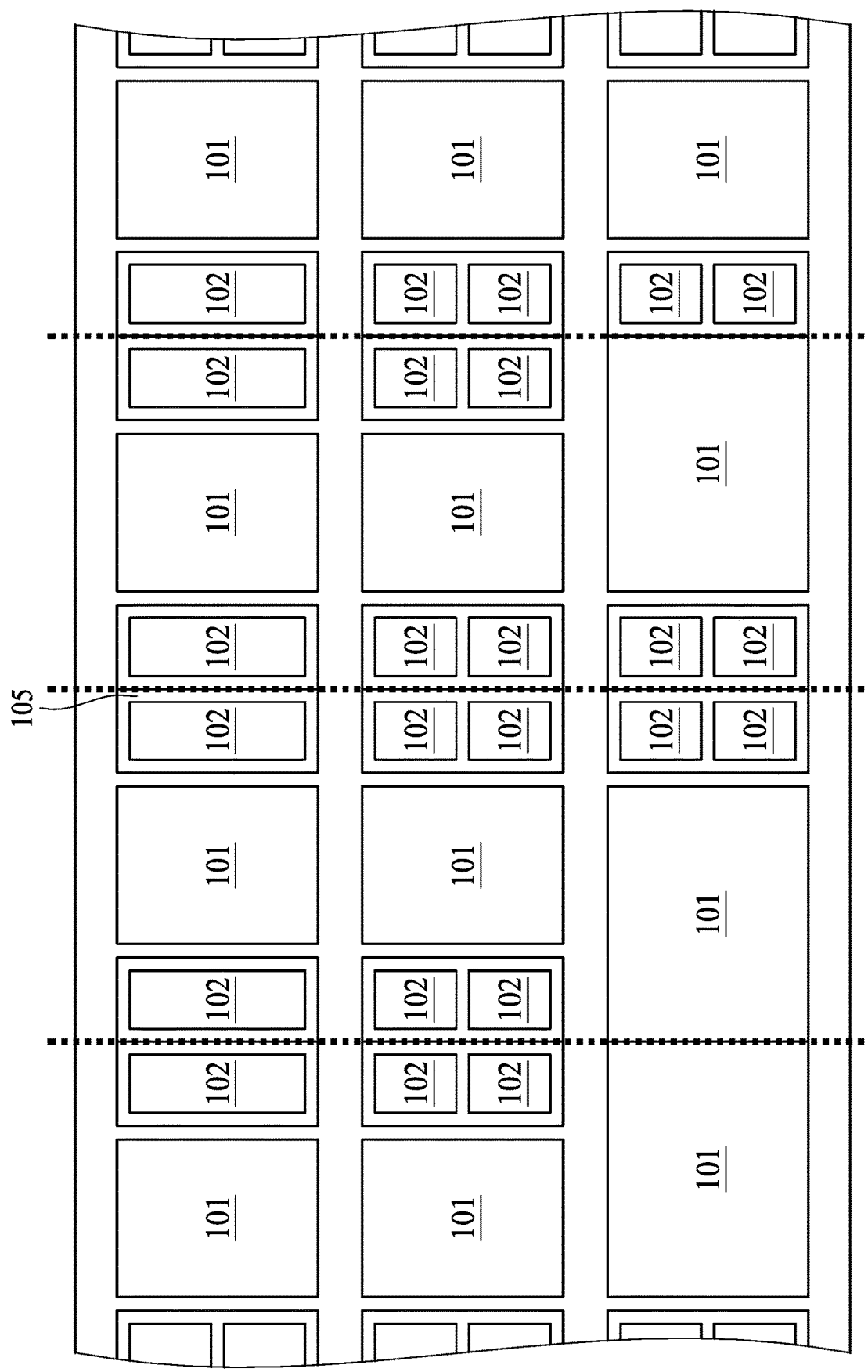
FIG. 10B illustrates a top view of semiconductor package structures in accordance with some embodiments of the present disclosure.

FIG. 10B illustrates a top view of semiconductor package structures in accordance with some embodiments of the present disclosure. The semiconductor die 102 is surrounded by the dielectric 105. The semiconductor die 101 may be surrounded by two semiconductor dies 102. The semiconductor die 101 may be surrounded by four semiconductor dies 102. The semiconductor die 101 may be adjacent to two semiconductor dies 102 only. There is a singulation path (which is labelled by a dotted line) between the semiconductor dies 102.

Figure 11A:
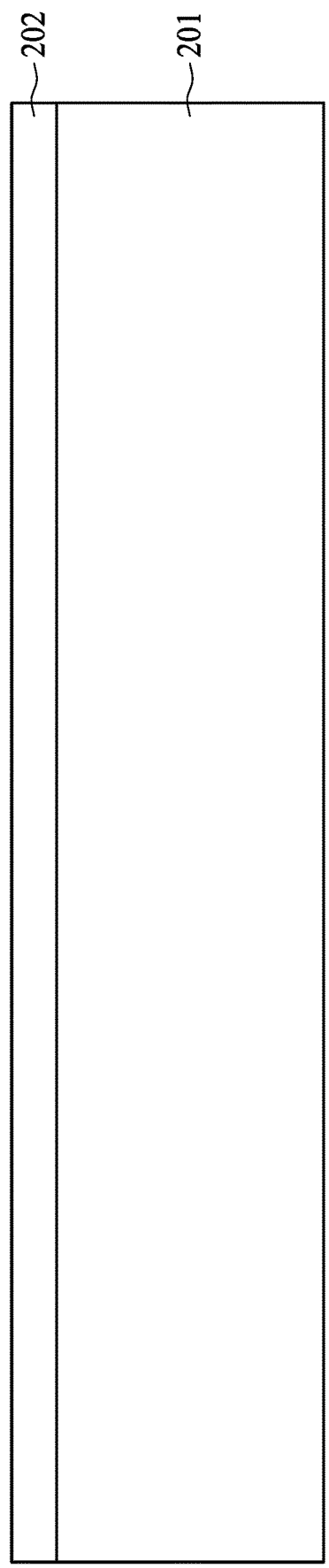
FIG. 11A, FIG. 11B, FIG. 11C, FIG. 11D, FIG. 11E, FIG. 11F, FIG. 11G, FIG. 11H, FIG. 11I, FIG. 11J, FIG. 11K, FIG. 11L, FIG. 11M, and FIG. 11N illustrate intermediate operations of a method for manufacturing a semiconductor package structure according to some embodiments of the present disclosure.
Figure 11B:
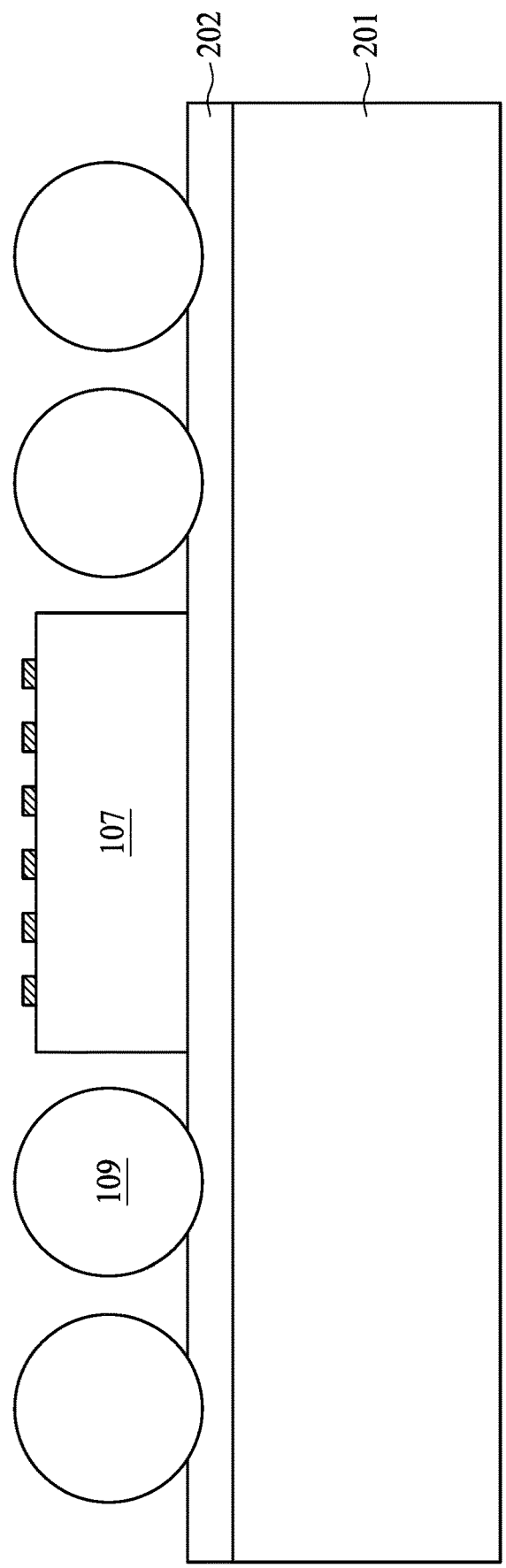
Figure 11C:
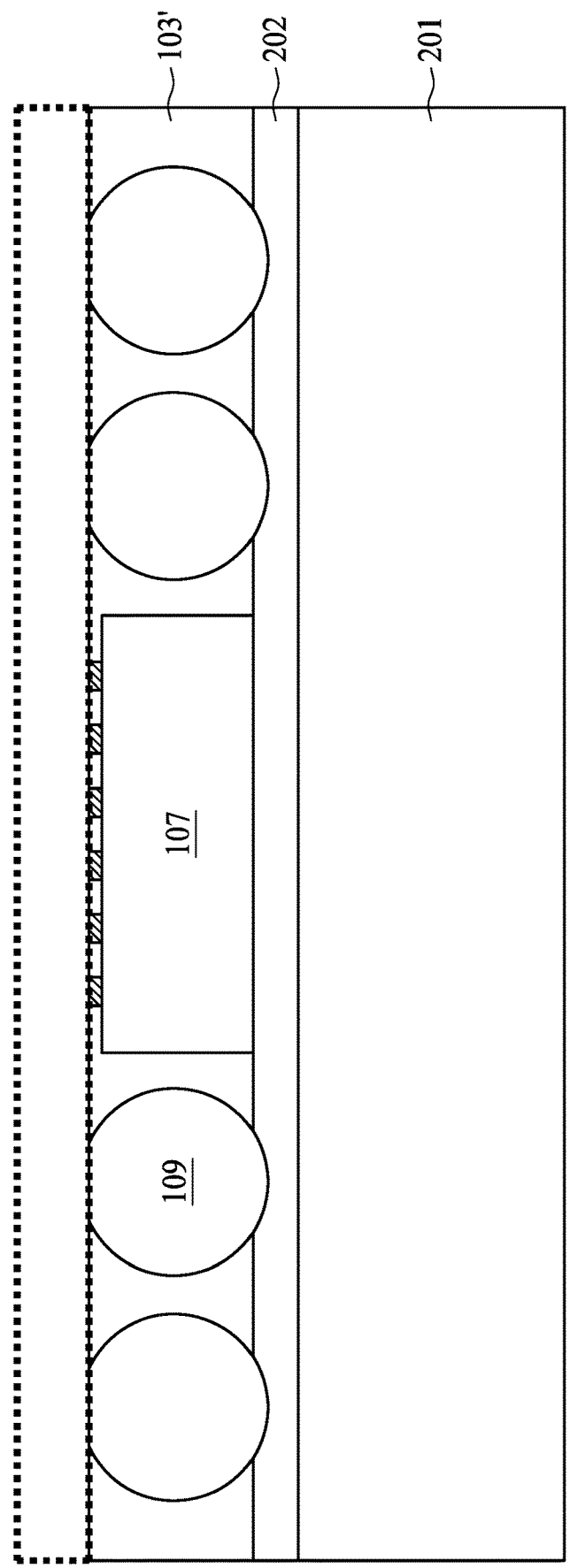
Figure 11D:
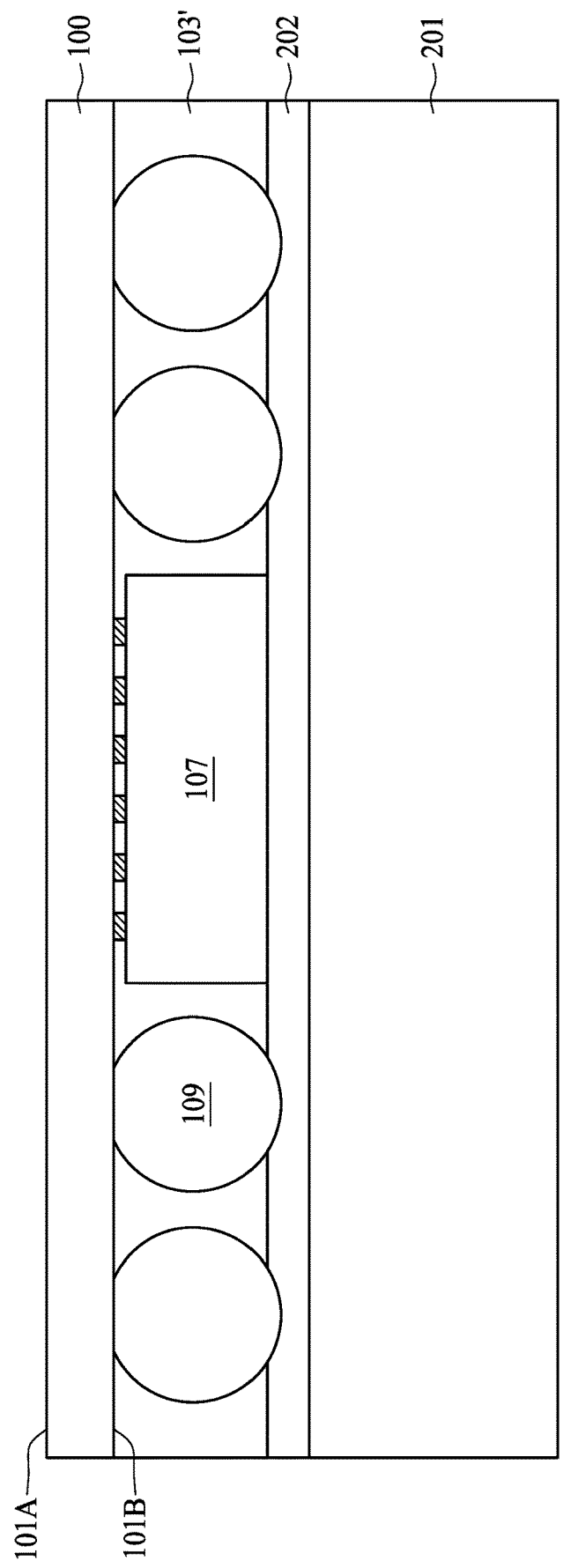
Figure 11E:
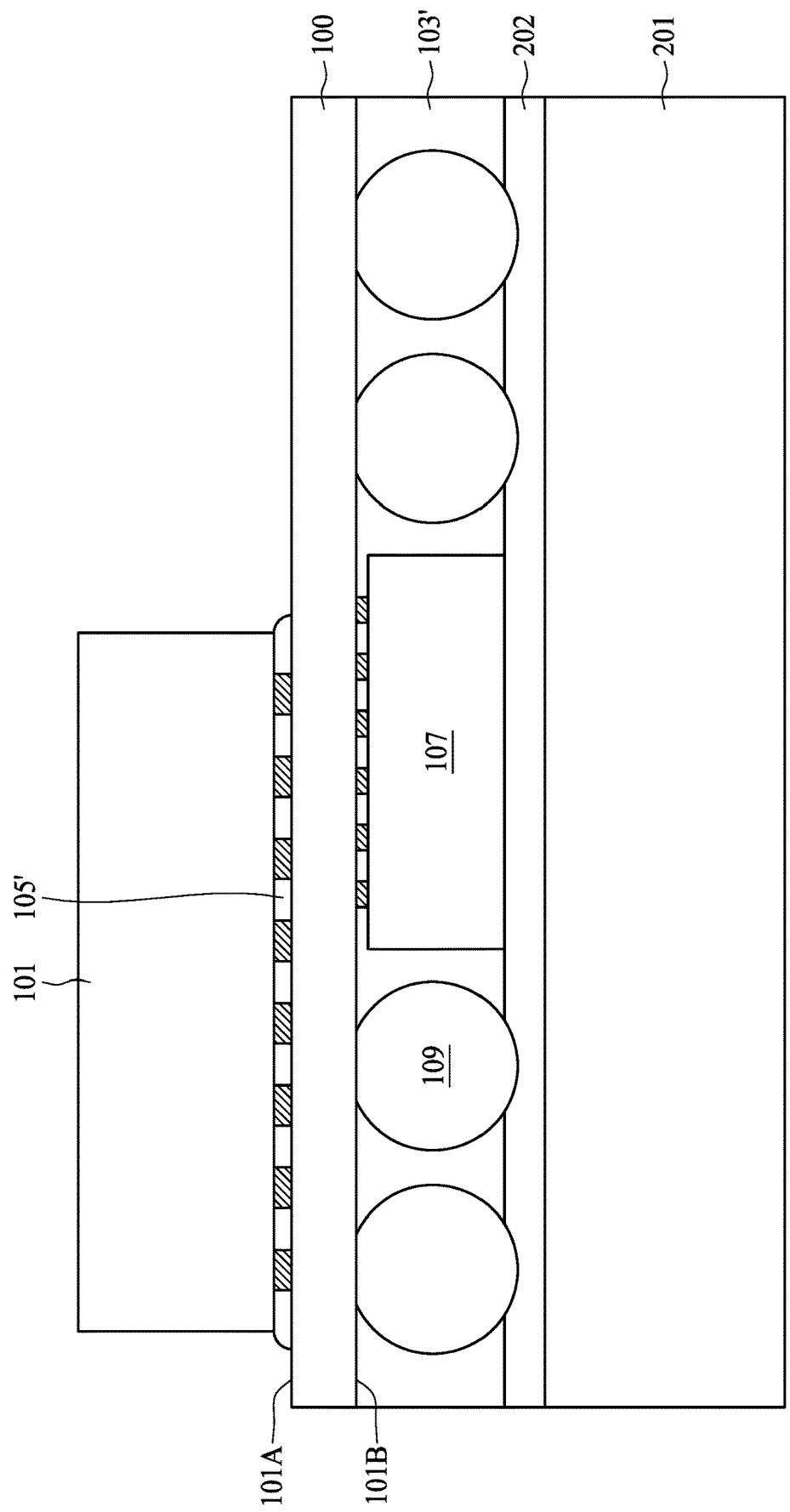
Figure 11F:
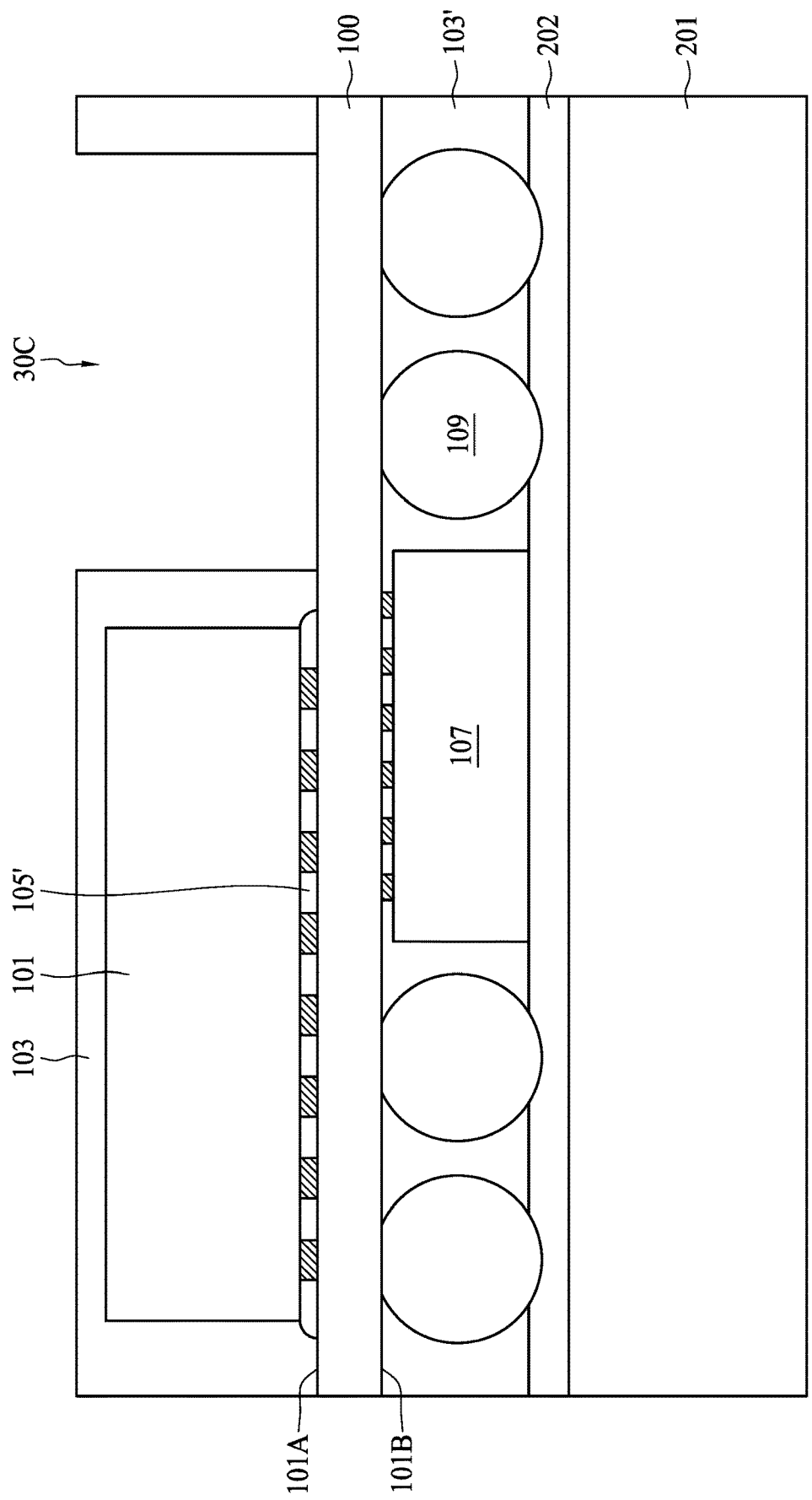
Figure 11G:
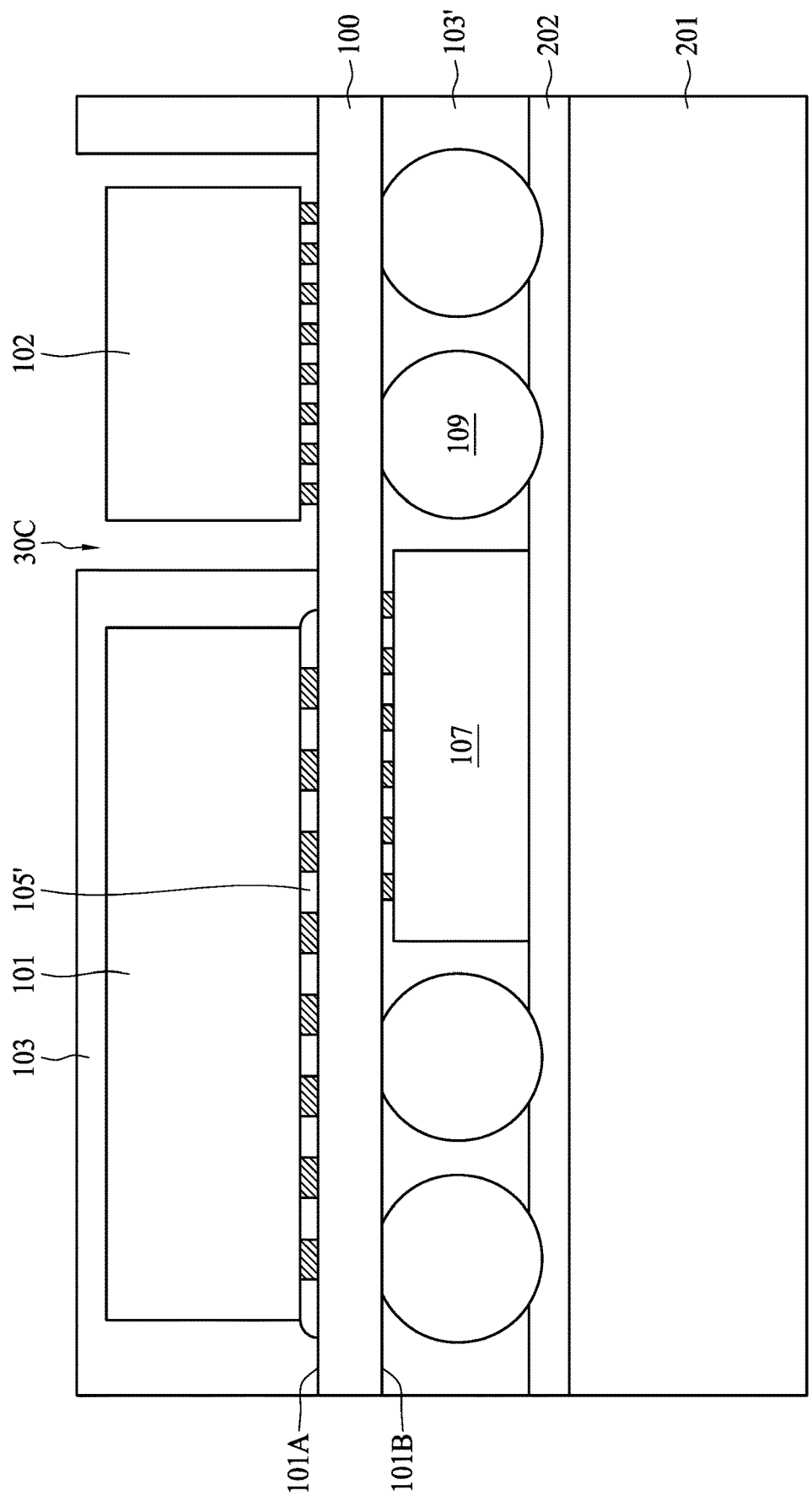
Figure 11H:
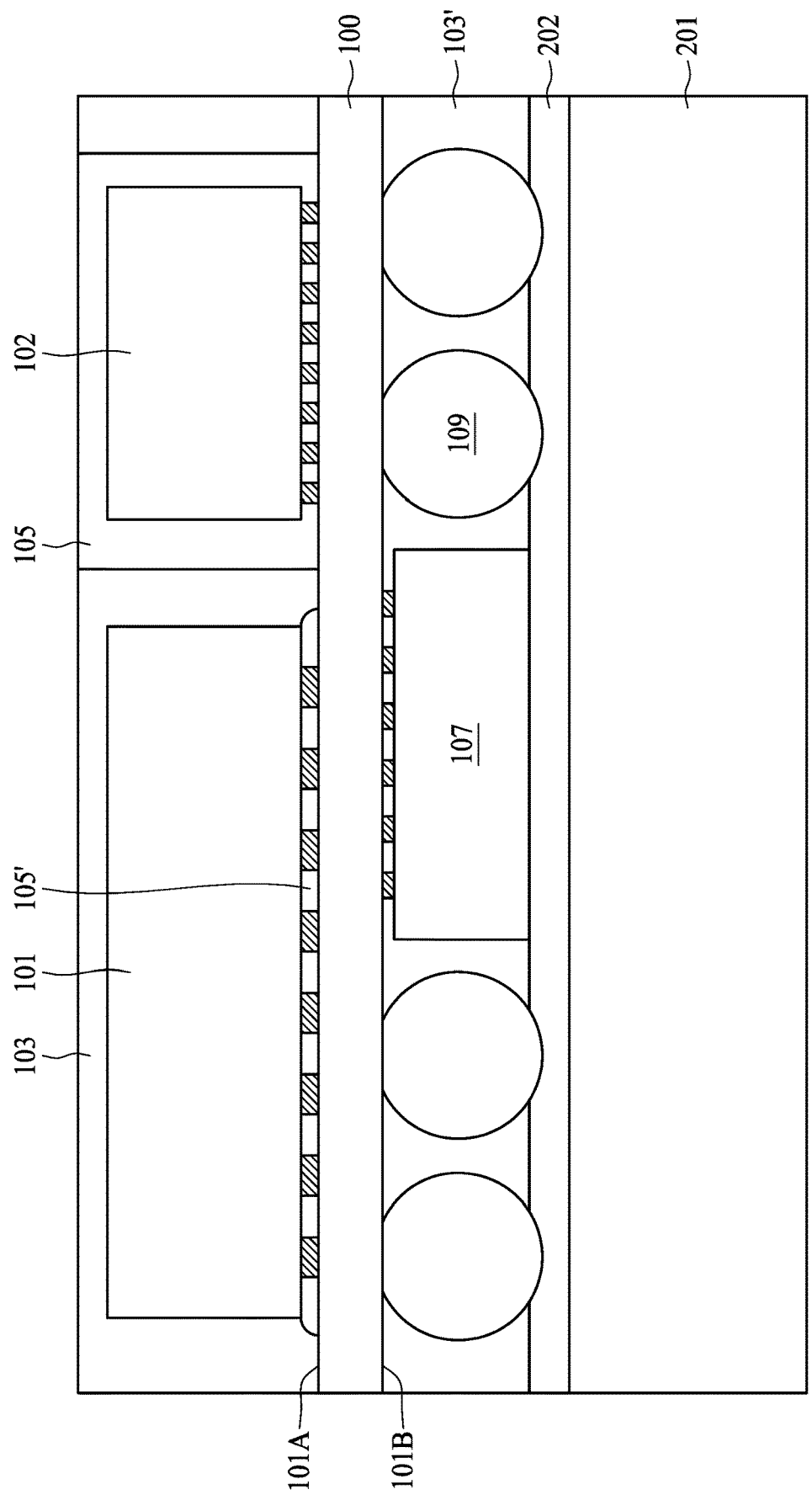
Figure 11I:
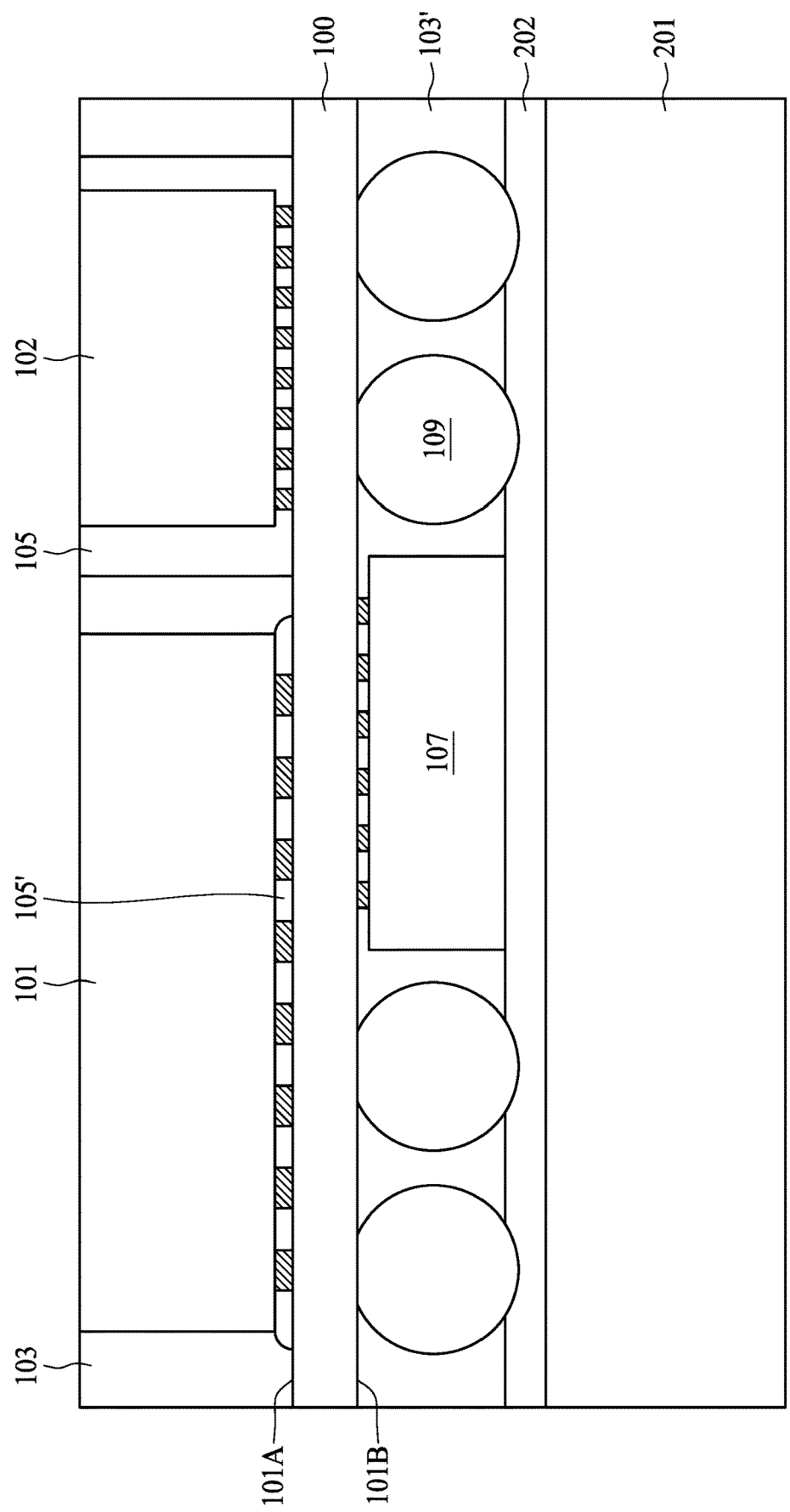
Figure 11J:
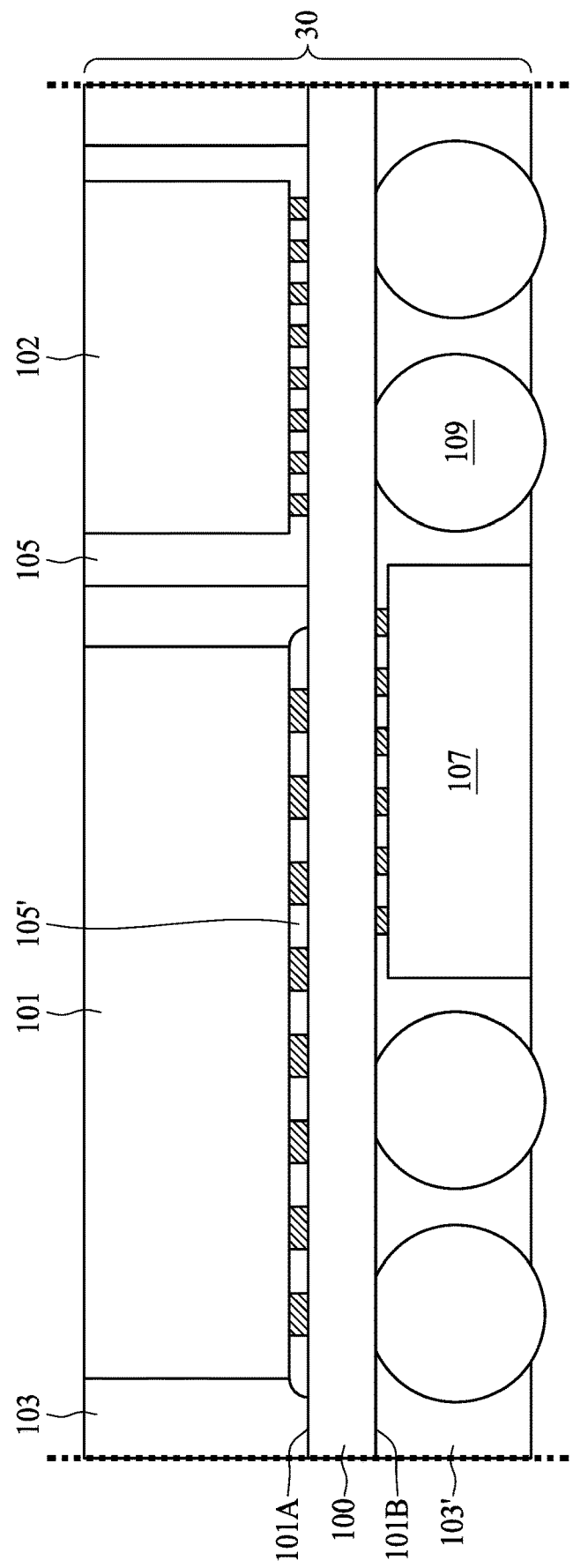
Figure 11K:
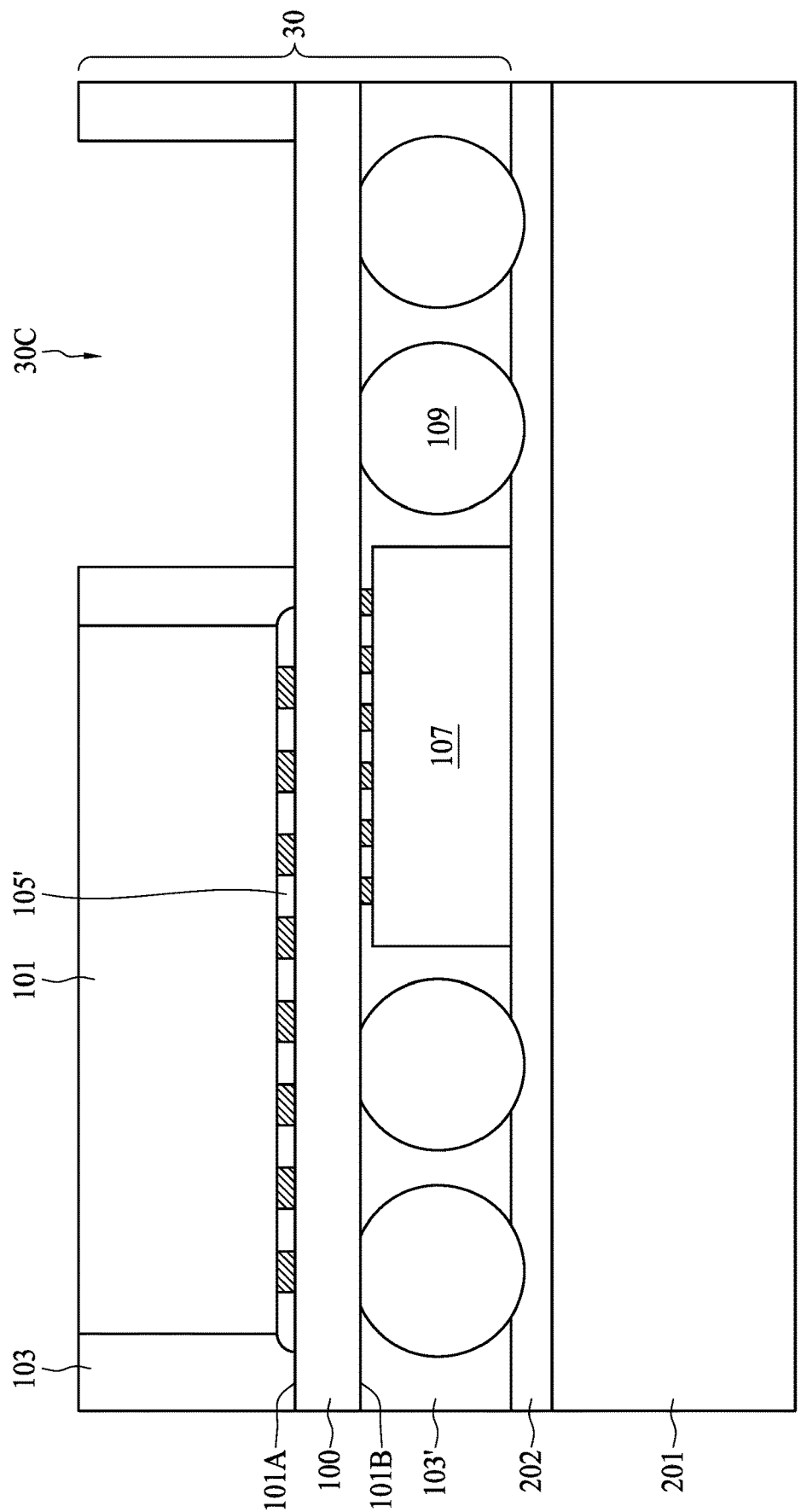
Figure 11L:
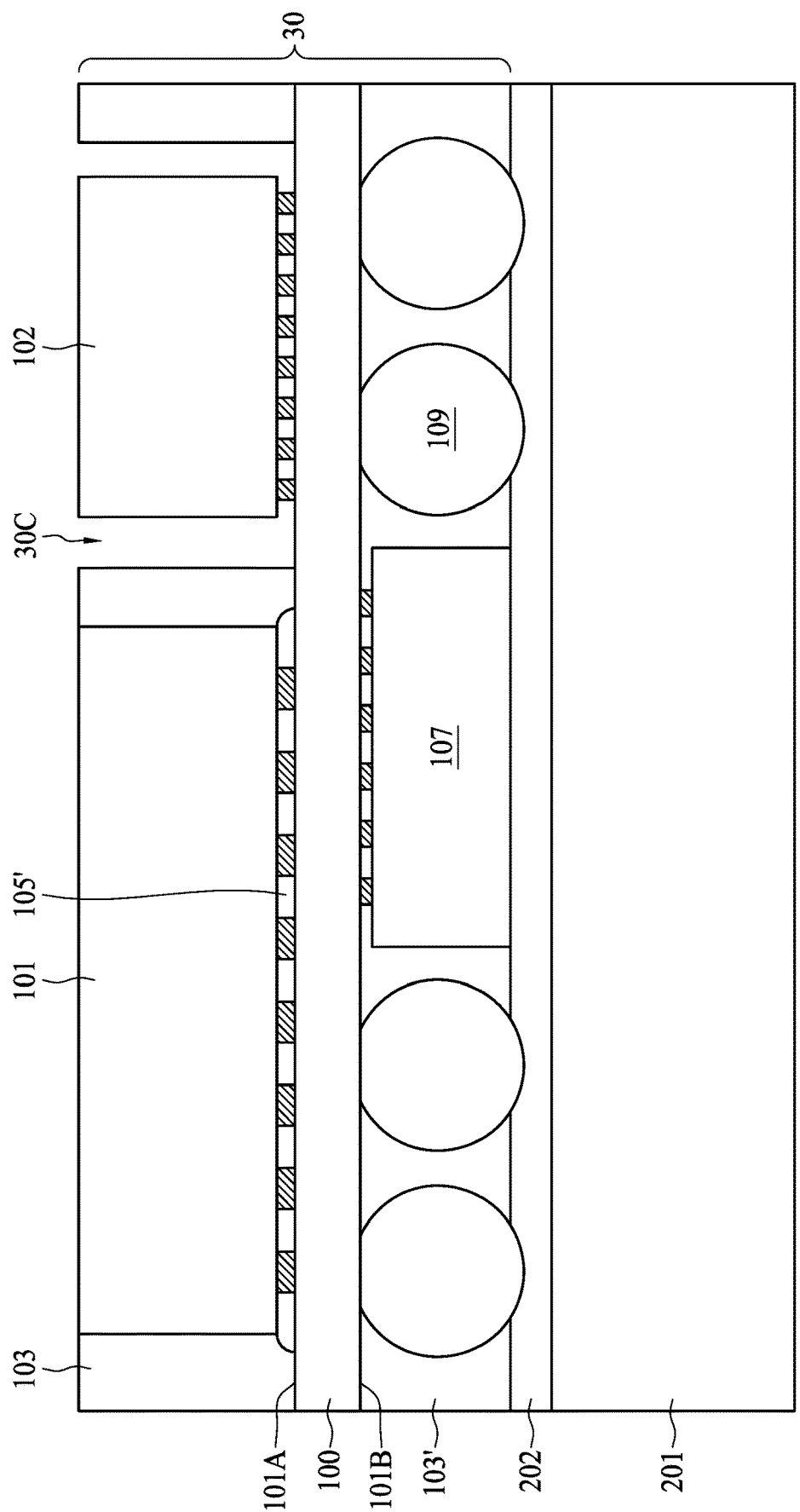
Figure 11M:
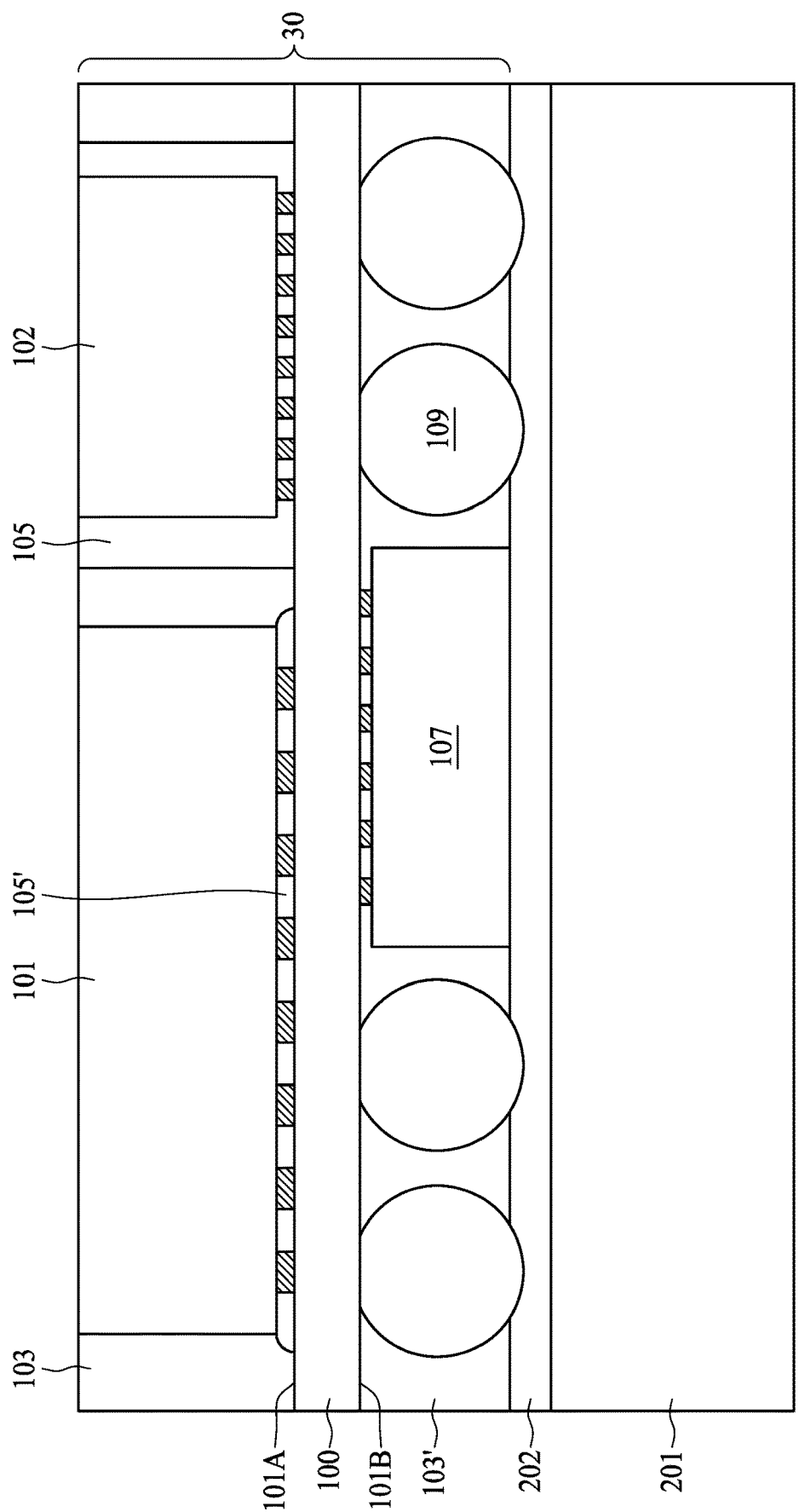
Figure 11N:
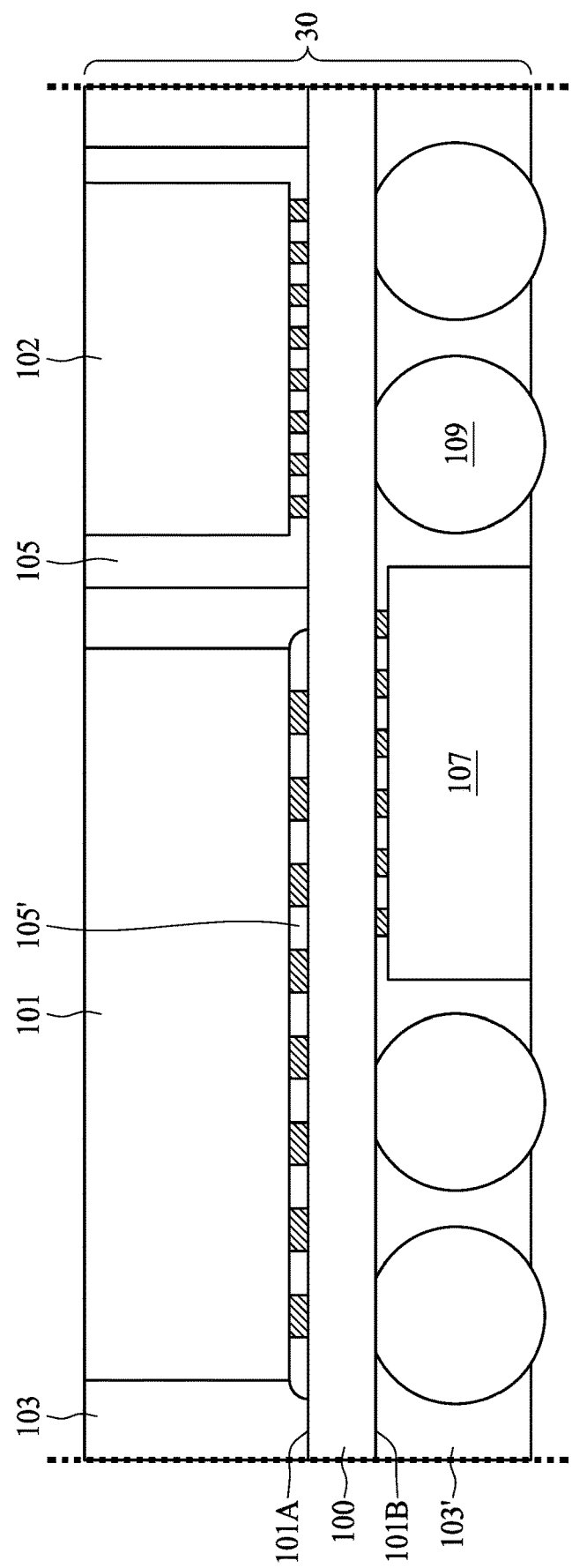

FIG. 11A through FIG. 11N illustrate some embodiments of a method of manufacturing a semiconductor package structure 30 according to some embodiments of the present disclosure. Various figures have been simplified to more clearly present aspects of the present disclosure.

Referring to FIG. 11A, the method for manufacturing the semiconductor package structure 30 includes providing a carrier 201. A release layer 202 is applied on the carrier 201.

Referring to FIG. 11B, a conductive terminal 109 is attached to the carrier 201. Subsequently, a semiconductor die 107 is attached to the carrier 201. The conductive terminal 109 is disposed at the periphery of the carrier 201. The semiconductor die 107 is disposed at the center of the carrier 201. The semiconductor die 107 and the conductive terminal 109 are disposed on the carrier 201 through the release layer 202. The semiconductor die 107 is surrounded by the conductive terminals 109. In some embodiments, the semiconductor die 107 may include an application-specific integrated circuit (ASIC), a controller, a processor, a MEMS device, a memory, or other electronic component or semiconductor device.

Referring to FIG. 11C, a dielectric 103' is disposed on the carrier 201. The dielectric 103' fully covers the semiconductor die 107 and the conductive terminal 109. Subsequently, a grinding operation is performed to expose the semiconductor die 107 and the conductive terminal 109. A conductive pad of the semiconductor die 107 is exposed by the grinded dielectric 103'. The conductive terminal 109 is partially exposed by the grinded dielectric 103'.

Referring to FIG. 11D, a substrate 100 is disposed on the grinded dielectric 103'. The substrate 100 has an upper surface 101A and a lower surface 101B opposite to the upper surface 101A. The semiconductor die 107 and the conductive terminal 109 are in contact with the lower surface 101B of the substrate 100. The semiconductor die 107 and the conductive terminal 109 are electrically connected to the substrate 100. In some embodiments, the substrate 100 may include a wafer-level RDL structure. The substrate 100 may include a circuit layer.

Referring to FIG. 11E, a semiconductor die 101 is disposed on the upper surface 101A of the substrate 100. A dielectric 105' is applied between the substrate 100 and the semiconductor die 101. In some embodiments, the semiconductor die 101 may include an application-specific integrated circuit (ASIC), a controller, a processor or other electronic component or semiconductor device. The dielectric 105' is an underfill.

Referring to FIG. 11F, a selective molding operation is performed. The selective molding operation may be carried out by an exposed molding fashion or an over molding fashion. For example, under the over molding fashion, a dielectric layer 103 is disposed on the upper surface 101A of the substrate 100. The dielectric layer 103 includes a cavity 30C to expose the upper surface 101A of the substrate 100.

A sidewall of the dielectric layer 103 that defines the cavity 30C may be substantially perpendicular to the upper surface 101A of the substrate 100. The sidewall of the dielectric layer 103 that defines the opening 30C may be slanted with respect to the upper surface 101A of the substrate 100, as illustrated and described in FIG. 3. The dielectric layer 103 encapsulates the semiconductor die 101. The dielectric layer 103 may be an encapsulant.

Referring to FIG. 11G, a semiconductor die 102 is disposed on the upper surface 101A of the substrate 100. The semiconductor die 102 is disposed in the cavity 30C. The semiconductor die 102 is adjacent to the semiconductor die 101. In some embodiments, the semiconductor die 102 may include a high bandwidth memory. The size of the semiconductor die 101 is greater than that of the semiconductor die 102. The type of the semiconductor die 101 is different from that of the semiconductor die 102.

Referring to FIG. 11H, a dielectric 105 is disposed on the upper surface 101A of the substrate 100 by a dispensing operation. The dielectric 105 fills the cavity 30C. The semiconductor die 102 is encapsulated by the dielectric 105. The dielectric 105 surrounds the conductive pad of the semiconductor die 102. In some embodiments, the dielectric 105 may be an underfill. The dielectric 105 includes a plurality of fillers 1050 (not shown). A back side of the semiconductor die 102 is covered by the dielectric 105. The dielectric 105 and the dielectric 103 include different materials. The underfill 105' and the dielectric 105 are composed of substantially identical materials.

Referring to FIG. 11I, a grinding operation is performed to expose backsides of the semiconductor dies 101 and 102. Under the over molding fashion, the aforesaid grinding operation may be omitted.

Referring to FIG. 11J, the carrier 201 and the release layer 202 are removed to expose the semiconductor die 107 and the conductive terminal 109. Subsequently, a dicing operation is performed to form the semiconductor package structure 30. In some embodiments, two adjacent package structure units may be diced through the filling material.

Referring to FIG. 11K, FIG. 11K follows the operation of FIG. 11E. The operation of FIG. 11K is similar to that of FIG. 11F except that the selective molding operation is carried out under an expose molding fashion. Operation in FIG. 11L can be referred to that of FIG. 11G.

Operation in FIG. 11M can be referred to that of FIG. 11H except that the filling operation is performed to expose the backside of the semiconductor die 102. Accordingly, a grinding operation may be omitted. Operation in FIG. 11N can be referred to that of FIG. 11J.

FIG. 12A through FIG. 12L illustrate some embodiments of a method of manufacturing a semiconductor package structure 60" according to some embodiments of the present disclosure. Various figures have been simplified to more clearly present aspects of the present disclosure.

Figure 12A:
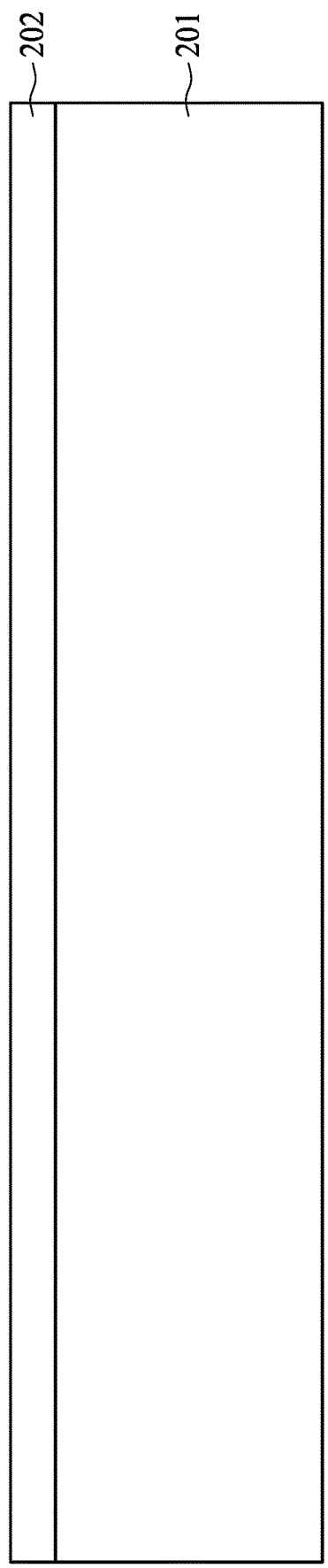
FIG. 12A, FIG. 12B, FIG. 12C, FIG. 12D, FIG. 12E, FIG. 12F, FIG. 12G, FIG. 12H, FIG. 12I, FIG. 12J, FIG. 12K, and FIG. 12L illustrate intermediate operations of a method for manufacturing a semiconductor package structure according to some embodiments of the present disclosure.

Referring to FIG. 12A, the method for manufacturing the semiconductor package structure 60" includes providing a carrier 201. A release layer 202 is applied on the carrier 201.

Figure 12B:
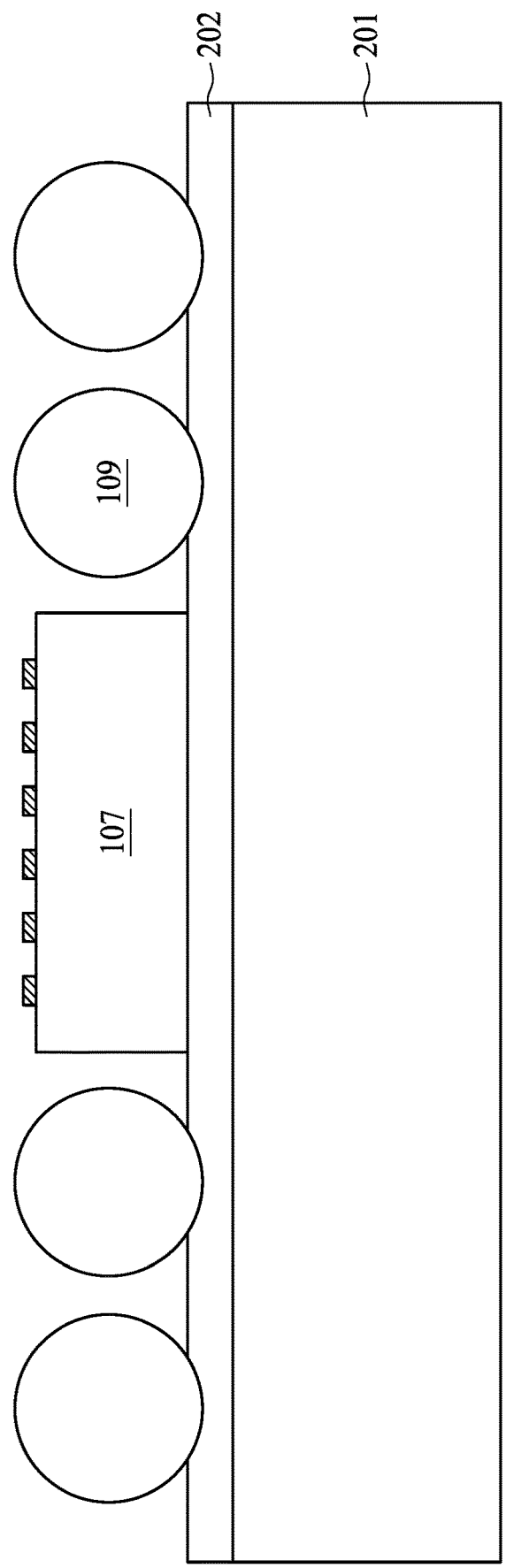

Referring to FIG. 12B, a conductive terminal 109 is attached to the carrier 201. Subsequently, a semiconductor die 107 is attached to the carrier 201. The conductive terminal 109 is disposed at the periphery of the carrier 201. The semiconductor die 107 is disposed at the center of the carrier 201. The semiconductor die 107 and the conductive terminal 109 are disposed on the carrier 201 through the release layer 202. The semiconductor die 107 is surrounded by the conductive terminals 109. In some embodiments, the semiconductor die 107 may include an application-specific integrated circuit (ASIC), a controller, a processor, a MEMS device, a memory, or other electronic component or semiconductor device.

Figure 12C:
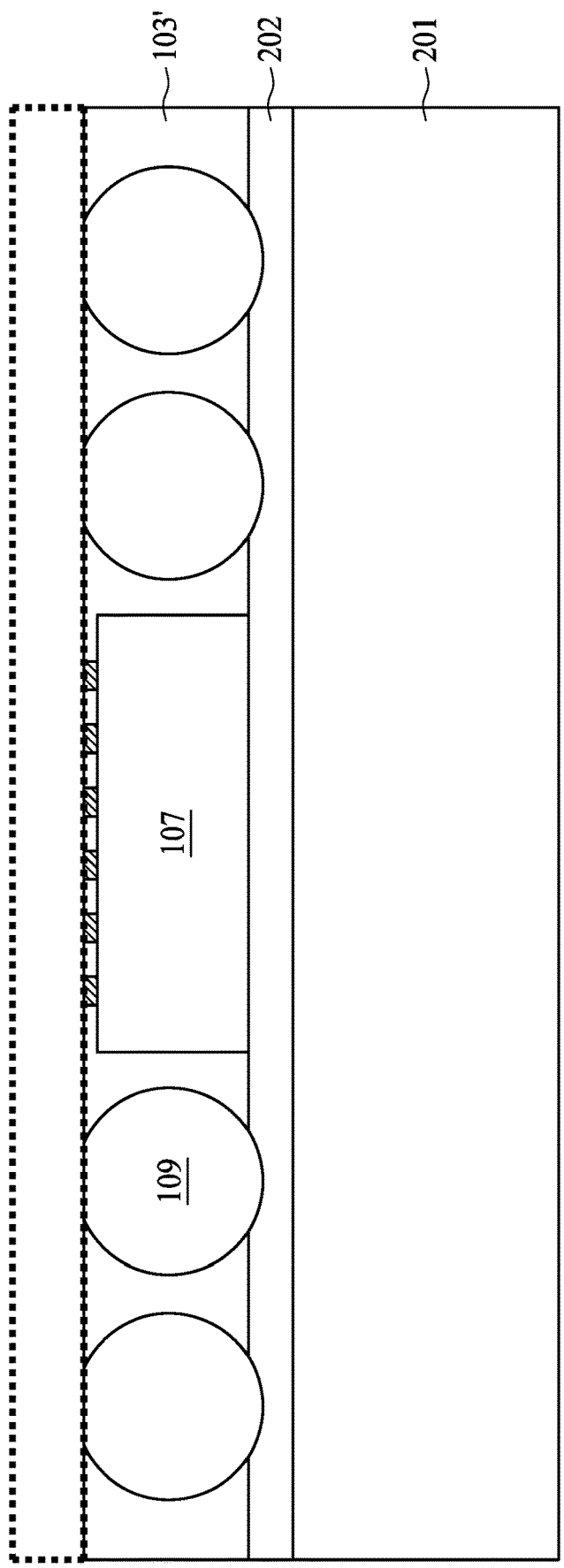

Referring to FIG. 12C, a dielectric 103' is disposed on the carrier 201. The dielectric 103' fully covers the semiconductor die 107 and the conductive terminal 109. Subsequently, a grinding operation is performed to expose the semiconductor die 107 and the conductive terminal 109. A conductive pad of the semiconductor die 107 is exposed by the grinded dielectric 103'. The conductive terminal 109 is partially exposed by the grinded dielectric 103'.

Figure 12D:
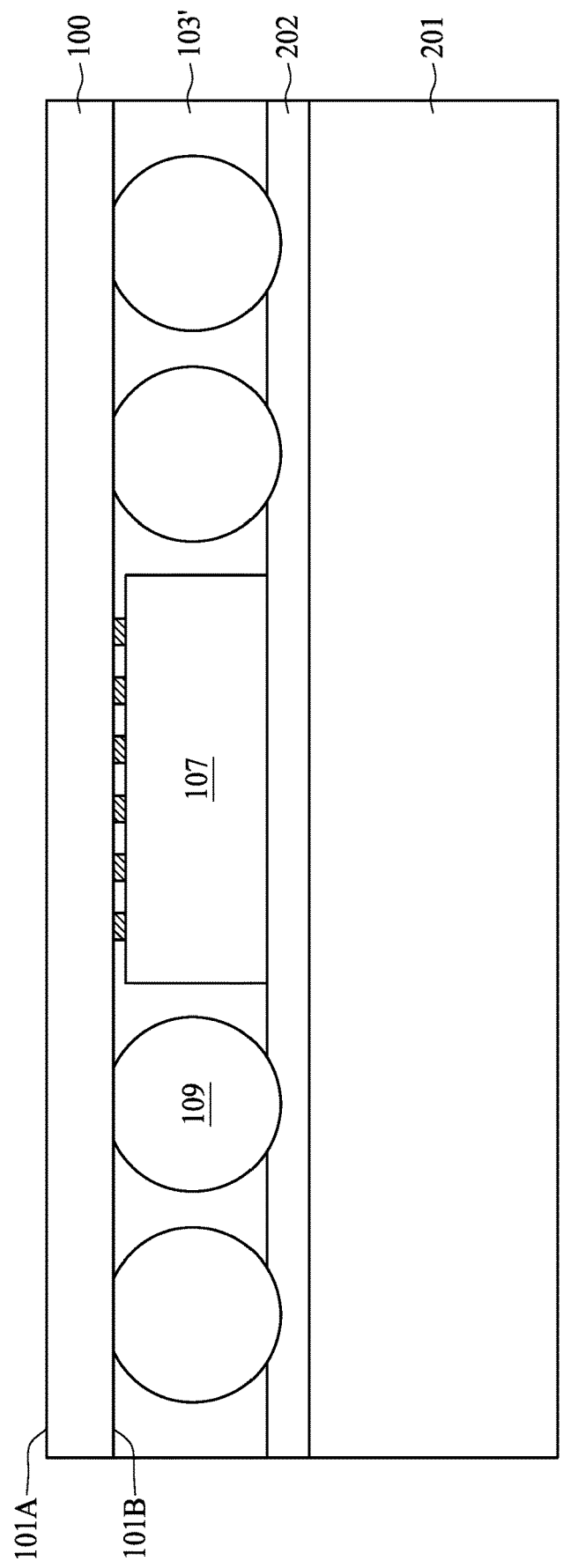

Referring to FIG. 12D, a substrate 100 is disposed on the grinded dielectric 103'. The substrate 100 has an upper surface 101A and a lower surface 101B opposite to the upper surface 101A. The semiconductor die 107 and the conductive terminal 109 are in contact with the lower surface 101B of the substrate 100. The semiconductor die 107 and the conductive terminal 109 are electrically connected to the substrate 100. In some embodiments, the substrate 100 may include a wafer-level RDL structure. The substrate 100 may include a circuit layer.

Figure 12E:
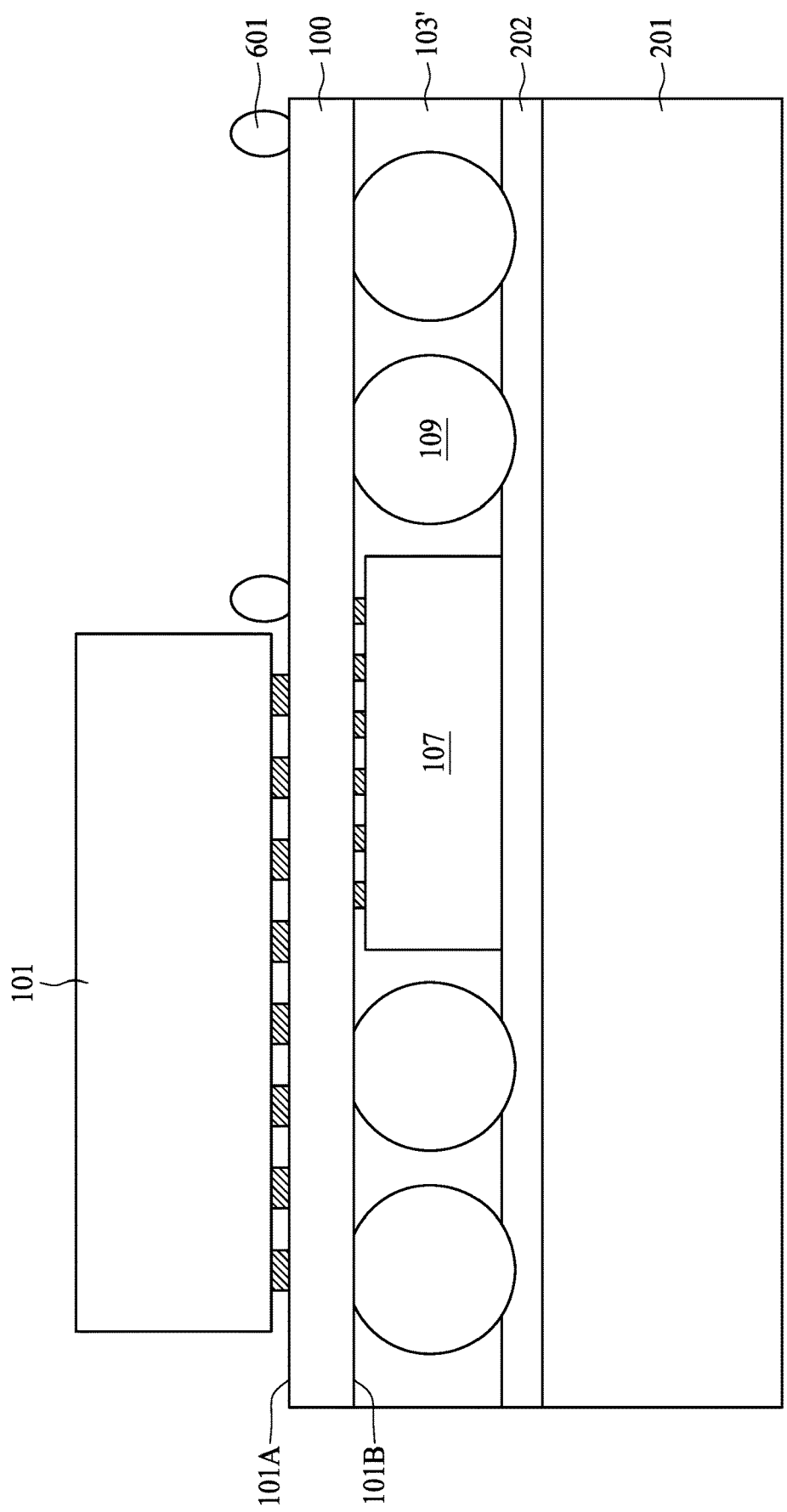

Referring to FIG. 12E, a semiconductor die 101 is disposed on the upper surface 101A of the substrate 100. Dam structure 601 is disposed on the upper surface 101A of the substrate 100. The dam structure 601 defines a specific region on the upper surface 101A of the substrate 100. In some embodiments, the semiconductor die 101 may include an application-specific integrated circuit (ASIC), a controller, a processor or other electronic component or semiconductor device.

Figure 12F:
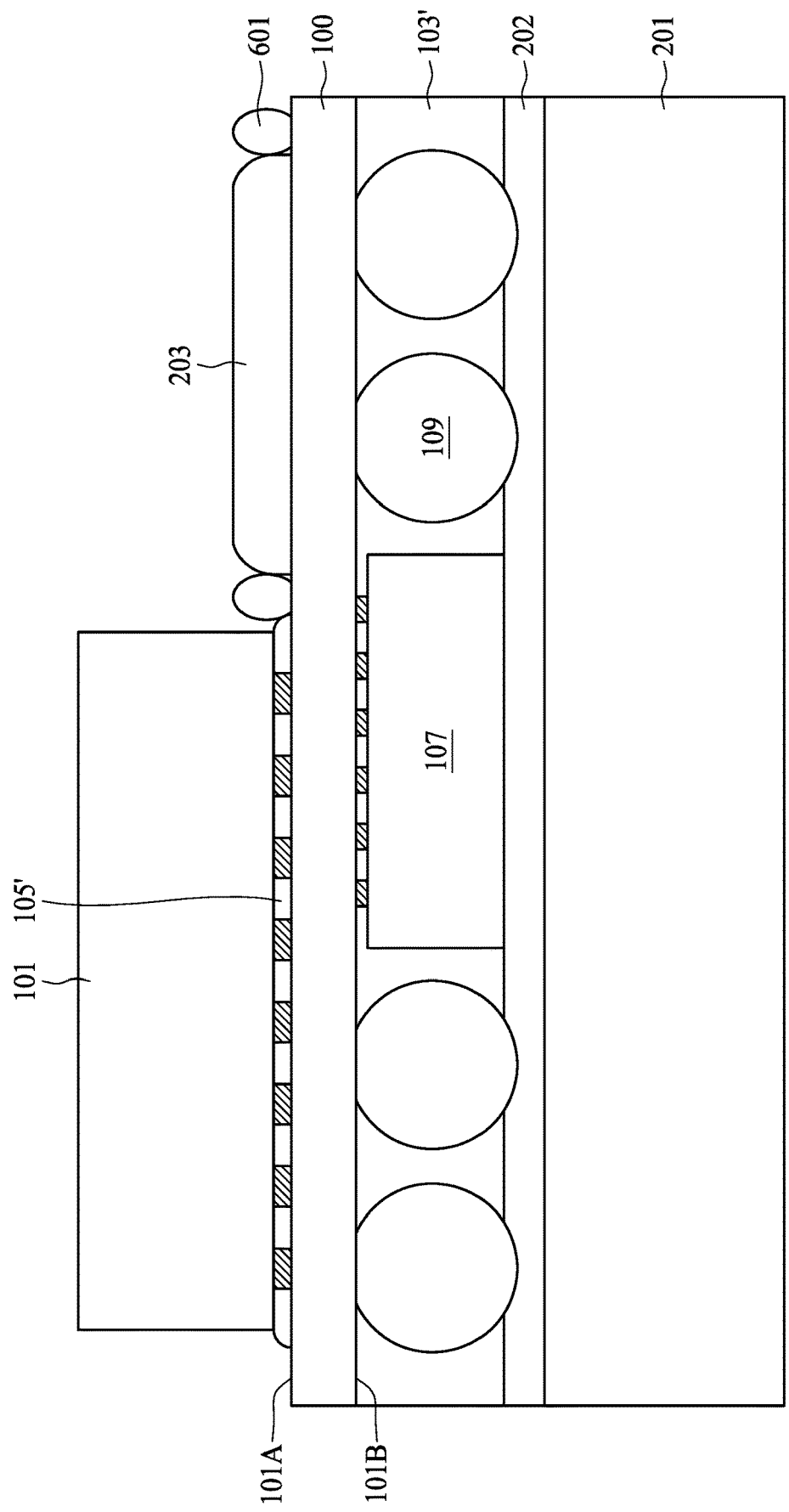

Referring to FIG. 12F, a dielectric 105' is applied between the substrate 100 and the semiconductor die 101. In some embodiments, the dielectric 105' is an underfill. A removable material 203 is applied on the specific region defined by the dam structure 601. In some embodiments, the removable material 203 may be an adhesive. In some embodiments, the removable material 203 is confined by the dam structure 601.

Figure 12G:
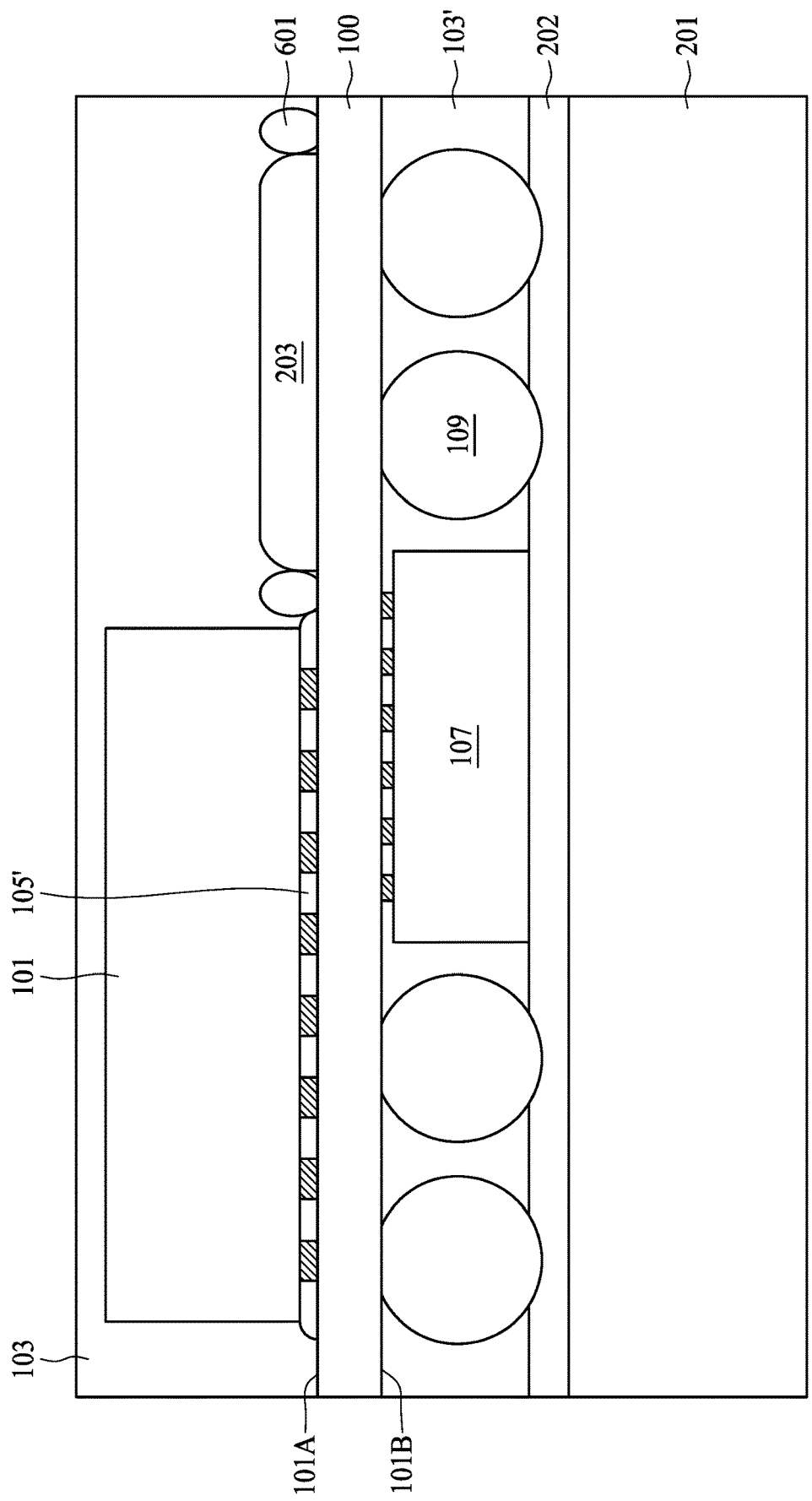

Referring to FIG. 12G, a dielectric 103 is disposed on the upper surface 101A of the substrate 100. The dielectric layer 103 covers the semiconductor die 101, the dam structure 601 and the removable material 203.

Figure 12H:
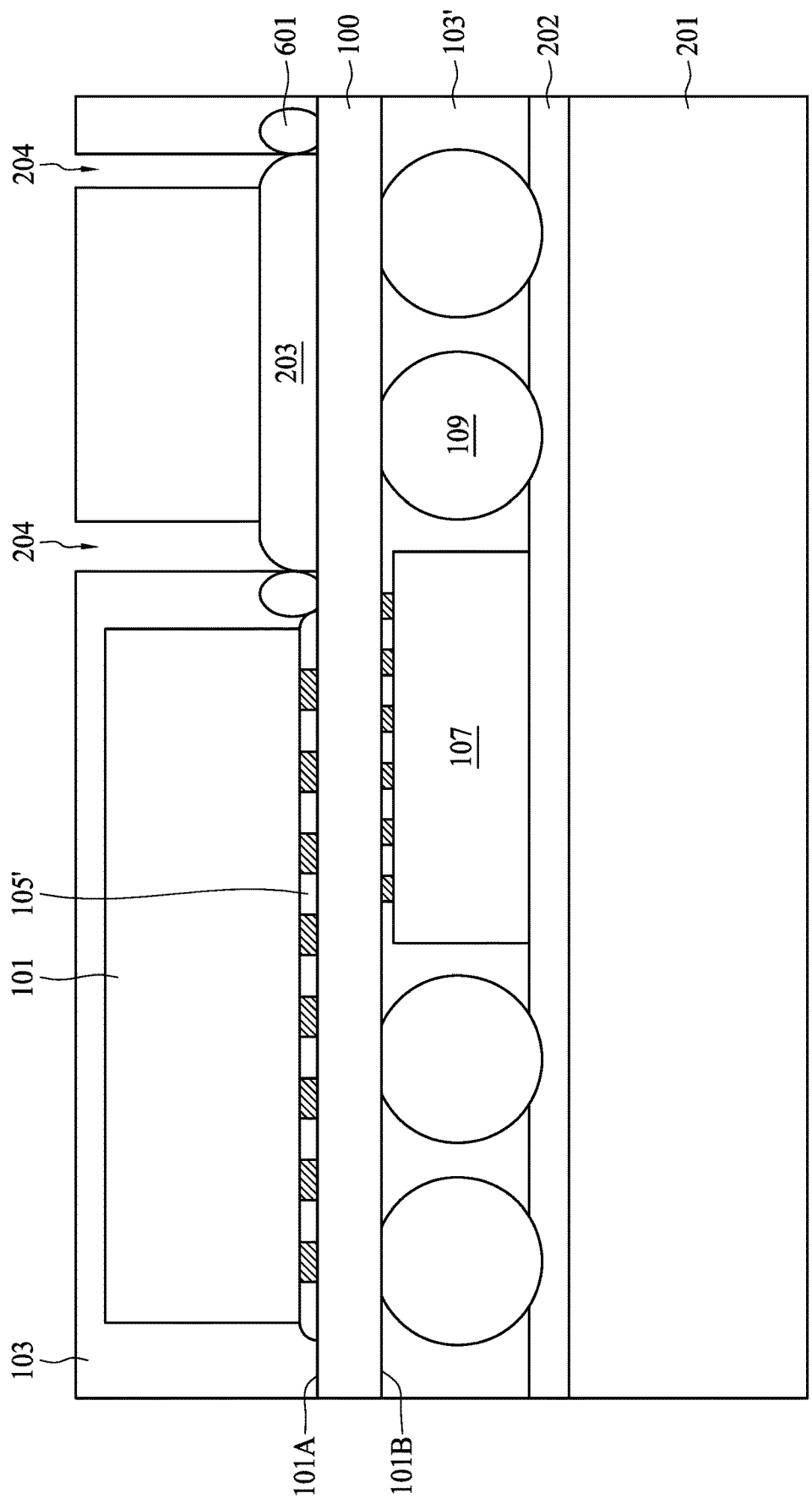

Referring to FIG. 12H, a laser drilling operation is performed to form an opening 204 partially exposing the removable material 203. A portion of the dielectric 103 is removed by the laser drilling operation. The remaining portion of the dielectric 103 is on the removable material 203.

Figure 12I:
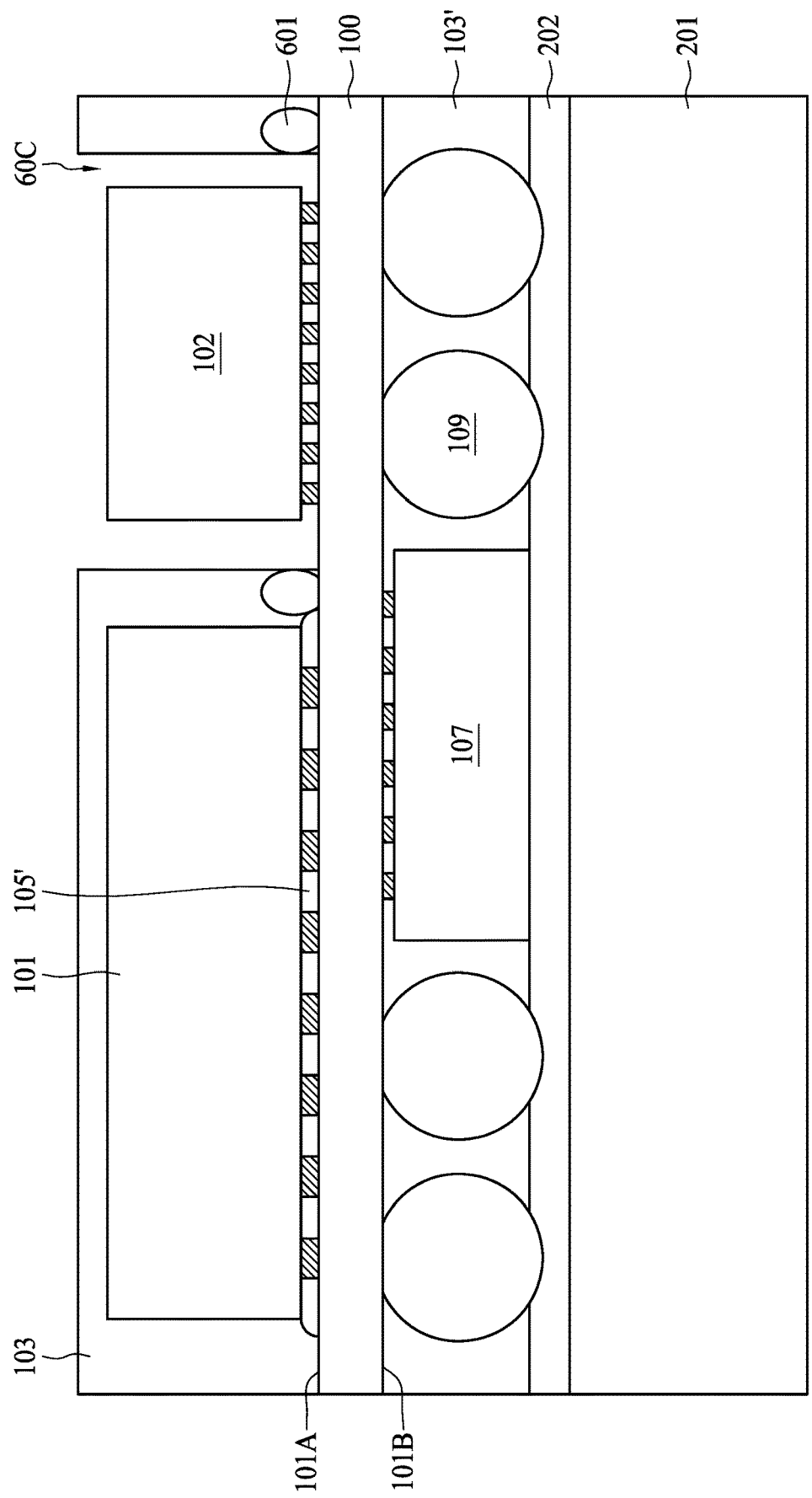

Referring to FIG. 12I, the removable material 203 is removed. The portion of the dielectric 103 disposed on the removable material 203 is removed concurrently in the same operation to form a cavity 60C. A semiconductor die 102 is then disposed on the upper surface 101A of the substrate 100. The semiconductor die 102 is disposed in the cavity 60C. The semiconductor die 102 is adjacent to the semiconductor die 101. The semiconductor die 102 is surrounded by the dam structure 601. In some embodiments, the semiconductor die 102 may include a high bandwidth memory. The size of the semiconductor die 101 is greater than that of the semiconductor die 102. The type of the semiconductor die 101 is different from that of the semiconductor die 102.

Figure 12J:
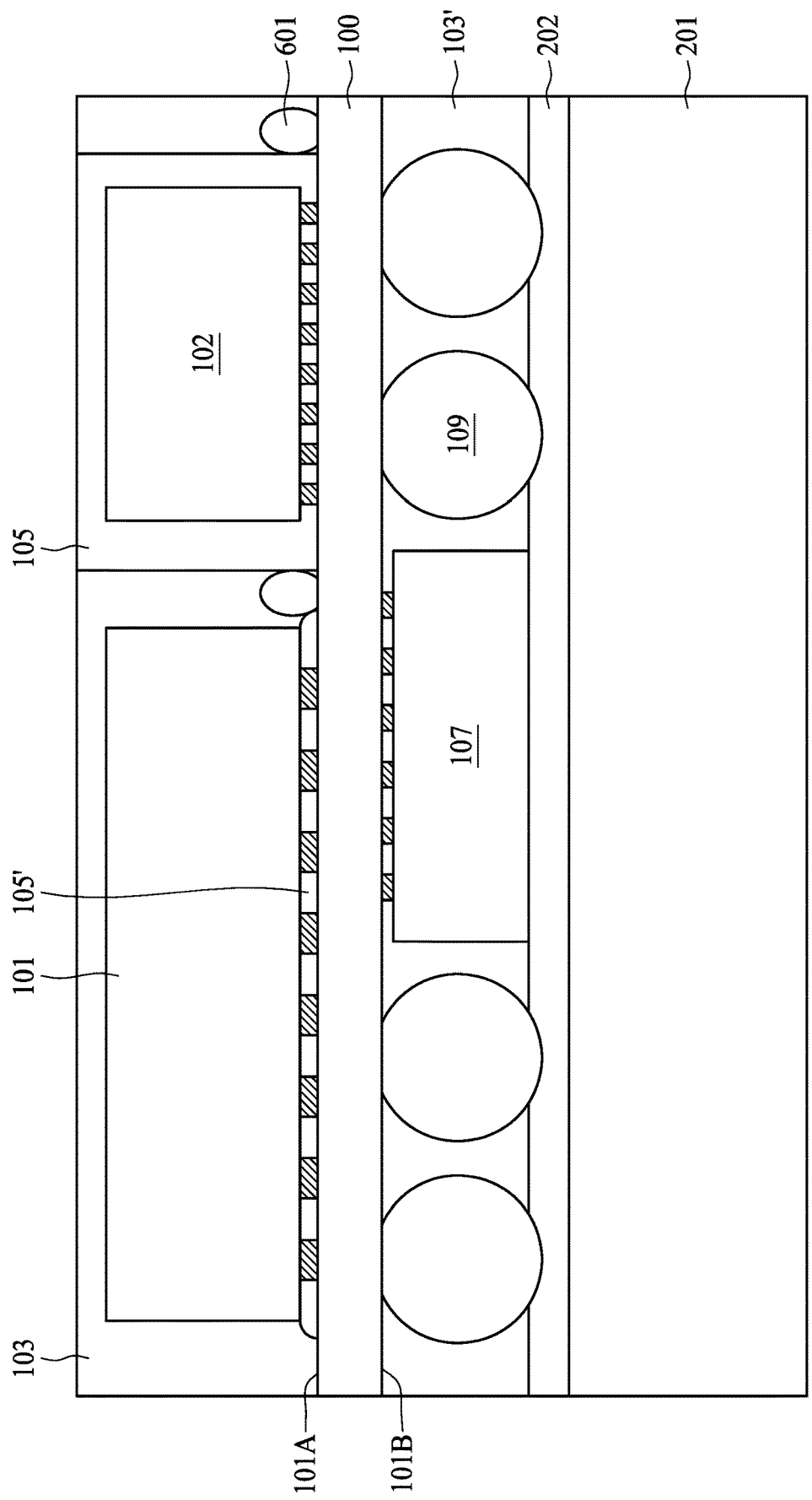

Referring to FIG. 12J, a dielectric 105 is disposed on the upper surface 101A of the substrate 100. The dielectric 105 fills the cavity 60C. The semiconductor die 102 is encapsulated by the dielectric 105. The dielectric 105 surrounds the conductive pad of the semiconductor die 102. In some embodiments, the dielectric 105 may be an underfill. The dielectric 105 includes a plurality of fillers 1050 (shown in FIG. 1). A back side of the semiconductor die 102 is covered by the dielectric 105. The dielectric 105 and the dielectric 103 include different materials. The underfill 105' and the dielectric 105 are composed of substantially identical materials.

Figure 12K:
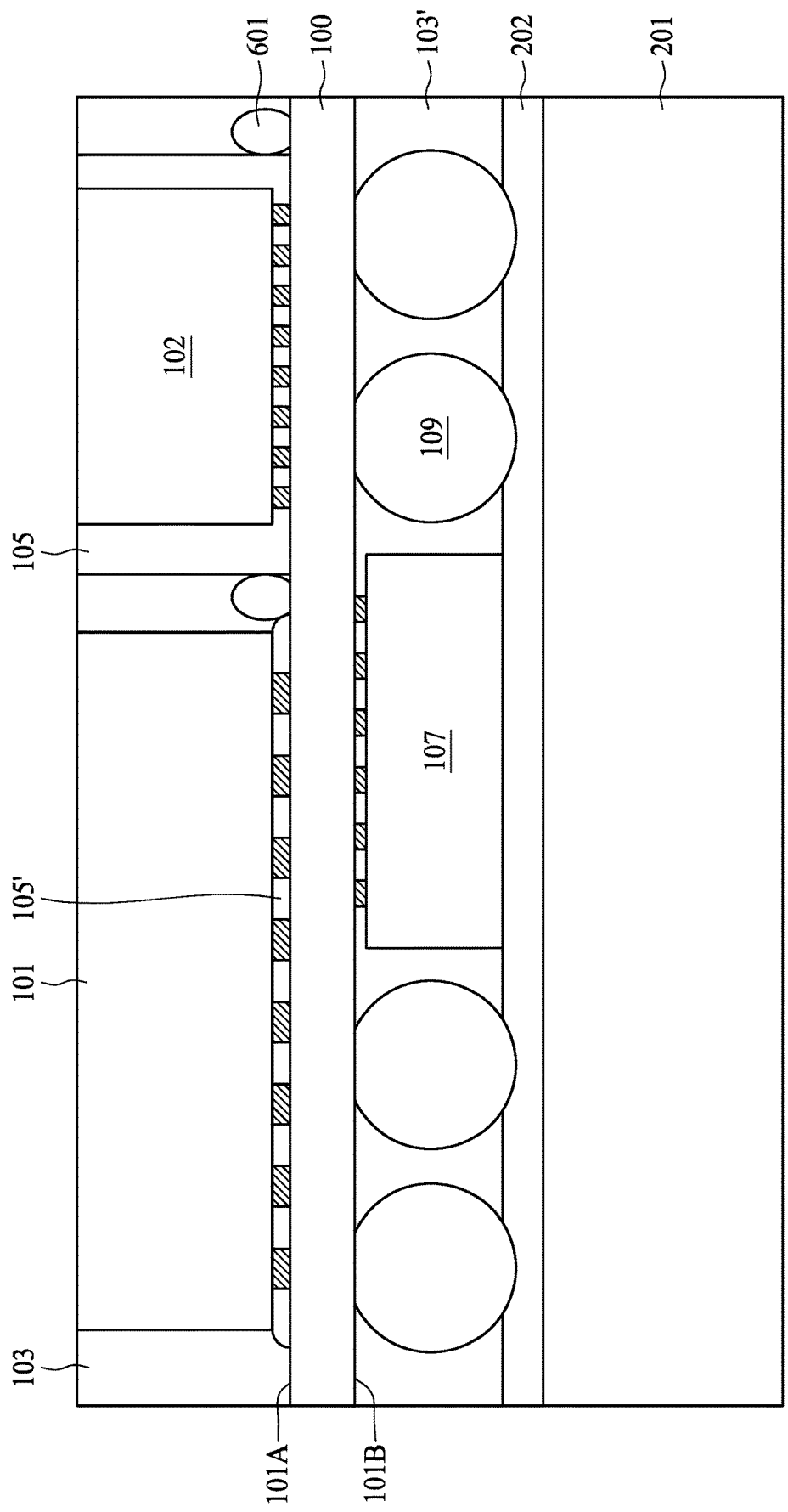

Referring to FIG. 12K, a grinding operation is performed to expose backsides of the semiconductor dies 101 and 102. Broken fillers 1030 (shown in FIG. 1) in the dielectric 103 and broken fillers 1050 (shown in FIG. 1) in the dielectric 105 may be observed at the top of the dielectric 103, 105 due to the grinding operation. Broken fillers 1030 in the dielectric 103 may be observed at a side surface facing the dielectric 105 since the cavity 60C is carved out from the dielectric 103 by a laser drilling operation and a removing operation.

Figure 12L:
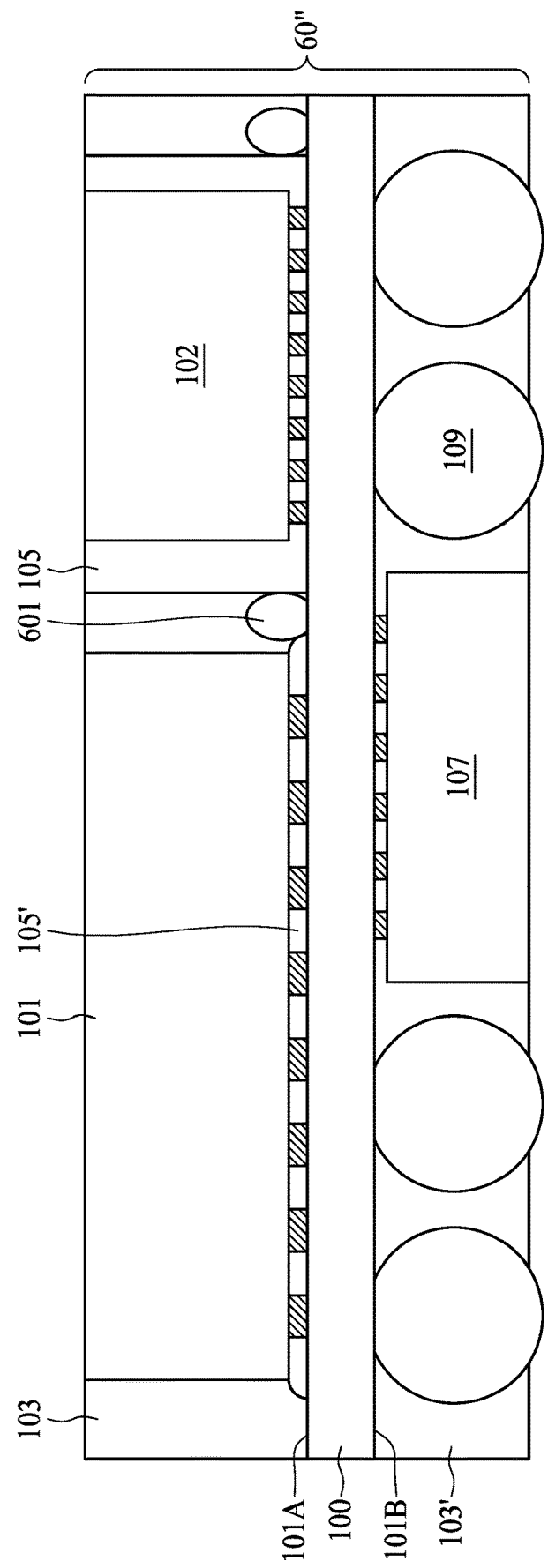

Referring to FIG. 12L, the carrier 201 and the release layer 202 are removed to expose the semiconductor die 107 and the conductive terminal 109. Subsequently, a dicing operation is performed to form the semiconductor package structure 60''.

FIG. 13A through FIG. 13L illustrate some embodiments of a method of manufacturing a semiconductor package structure 60''' according to some embodiments of the present disclosure. Various figures have been simplified to more clearly present aspects of the present disclosure.

Figure 13A:
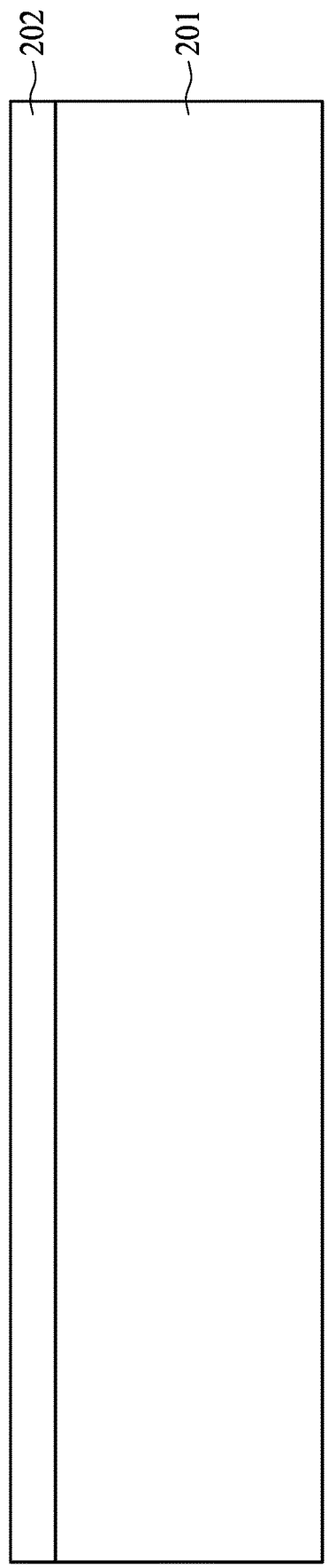
FIG. 13A, FIG. 13B, FIG. 13C, FIG. 13D, FIG. 13E, FIG. 13F, FIG. 13G, FIG. 13H, FIG. 13I, FIG. 13J, FIG. 13K, and FIG. 13L illustrate intermediate operations of a method for manufacturing a semiconductor package structure according to some embodiments of the present disclosure.

Referring to FIG. 13A, the method for manufacturing the semiconductor package structure 60''' includes providing a carrier 201. A release layer 202 is applied on the carrier 201.

Figure 13B:
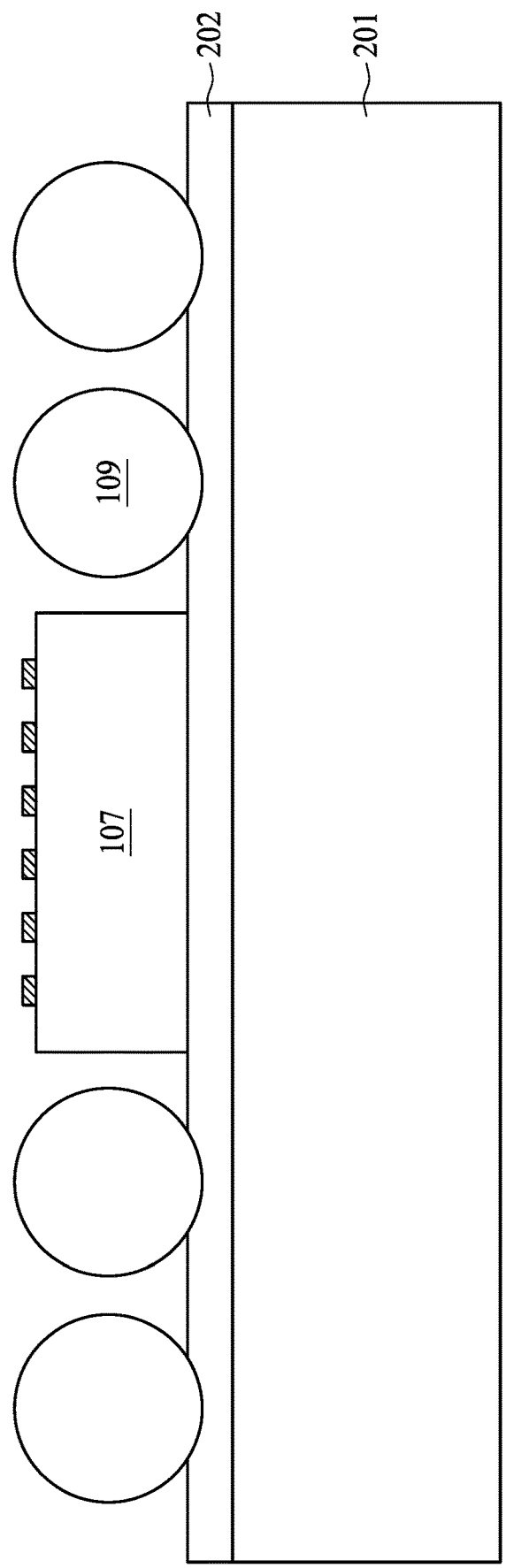

Referring to FIG. 13B, a conductive terminal 109 is attached to the carrier 201. Subsequently, a semiconductor die 107 is attached to the carrier 201. The conductive terminal 109 is disposed at the periphery of the carrier 201. The semiconductor die 107 is disposed at the center of the carrier 201. The semiconductor die 107 and the conductive terminal 109 are disposed on the carrier 201 through the release layer 202. The semiconductor die 107 is surrounded by the conductive terminals 109. In some embodiments, the semiconductor die 107 may include an application-specific integrated circuit (ASIC), a controller, a processor, a MEMS device, a memory, or other electronic component or semiconductor device.

Figure 13C:
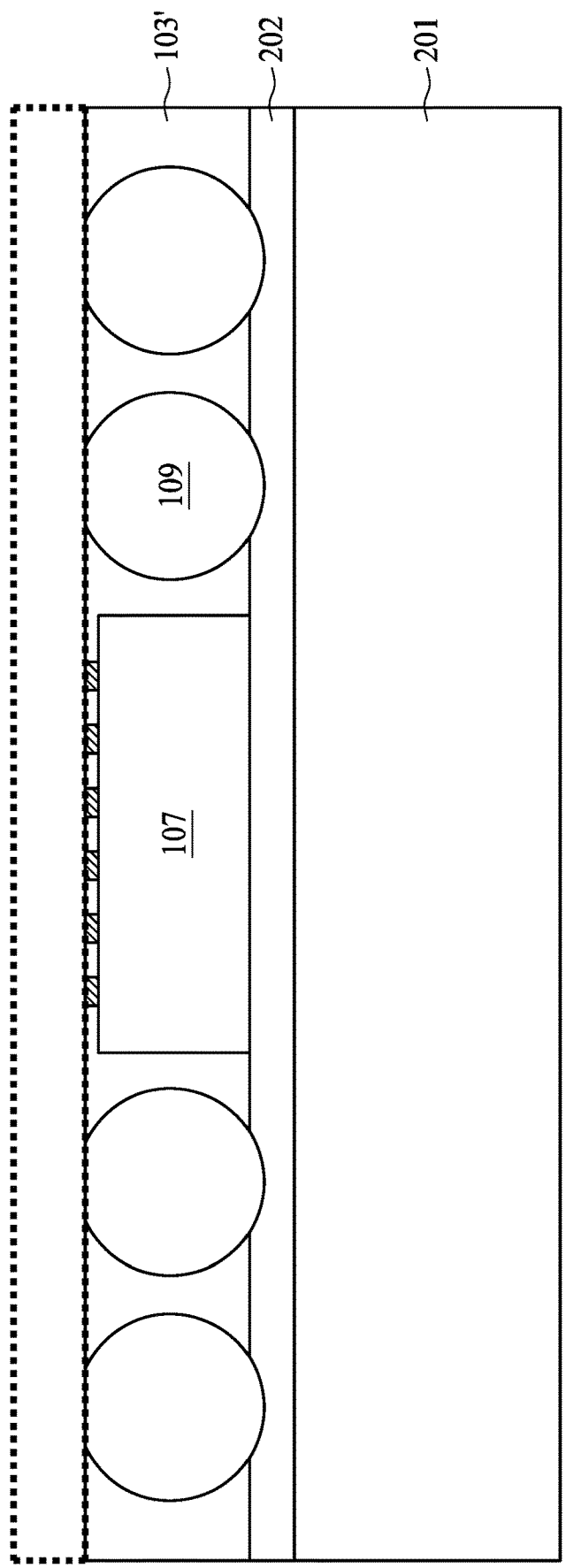

Referring to FIG. 13C, a dielectric 103' is disposed on the carrier 201. The dielectric 103' fully covers the semiconductor die 107 and the conductive terminal 109. Subsequently, a grinding operation is performed to expose the semiconductor die 107 and the conductive terminal 109. A conductive pad of the semiconductor die 107 is exposed by the grinded dielectric 103'. The conductive terminal 109 is partially exposed by the grinded dielectric 103'.

Figure 13D:
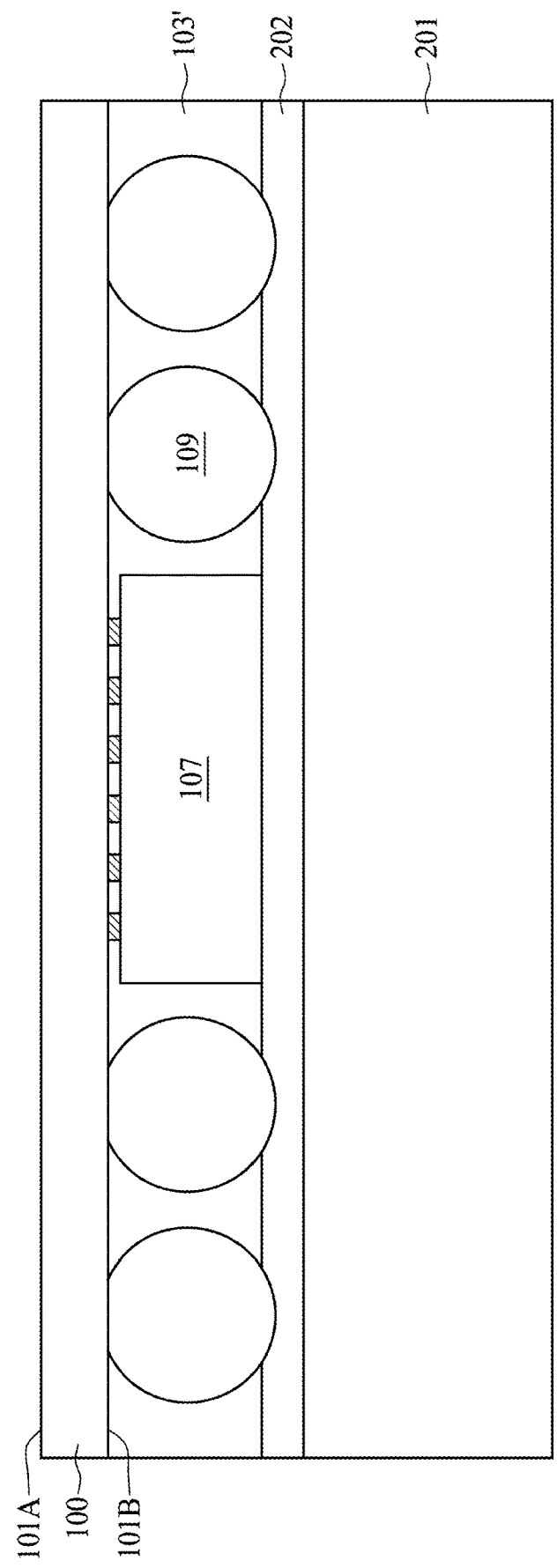

Referring to FIG. 13D, a substrate 100 is disposed on the grinded dielectric 103'. The substrate 100 has an upper surface 101A and a lower surface 101B opposite to the upper surface 101A. The semiconductor die 107 and the conductive terminal 109 are in contact with the lower surface 101B of the substrate 100. The semiconductor die 107 and the conductive terminal 109 are electrically connected to the substrate 100. In some embodiments, the substrate 100 may include a wafer-level RDL structure. The substrate 100 may include a circuit layer.

Figure 13E:
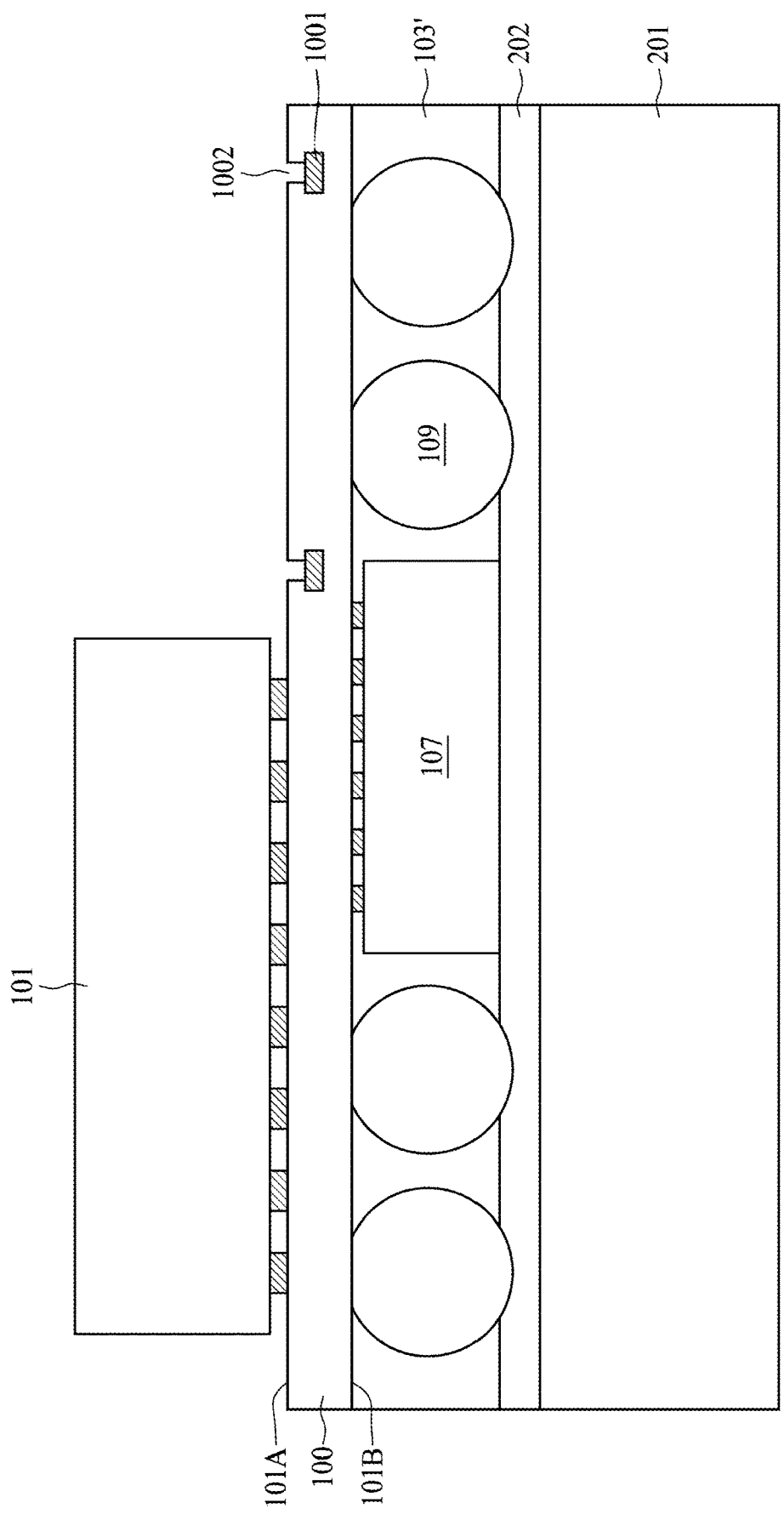

Referring to FIG. 13E, a semiconductor die 101 is disposed on the upper surface 101A of the substrate 100. An opening 1002 is performed by an etching operation or the other suitable operations. The substrate 100 has a conductive trace 1001, or embedded conductive trace, exposed from the opening 1002. The openings 1002 define a specific region. In some embodiments, a hydrophobic treatment may be applied to the conductive trace 1001 through the opening 1002. In some embodiments, the semiconductor die 101 may include an application-specific integrated circuit (ASIC), a controller, a processor or other electronic component or semiconductor device.

Figure 13F:
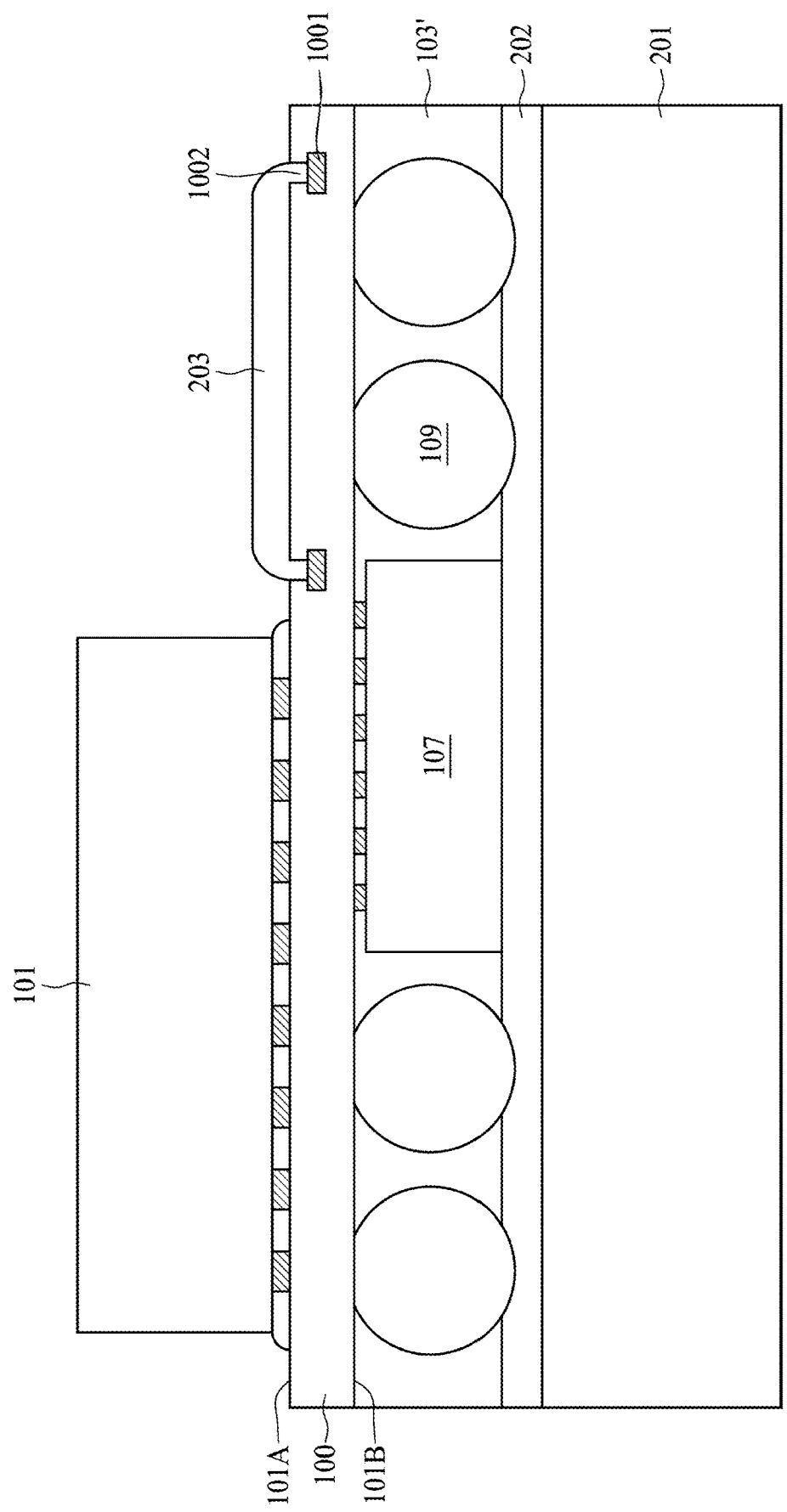

Referring to FIG. 13F, a removable material 203 is applied on the specific region defined by the openings 1002. In some embodiments, the removable material 203 may not bleed beyond the opening 1002 and encroach to the semiconductor die 101. In some embodiments, the removable material 203 may not enter the opening 1002 due to a hydrophobic treatment applied to the conductive trace 1001 and the sidewall of the opening 1002 prior to the application of the removable material 203. Because the removable material 203 can be water-soluble, the removable material 203 may not wet on the region with hydrophobic treatment.

In the case that the opening 1002 has no hydrophobic treatment, the removable material 203 may fill into the opening 1002. The removable material 203 may not further encroach beyond the openings 1002. The removable material 203 may not further encroach beyond the specific region defined by the openings 1002.

Figure 13G:
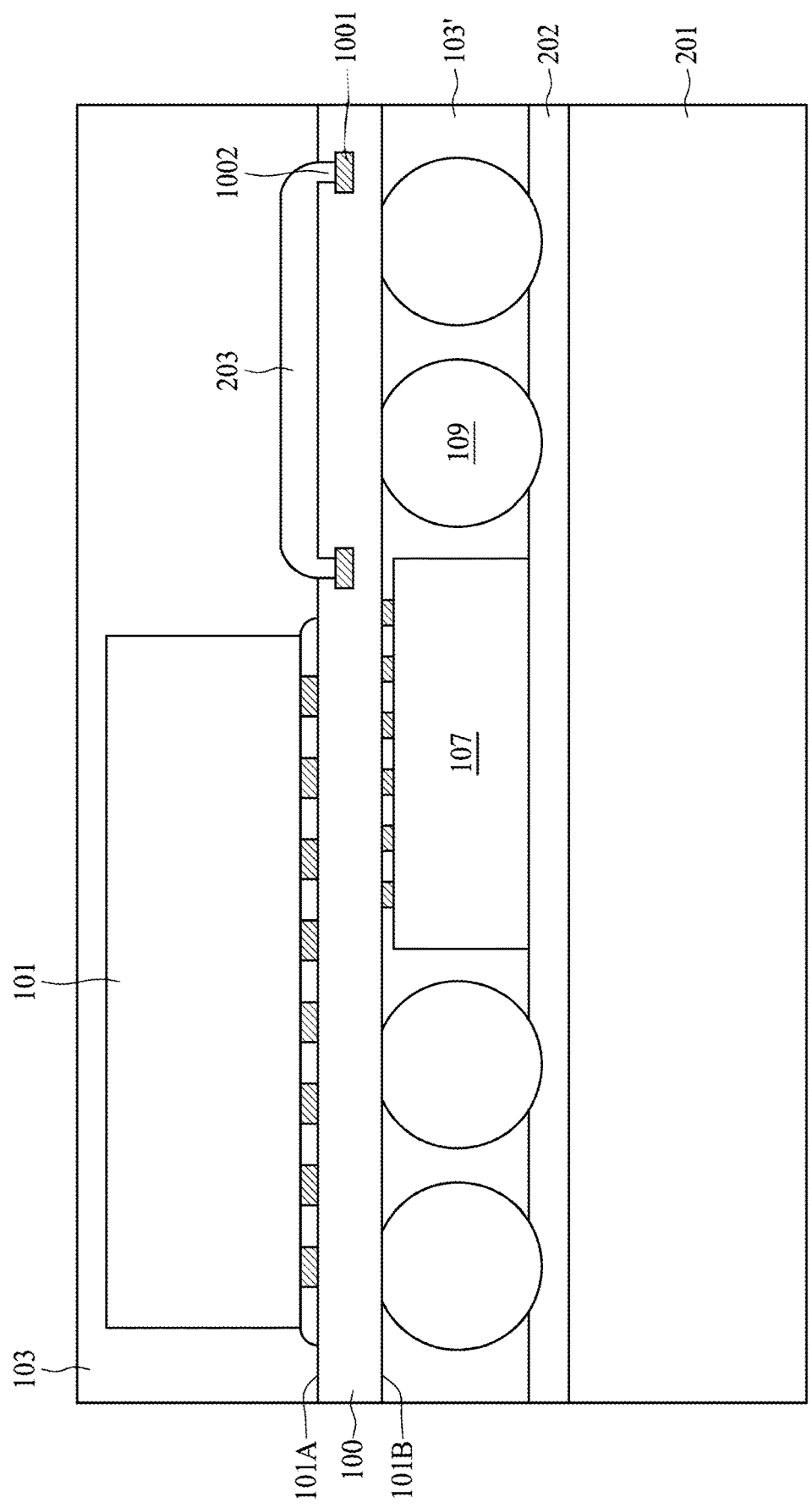

Referring to FIG. 13G, a dielectric 103 is disposed on the upper surface 101A of the substrate 100. The dielectric layer 103 covers the semiconductor die 101 and the removable material 203.

Figure 13H:
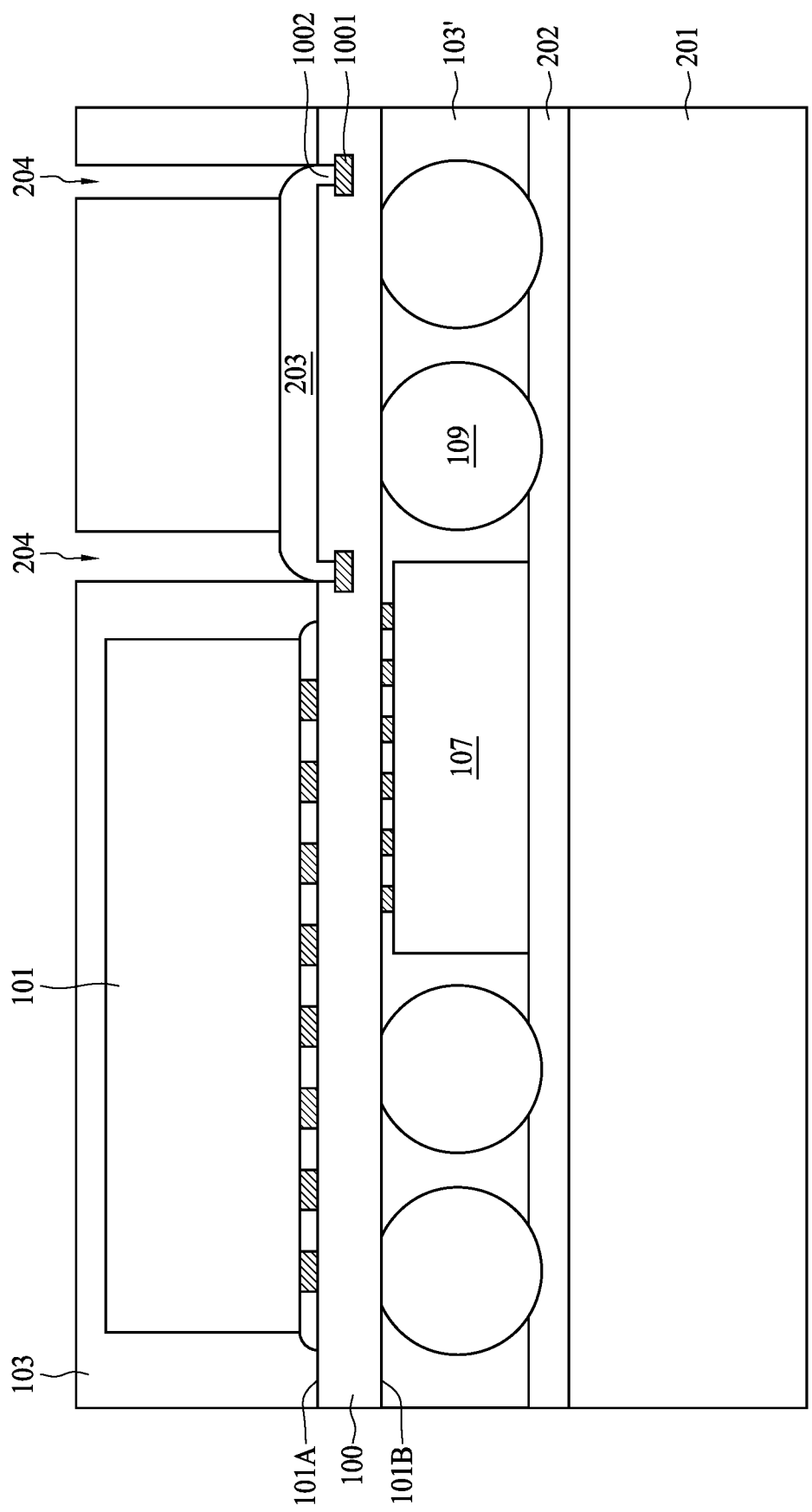

Referring to FIG. 13H, a laser drilling operation is performed to form an opening 204. The removable material 203 is partially exposed from the opening 204. A portion of the dielectric 103 is removed by the laser drilling operation. A remaining portion of the dielectric 103 is on the removable material 203. In some embodiments where the hydrophobic treatment is applied on the conductive trace 1001 and the sidewall of the opening 1002, the laser drilling operation of FIG. 13H may together remove a portion of the dielectric 103 and the hydrophobic coating on the conductive trace 1001 and the sidewall of the opening 1002. Such removal of hydrophobic coating facilitates the subsequent filling of the dielectric 105 into the cavity 60C.

Figure 13I:
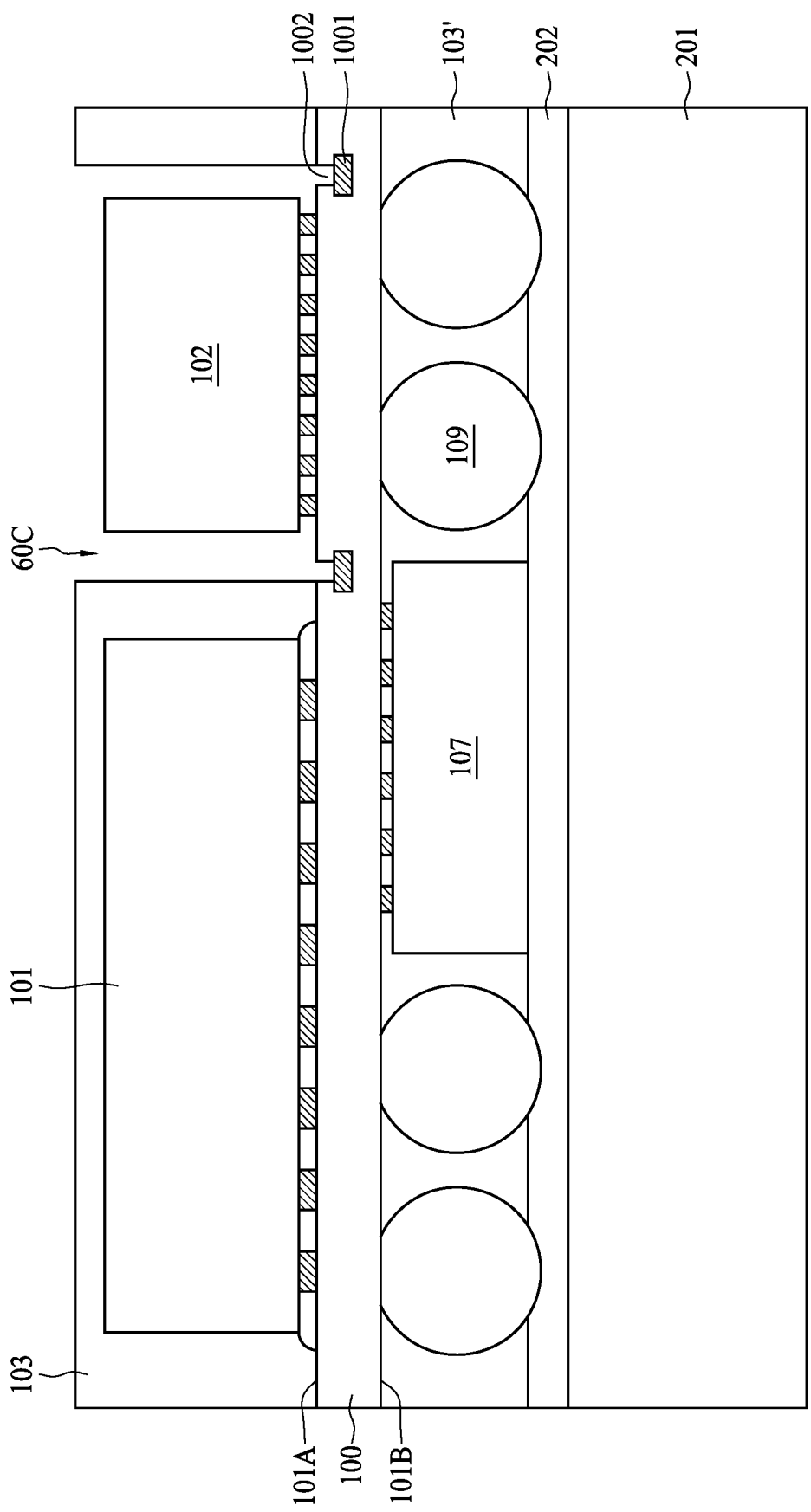

Referring to FIG. 13I, the removable material 203 is removed. The portion of the dielectric 103 disposed on the removable material 203 is removed concurrently in the same operation to form a cavity 60C. The conductive trace 1001 is exposed from the cavity 60C. A semiconductor die 102 is disposed on the upper surface 101A of the substrate 100. The semiconductor die 102 is disposed in the cavity 60C. The semiconductor die 102 is adjacent to the semiconductor die 101. The semiconductor die 102 is surrounded by the conductive traces 1001. In some embodiments, the semiconductor die 102 may include a high bandwidth memory. The size of the semiconductor die 101 is greater than that of the semiconductor die 102. The type of the semiconductor die 101 is different from that of the semiconductor die 102.

Figure 13J:
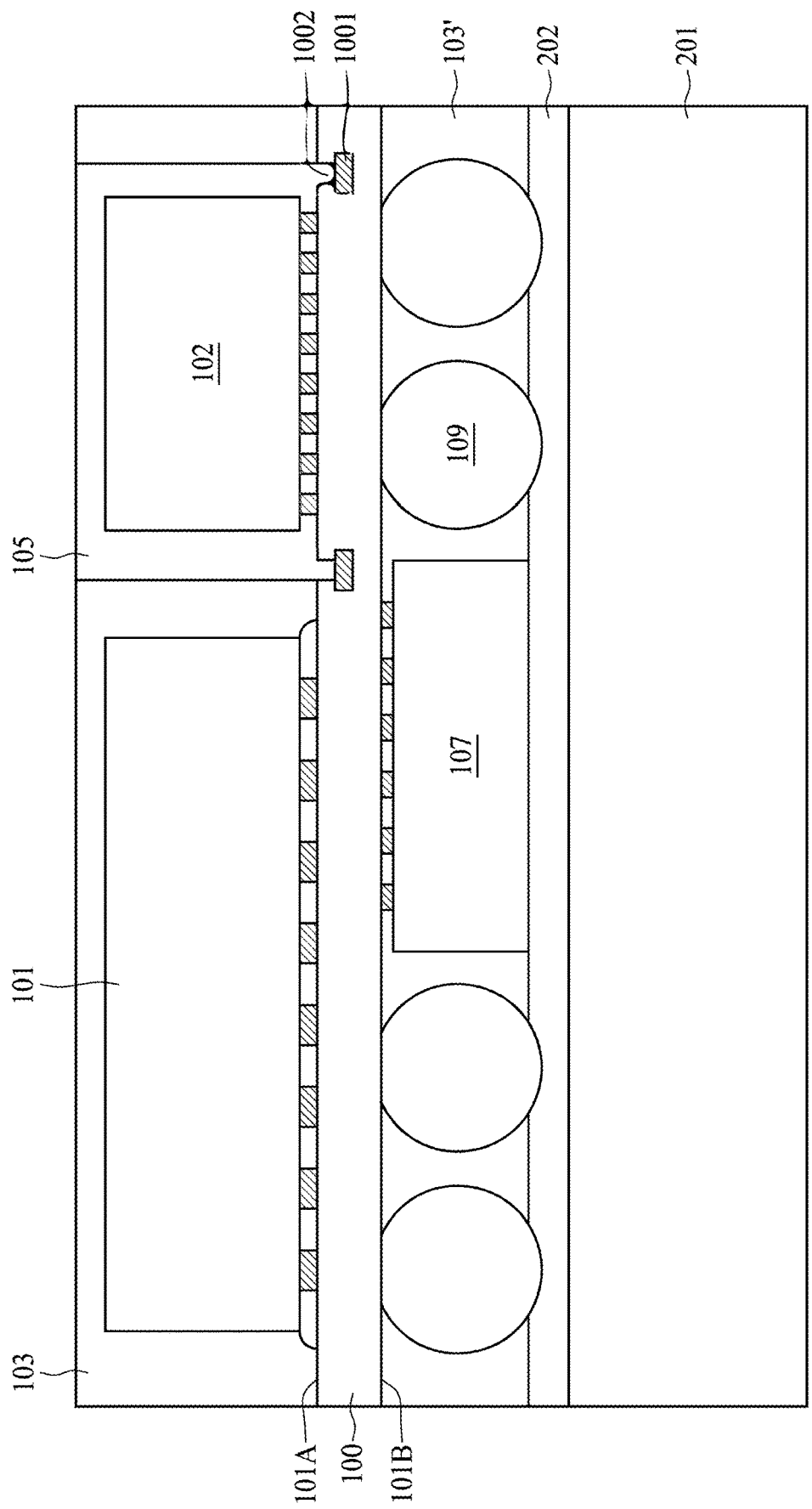

Referring to FIG. 13J, a dielectric 105 is disposed on the upper surface 101A of the substrate 100. The dielectric 105 fills the cavity 60C. The dielectric 105 fills the opening 1002. The dielectric 105 is in contact with the conductive trace 1001. The semiconductor die 102 is encapsulated by the dielectric 105. The conductive trace 1001 is encapsulated by the dielectric 105. The dielectric 105 surrounds the conductive pad of the semiconductor die 102. In some embodiments, the dielectric 105 may be an underfill. The dielectric 105 includes a plurality of fillers 1050 (shown in FIG. 1). A back side of the semiconductor die 102 is covered by the dielectric 105. The dielectric 105 and the dielectric 103 include different materials. The underfill 105' and the dielectric 105 are composed of substantially identical materials.

Figure 13K:
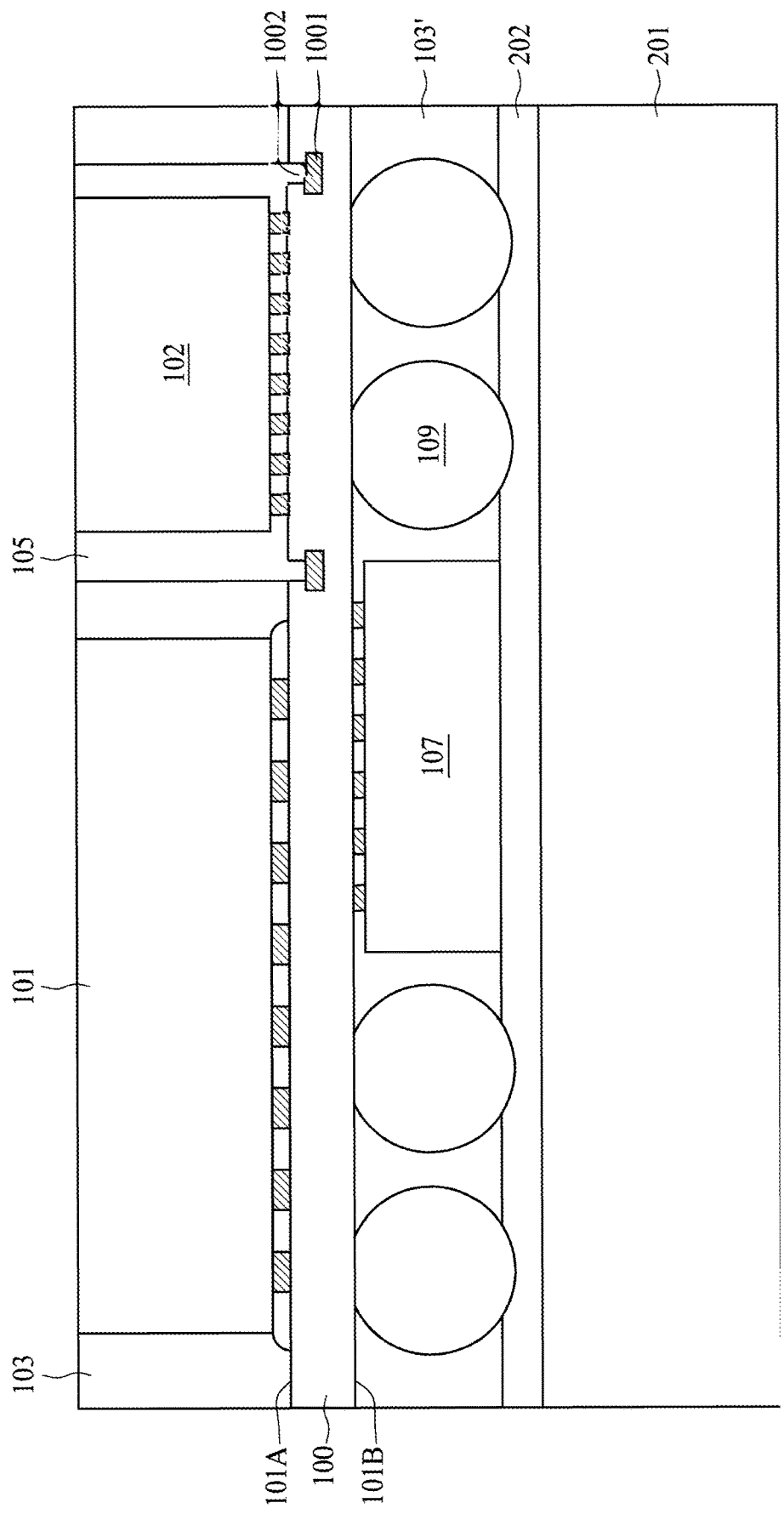

Referring to FIG. 13K, a grinding operation is performed to expose backsides of the semiconductor dies 101 and 102. Broken fillers 1030 (shown in FIG. 1) in the dielectric 103 and broken fillers 1050 (shown in FIG. 1) in the dielectric 105 may be observed at the top of the dielectric 103, 105 due to the grinding operation. Broken fillers 1030 in the dielectric 103 may be observed at a side surface facing the dielectric 105 since the cavity 60C is carved out from the dielectric 103 by a laser drilling operation and a removing operation.

Figure 13L:
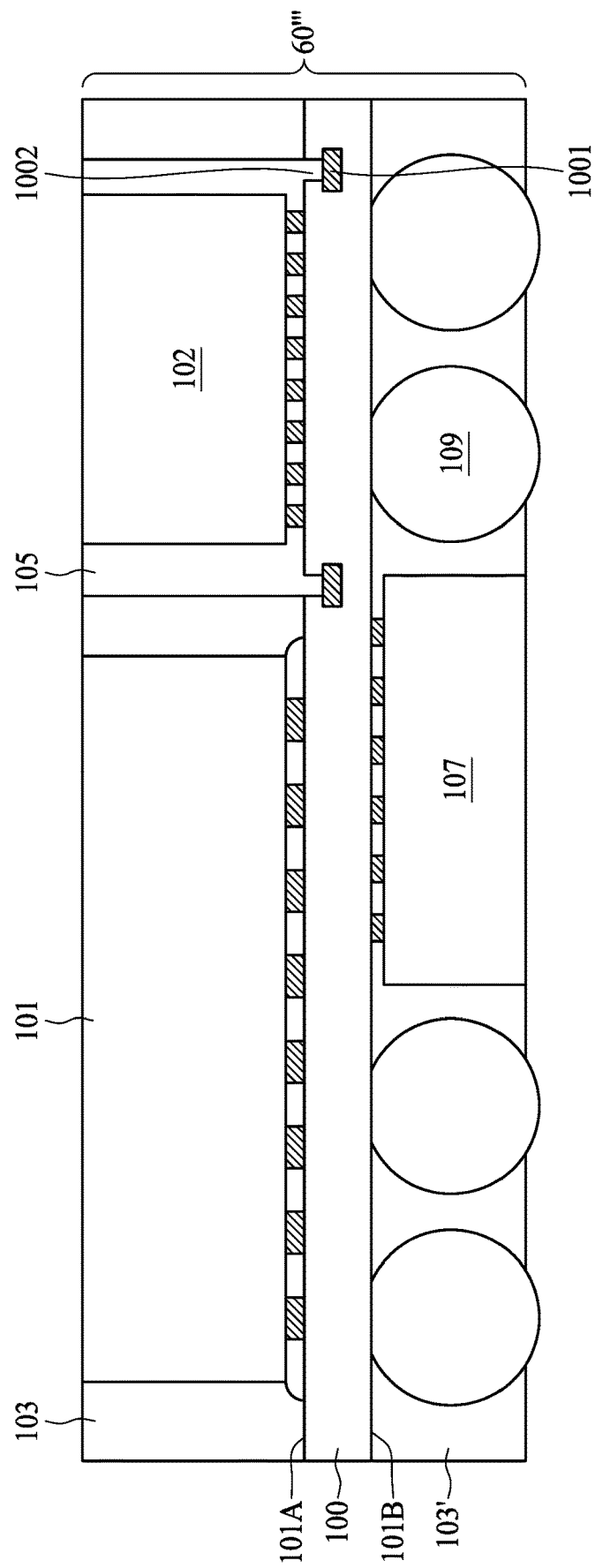

Referring to FIG. 13L, the carrier 201 and the release layer 202 are removed to expose the semiconductor die 107 and the conductive terminal 109. Subsequently, a dicing operation is performed to form the semiconductor package structure 60'''.

In some embodiments, the present disclosure provides a semiconductor package structure having an ASIC die and a high bandwidth memory (HBM) die. The ASIC die is encapsulated by a molding compound or an encapsulant. The HBM die is encapsulated by an underfill.

In some embodiments, the ASIC die is firstly mounted on an RDL layer, and then, the ASIC die is encapsulated by the molding compound. Electrical testing may be conducted on the ASIC die prior to the mounting of the HBM die. Subsequently, the HBM die is surrounded by the underfill material which fosters heat dissipation. The underfill material may provide a flat top platform for subsequent application of a thermal interface layer and a heat spreader.

As used herein, spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a substrate having a first surface and a second surface opposite to the first surface;
   a first semiconductor die on the first surface;
   a first dielectric encapsulating the first semiconductor die;
   a second semiconductor die on the first surface and adjacent to the first semiconductor die;
   a second dielectric encapsulating the second semiconductor die;
   a third semiconductor die connected to the second surface and being encapsulated by a third dielectric,
   wherein the first dielectric is in contact with the second dielectric, the first dielectric and the second dielectric include fillers, and a filler size in the first dielectric is substantially greater than a filler size in the second dielectric.

2. The semiconductor package structure of claim 1, wherein the substrate comprises a redistribution layer.

3. The semiconductor package structure of claim 1, further comprising conductive terminals on the second surface and being surrounded by the third dielectric.

4. The semiconductor package structure of claim 1, wherein the third semiconductor die is electrically coupled to the first semiconductor die and the second semiconductor die.

5. The semiconductor package structure of claim 1, wherein the second dielectric comprises a bottom proximal to the first surface and a top distal to the first surface, the bottom being narrower than the top.

6. The semiconductor package structure of claim 1, wherein the second dielectric comprises a bottom proximal to the first surface and a top distal to the first surface, the top having an uneven surface.

7. The semiconductor package structure of claim 6, wherein the uneven surface comprises a dimple between the first dielectric and the second semiconductor die.

8. The semiconductor package structure of claim 6, wherein the uneven surface comprises a recess across the second semiconductor die.

9. The semiconductor package structure of claim 6, wherein the top of the second dielectric is higher than a top of the first dielectric.

10. The semiconductor package structure of claim 1, wherein a sidewall of the second dielectric is exposed from a side of the semiconductor package structure and aligned with a side of the substrate.

11. The semiconductor package structure of claim 1, wherein a filler content in the second dielectric is substantially greater than a filler content in the first dielectric.

12. The semiconductor package structure of claim 11, wherein an average filler size in the first dielectric is substantially greater than an average filler size in the second dielectric.

13. A semiconductor package structure, comprising:
a first semiconductor die on a first side of a substrate;
a second semiconductor die on the substrate and adjacent to the first semiconductor die, the second semiconductor die being disposed in a cavity defined by a first dielectric;
a third semiconductor die on a second side of the substrate and electrically bridging the first semiconductor die and the second semiconductor die, the second side being opposite to the first side; and
a second dielectric disposed in the cavity and encapsulating the second semiconductor die, wherein the second dielectric is exposed from the first dielectric.

14. The semiconductor package structure of claim 13, wherein the first dielectric and the second dielectric include fillers and a filler size in the first dielectric is substantially greater than a filler size in the second dielectric.

15. The semiconductor package structure of claim 13, wherein the second semiconductor die is a stacked die structure.

16. The semiconductor package structure of claim 13, wherein the first semiconductor die is an application specific integrated circuit.

17. The semiconductor package structure of claim 13, wherein the first dielectric comprises molding compound and the second dielectric comprises underfill materials.

18. The semiconductor package structure of claim 13, wherein the second dielectric is exposed from a top surface of the first dielectric.

19. The semiconductor package structure of claim 13, wherein a top of the second dielectric is wider than a bottom of the second dielectric.

* * * * *